US010263388B2

(12) United States Patent
Takigawa et al.

(10) Patent No.: US 10,263,388 B2
(45) Date of Patent: Apr. 16, 2019

(54) LD MODULE COOLING DEVICE AND LASER APPARATUS

(71) Applicant: FANUC CORPORATION, Yamanashi (JP)

(72) Inventors: Hiroshi Takigawa, Yamanashi (JP); Hiroyuki Yoshida, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/003,483

(22) Filed: Jun. 8, 2018

(65) Prior Publication Data

US 2019/0020175 A1 Jan. 17, 2019

(30) Foreign Application Priority Data

Jul. 11, 2017 (JP) .................................. 2017-135199

(51) Int. Cl.
*H01S 3/04* (2006.01)
*H01S 5/024* (2006.01)
(Continued)

(52) U.S. Cl.
CPC ...... *H01S 5/02423* (2013.01); *H01S 5/02407* (2013.01); *H01S 5/0612* (2013.01);
(Continued)

(58) Field of Classification Search
CPC ............... H01S 5/02423; H01S 5/4025; H01S 5/02407; H01S 5/0612; H01S 5/405; H01S 5/42
See application file for complete search history.

(56) References Cited

U.S. PATENT DOCUMENTS 5,520,244 A * 5/1996 Mundinger ............... F28D 9/00
165/104.33
5,727,618 A * 3/1998 Mundinger ............. F28F 3/086
165/185
(Continued)

FOREIGN PATENT DOCUMENTS

JP H11-089213 A 3/1999
JP 2004-006811 A 1/2004
(Continued)

*Primary Examiner* — Kinam Park
(74) *Attorney, Agent, or Firm* — Studebaker & Brackett PC

(57) ABSTRACT

An LD module cooling device includes, in a cooling plate, common flow paths that supply/drain a cooling medium in parallel to/from a plurality of cooling portion flow paths that correspond to a plurality of LD modules, in which the cooling portion flow path is a thin layer flow path having a flow path height and a flow path width that are constant in at least a majority of a flow path length, a rectangular shape of the cooling portion flow path defined by the dimensions flow path length×flow path width overlaps with at least the majority of a main contact surface between the cooling plate and the LD modules as viewed from a front surface of the cooling plate, the flow path height of the cooling portion flow path satisfies at least either one of a condition that flow path height is ¹/₂₀ or less of the flow path length and the flow path width, and a condition that the flow path height is 0.5 mm or less, and pressure loss of a cooling medium in the cooling portion flow path is greater than pressure loss of a cooling medium in the common flow paths.

15 Claims, 44 Drawing Sheets

(51) Int. Cl.
 H01S 5/06 (2006.01)
 H01S 5/40 (2006.01)
 H01S 5/42 (2006.01)
(52) U.S. Cl.
 CPC ............ H01S 5/405 (2013.01); H01S 5/4025 (2013.01); H01S 5/42 (2013.01)

(56) References Cited

U.S. PATENT DOCUMENTS

| | | | | |
|---|---|---|---|---|
| 6,542,365 | B2* | 4/2003 | Inoue | H01L 23/4006 |
| | | | | 165/80.4 |
| 2001/0033477 | A1* | 10/2001 | Inoue | H01L 23/4006 |
| | | | | 361/718 |
| 2004/0020231 | A1* | 2/2004 | Nakamura | B60H 1/00392 |
| | | | | 62/259.2 |
| 2008/0169088 | A1* | 7/2008 | Aoki | H01L 23/473 |
| | | | | 165/104.19 |
| 2008/0247432 | A1* | 10/2008 | Miyajima | H01S 5/024 |
| | | | | 372/35 |
| 2012/0017605 | A1* | 1/2012 | Slabaugh | F02C 7/141 |
| | | | | 60/806 |
| 2012/0261104 | A1* | 10/2012 | Kelly | B23K 1/0012 |
| | | | | 165/177 |
| 2016/0233142 | A1* | 8/2016 | Xu | H01L 23/3732 |

FOREIGN PATENT DOCUMENTS

| | | |
|---|---|---|
| JP | 2008-172024 A | 7/2008 |
| JP | 2010-016402 A | 1/2010 |
| JP | 2011-198802 A | 10/2011 |

* cited by examiner

LD MODULE COOLING DEVICE AND LASER APPARATUS

This application is based on and claims the benefit of priority from Japanese Patent Application No. 2017-135199, filed on 11 Jul. 2017, the content of which is incorporated herein by reference.

BACKGROUND OF THE INVENTION

Field of the Invention

The present invention relates to an LD module cooling device and a laser apparatus. More specifically, the present invention relates to an LD module cooling device for cooling a plurality of laser diode modules (LD modules) that are used as laser light sources or excitation light sources for a laser apparatus, the LD module cooling device having cooling characteristics that can cool each LD in the LD module to a low temperature and achieving a small difference in cooling characteristics between the LD modules, and a laser apparatus that includes the LD module cooling device having such characteristics, and is a reliable laser with a long lifetime and a small difference in lifetime and LD degradation speed caused by a difference in LD drive temperature.

Related Art

An LD module is used as a laser light source or an excitation light source for a high-output laser apparatus. When too many LD modules are used, the gross heating value of the device increases. Because of this, LD modules are generally arranged on the surface of a water-cooled plate that forms a passage for cooling water that is used as a cooling medium in the water-cooled plate to be cooled by water cooling. In such a case, a cooling device that has a flow path structure in which cooling water flows in series through a plurality of LD modules is generally used because this flow path structure is simple and relatively easy to manufacture. However, because the cooling water absorbs heat generated by the LD modules while flowing along the LD modules, the temperature of the cooling water gradually increases as the cooling water moves downstream. Therefore, the cooling properties of an LD module arranged on a downstream side decrease compared to an LD module arranged on an upstream side, and the temperature of that LD module increases by the amount that the temperature of the cooling water increases. As a result, this type of flow path structure is problematic in that the LD temperature inside the LD module increases by the amount that the temperature of the cooling water increases.

For example, when 50 LD modules each having a heating value of 50 W are provided and the flow rate of the cooling water is 10 L/min (=10 L/min=$1.67 \times 10^{-1}$ m$^3$/s), the temperature of the cooling water on the downstream side increases by 3.6° C. {heating value/(flow rate×(specific heat of water)×(density of water))=50 W×50/($1.67 \times 10^{-4}$ m$^3$/s× $4.183 \times 10^3$ J/(kg·K)×$9.982 \times 10^2$ kg/m$^3$)≈3.6}, as opposed to the temperature of cooling water on the upstream side. When the temperature of the LD during drive increases, the degradation rate of the LD may increase and the lifetime of the LD may reduce to half at a temperature increase of 10° C. In this case, the above-mentioned temperature increase of 3.6° C. reduces the lifetime of the LD by approximately 78%. Therefore, the lifetime of an LD module assembly unit in which a plurality of the LD modules is arranged on a cooling plate becomes limited to the lifetime of the LD modules when driven at the highest temperature. When the lifetime of an LD module in the assembly unit comes to an end, only replacing that LD module is currently known. However, maintenance costs and having to stop the laser apparatus during maintenance, among other issues, are problems.

On the other hand, with a flow path structure in which cooling water flows near each LD module in parallel, the difference in temperature resulting from the difference in upstream and downstream LD modules can be reduced. However, if setting the same conditions as when the total flow rate of the cooling water is in series, the flow rate of the cooling water that cools each LD module can be reduced to 1/(number of LD modules). Therefore, when applying the cooling conditions described above, the flow rate of the cooling water that cools each LD module becomes approximately 0.2 L/min. In this case, the LD module is not sufficiently cooled. As a result, there is a problem in that the temperature of the LD in the LD module increases overall. There is also a problem in that it is difficult to manufacture a flow path structure in which the cooling water cools the LD modules by flowing in parallel, and this structure involves high costs.

Therefore, it has been an object to develop an LD module cooling device that can be manufactured at low cost and lower the temperature of the LD modules and LDs further than at least that of LD modules cooled in series and arranged downstream, when each LD module is cooled with cooling water in parallel. Methods of increasing the flow rate of the cooling water or decreasing the inflow temperature of the cooling water has also been conceived. However, a method of increasing the flow rate of the cooling water requires improving specifications of a chiller (circulating cooling water supply device) and other tasks. In addition, the LD modules and other components more easily condense when using a method of lowering the inflow temperature of the cooling water, which is a problem. Therefore, these methods cannot solve the problem.

The flow path structure in which the cooling water flows in parallel can realize a small difference between upstream and downstream cooling water and reduce the difference between upstream and downstream cooling temperature characteristics of the cooling water. As such, various types of cooling devices that include a flow path structure of flowing the cooling water in parallel have thus far been proposed (see, for example, Patent Literature 1 to 5

Patent Literature 1 discloses a stacked structure for a cooling unit for a water-cooled semiconductor, in which a semiconductor is mounted to a cooling body to cool the cooling body with water. This stacked structure includes the cooling body, aggregated piping, and a fitting member. The cooling body is provided with cooling water ports on a supply side and a discharge side. The aggregated piping includes a mounting portion used to mount the structure to an external box or an external frame and has a frame function of bridging the cooling body to which the semiconductor is attached. The fitting member is mounted to the cooling water port in order to water-tightly fit the cooling body into the aggregated piping. A plurality of cooling bodies that have been water-tightly fitted into the aggregate piping with the fitting member are arranged between the aggregate piping. With this configuration, pressure loss of the cooling body increases by more than two orders of magnitude with respect to a pipe, achieving a cooling water cooling structure that cools a semiconductor with only the cooling body and the aggregate piping having the frame function, without the need to provide components and functions that adjust flow rate balance between the cooling bodies in the stacked structure. In addition, even if water inlets/outlets are provided at random positions in the aggregate piping, the flow rates of the cooling bodies between the stacks can be equalized. Therefore, the structure of the main piping system can be designed more freely, and the cooling unit can be made smaller and lighter when the cooling bodies adopt a stacked structure. However, a large number of LD modules are often used in an optical output laser apparatus. For example, there are cases in which one cooling device cools 50 LD modules. The flow rate of cooling water is desirably kept to approximately 10 liters/minute (=10 L/min). Therefore, in this case, as described above, the flow rate made to flow through each cooling body is 0.2 L/min. However, Patent Literature 1 does not clearly mention a flow path structure that can achieve high cooling characteristics at such a low flow rate. In addition, when around 50 LD modules are cooled with one cooling device as described above, the LD modules are preferably arranged two-dimensionally. However, the flow path structure disclosed in Patent Literature 1 would have a complicated structure that could not be easily made smaller if the cooling bodies were to be arranged two-dimensionally.

Patent Literature 2 discloses a coolant. cooling type both sides cooling semiconductor device that includes a semiconductor chip or a double-sided cooling semiconductor module, coolant tubes, and pressing members. The coolant tube has a flat contacting heat-receiving surface. Cooling fluid flows through the coolant tube. The pressing members sandwich and press the semiconductor chip or double-sided cooling semiconductor module between the coolant tubes in a thickness direction of the semiconductor chip or double-sided cooling semiconductor module. During sandwiching and pressing, flat surfaces of the coolant tubes make contact with, either directly or via an insulation spacer, both main sides of the semiconductor chip or double-sided cooling semiconductor module. The coolant tube includes a plurality of barrier walls that extend in a flow path direction and a sandwiching/pressing direction. With this configuration, one pressing member can press two flat coolant tubes on either side of the semiconductor module (semiconductor chip) against the semiconductor module (semiconductor chip) at the same pressure (when areas of electrode members on each side of the semiconductor module (semiconductor chip) are equal). The structure is simple. Coolant having a constant flow rate and temperature is supplied to each coolant tube via an inlet header. In addition, because the semiconductor module is sandwiched and pressed by common pressing members, the sandwiching/pressing force per unit area between each semiconductor module and the coolant tubes is substantially equal, and the pressing area is equal. Therefore, the sandwiching/pressing force of the semiconductor module against the coolant tubes becomes substantially equal. As a result of these phenomena, the cooling capacity of each semiconductor module can be made substantially equal. However, Patent Literature 2 does not clearly describe a flow path structure that can achieve high cooling characteristics with the small flow rate of 0.2 L/min described above. In addition, the structure of the semiconductor device would have a complicated structure that could not be easily made smaller if two-dimensionally arranged semiconductor chips or double-sided cooling semiconductor modules were cooled.

Patent Literature 3 discloses water cooling equipment for a high-voltage electric apparatus. The water cooling equipment includes a plurality of modules that are insulated from each other by an insulating support. Each module houses semiconductor elements and auxiliary circuits for the module. The inside of each module is cooled with water supplied through a module water supply pipe. The water is drained through a module drainage pipe. Each module is provided with a fluid resistor that generates a predetermined pressure loss on an upstream-side end of each module water supply pipe. In this water cooling equipment, the fluid resistor is provided in order to evenly cool the plurality of heating parts. However, this water cooling equipment merely succeeds in making the flow rate of cooling water that flows through each module water supply pipe equal, and Patent Literature 3 fails to mention a flow path structure that can achieve high cooling characteristics with the small flow rate of 0.2 L/min described above.

Patent Literature 4 discloses a heat generating member cooling structure in which a coolant space is formed between a heat releasing surface that is thermally connected to a heat generating member and an opposing surface that is positioned opposite the heat releasing surface. A plurality of heat releasing fins are provided within the coolant space so as to be parallel to one another and stand from the heat releasing surface toward the opposing surface. An inter-fin passage through which the coolant flows is formed between the plurality of heat releasing fins. Further, the heat generating member cooling structure includes an inflow-side coolant reservoir that communicates with one end side of the inter-fin passage. This inflow-side coolant reservoir is provided so as to extend in an arrangement direction of the inter-fin passage. The inter-fin passage and the inflow-side coolant reservoir are joined together so as to allow communication there between by a narrowed portion that is provided so as to extend throughout at least the area in which the inter-fin passages are arranged in a row. The narrowed portion has a greater flowing resistance than the inflow-side coolant reservoir. With this configuration, coolant that has flowed into the inflow-side coolant reservoir flows into the inter-fin passage through the narrowed portion. Because the narrowed portion extends over at least the area in which the inter-fin passages are arranged in a row and has a greater flowing resistance than that of the inflow-side coolant reservoir, the coolant that flows into the inflow-side coolant reservoir is evenly distributed throughout the whole inflow-side coolant reservoir along an extension direction of the inflow-side coolant reservoir. Therefore, coolant can flow toward the inter-fin passage in the entire region of the narrowed portion and substantially evenly flow into each inter-fin passage. As a result, the flowing state of the coolant becomes substantially uniform and the heat generating member can be efficiently cooled. This heat generating member cooling structure is provided with the narrowed portion that has a greater flowing resistance than the inflow-side coolant reservoir because the amount of coolant that flows into each inter-fin passage can be made substantially uniform. In order to achieve high cooling characteristics with the small flow rate of 0.2 L/min described above, the flow speed of the coolant that flows through the passage for cooling the heat generating member must be made as fast as possible. Although the flow path cross section must be made smaller in order to increase flow speed at a limited flow rate, pressure loss at the flow path portion becomes too high when the flow path cross section is made too small in this heat generating member cooling structure. Therefore, too much load is placed on a discharge pump in a coolant sending device, which is a problem. As a result, when pressure loss occurs at the narrowed portion, it is necessary to both reduce pressure loss at a flow path used for cooling the heat generating member by that amount of loss and increase the cross-sectional area of the flow path used for cooling the heat generating member, and flow speed decreases as a result. Therefore, this heat generating member cooling structure is not suited to effective cooling at the small flow rate such as the one described above.

Patent Literature 5 does not refer to a structure that causes a cooling medium to flow in parallel through cooling portion passages used for cooling a plurality of heat generating members. However, Patent Literature 5 does disclose a flow path structure for reducing the depth (height) of a flow path through which a cooling medium for cooling a heat generating member flows. In other words, Patent Literature 5 discloses an electrical appliance that includes a flow path through which a cooling medium for cooling a heat generating member flows. The flow path includes a cooling part, an introduction part, and a discharge part. The cooling part is formed at a portion that corresponds to the heat generating member. The introduction part communicates with the cooling part to guide the externally supplied cooling medium to the cooling part. The discharge part communicates with the cooling part to externally discharge the cooling medium that was guided to the cooling portion. This flow path is formed such that the cross-sectional area of the flow path extending from the introduction part to the discharge part via the cooling part is substantially constant. With this configuration, the flow path in the cooling part through which cooling medium for cooling the heat generating member flows is made to have a wider width and a smaller depth (height) than that of the introduction portion and the discharge portion. At this time, the flow path is formed such that the cross-sectional area of the flow path extending from the introduction part to the discharge part via the cooling part is substantially constant and, as a result, uniform cooling can be achieved and thermal characteristics can be improved. In addition, pressure loss in the flow path can be reduced. However, in order to apply approximately equal amounts of cooling medium in parallel to a plurality of cooling parts, a certain amount of pressure loss in the cooling parts is required. In Patent Literature 5, reducing pressure loss is not a problem that is prioritized. Further, Patent Literature 5 does not clearly mention any flow path structure that can achieve high cooling characteristics with a low flow rate, such as the above-described 0.2 L/min. In addition, because the flow path structure described in Patent Literature 5 is a structure in which the cross-sectional shape of the flow path gradually changes from the introduction part to the discharge part, this structure presents a problem in that manufacturing costs would increase if a plurality of cooling units in a flow path structure such as the one disclosed Patent Literature 5 were provided to try and achieve a structure in which approximately equal amounts of cooling medium are applied in parallel to each cooling part.

Patent Document 1: Japanese Unexamined Patent Application, Publication No. 2011-198802
Patent Document 2: Japanese Unexamined Patent Application, Publication No. 2010-16402
Patent Document 3: Japanese Unexamined Patent Application, Publication No. H11-89213
Patent Document 4: Japanese Unexamined Patent Application, Publication No. 2008-172024
Patent Document 5: Japanese Unexamined Patent Application, Publication No. 2004-6911

SUMMARY OF THE INVENTION

The present invention has been made in light of the aforementioned circumstances, and it is an object of the present invention to provide an LD module cooling device that can be manufactured at low cost and has a flow path structure and cooling performance that enables a plurality of LD modules and LDs inside the LD modules to be cooled at substantially the same low temperature using a cooling medium with a limited flow rate.

It is a further object of the present invention to provide a long-lifetime, reliable laser apparatus that includes a long-lifetime LD module assembly unit that includes a plurality of LD modules and an LD module cooling device as main structural components, in which maintenance costs for replacing the LD module assembly unit are low.

(1) An LD module cooling device (for example, an LD module cooling device 1 to be described later) according to the present invention includes: a cooling plate (for example, a water cooling plate 2 to be described later); a plurality of cooling portion flow paths (for example, a cooling portion flow path 6 to be described later) formed in the cooling plate, through which a cooling medium for cooling a plurality of LD modules (for example, an LD module 3 to be described later) arranged on a front surface of the cooling plate flows, corresponding to positions of the plurality of LD modules; a common supply flow path (for example, a common supply flow path 4 to be described later) formed in the cooling plate, that supplies the cooling medium in parallel to the plurality of cooling portion flow paths; and a common drainage flow path (for example, a common drainage flow path 5 to be described later) formed in the cooling plate, that drains the cooling medium in parallel from the plurality of cooling portion flow paths, in which: the cooling portion flow path has a flow path height and a flow path width that are constant in at least a majority of the flow path length, and is formed as a thin layer flow path parallel to a front surface of the cooling plate, a rectangular shape of the cooling portion flow path defined by the dimensions flow path length×flow path width overlaps with at least a majority of a main contact surface between the cooling plate and the plurality of LD modules as viewed from the front surface of the cooling plate, the flow path height of the cooling portion flow path satisfies either one of a condition of being 1/20 or less of the flow path length and the flow path width, and a condition that the flow path height is 0.5 mm or less, and pressure loss of the cooling medium that flows through the cooling portion flow path caused by pipe friction is greater than pressure loss of the cooling medium that flows through the common supply flow path and the common drainage flow path caused by pipe friction.

(2) In the LD module cooling device described in (1), plurality of rows of a plurality of the cooling portion flow paths may be arranged in parallel on the front surface of the cooling plate, the common supply flow path may include a branched common supply flow path (for example, a branched common supply flow path 8 to be described later) that extends along the plurality of rows of the plurality of cooling portion flow paths and supplies the cooling medium to the plurality of cooling portion flow paths in the plurality of rows, the common drainage flow path may include a branched common drainage flow path (for example, a branched common drainage flow path 10 to be described later) that extends along the plurality of rows of the plurality of cooling portion flow paths and drains the cooling medium that is discharged in parallel from the plurality of cooling portion flow paths in the plurality of rows, and a thermal insulation portion (for example, a thermal insulation portion 12 to be described later) that has lower thermal conductivity than the cooling plate may be arranged between at least one group of adjacent branched common supply flow paths and branched common drainage flow paths.

(3) In the LD module cooling device described in (1) or (2), at least one ridge (for example, a ridge 13 to be described later) that divides the cooling portion flow path in a flow path width direction may be provided in at least one portion in the cooling portion flow path.

(4) In the LD module cooling device described in any one of (1) to (3), the LD module may include a plurality of LD chips (for example, an LD chip 14 to be described later) arranged in one row, and, in the plurality of LD modules arranged on the front surface of the cooling plate, the direction of flow of the cooling medium flowing through the cooling portion flow path and the direction of the row of the LD chips may intersect each other as viewed from the front surface of the cooling plate.

(5) In the LD module cooling device described in any one of (1) to (4), the flow path width of the cooling portion flow path may be greater than the flow path length of the cooling portion flow path.

(6) In the LD module cooling device described in any one of (1) to (5), at least one LD module may be arranged on a rear surface of the cooling plate, and the cooling plate may have a cooling portion flow path used for cooling the at least one LD module arranged on the rear surface of the cooling plate.

(7) In the LD module cooling device described in any one of (1) to (6), the cooling plate may be formed of a substrate (for example, a substrate 16 to be described later) on at least one surface of which a recess forming the common supply flow path and the common drainage flow path is formed and at least one metal plate (for example, a metal plate 17 to be described later), and the common supply flow path and the common drainage flow path may be formed between the recess and the metal plate through joining the metal plate to at least one surface of the substrate.

(8) In the LD module cooling device described in (7), the material of the metal plate may be copper or a copper alloy.

(9) In the LD module cooling device described in (7) or (8), the substrate and the metal plate may be made from different materials.

(10) In the LD module cooling device described in any one of (7) to (9), the cooling portion flow path may be formed of grooves (for example, grooves 18 to be described later) formed on a front surface of the metal plate on the substrate side.

(11) In the LD module cooling device described in any one of (1) to (6), the cooling portion flow path may be formed between the cooling plate and a package (for example, a package 15 to be described later) of the LD modules through cooperation between the cooling plate and the package of the LD modules.

(12) In the LD module cooling device described in (11), the package of the LD modules may include grooves (for example, grooves 19 to be described later) that constitute at least a part of the cooling portion flow path on a surface that makes contact with the cooling medium.

(13) In the LD module cooling device described in (11) or (12), the material of the cooling plate may be a material other than a metal.

(14) In the LD module cooling device described in any one of (1) to (13), the LD module cooling device may further include: a frame member (for example, a frame member 22 to be described later) used for pushing the plurality of LD modules against the cooling plate, in which the frame member may have a structure in which the frame member covers at least a part of either the front surface or the rear surface of the cooling plate by including a gap (for example, a gap S to be described later) between the cooling plate and the frame member.

(15) A laser apparatus (for example, a laser apparatus 28 to be described later) according to the present invention includes: at least one LD module assembly unit (for example, an LD module assembly unit 29 to be described later) formed by mounting a plurality of LD modules used as a laser light source or an excitation light source on the LD module cooling device of any one of claims 1 to 14; at least one LD power supply unit (for example, an LD power supply unit 30 to be described later) that supplies driving power for optical output to the LD module; a control unit (for example, a control unit 31 to be described later) that outputs an optical output instruction to the LD power supply unit; and a laser optical system (for example, a laser optical system 32 to be described later) that emits a laser beam.

With the LD module cooling device according to the present invention, it is possible to provide an LD module cooling device that has a flow path structure and cooling performance enabling a plurality of LD modules and LDs inside the LD modules to be cooled at substantially the same temperature and at a low temperature using a cooling medium with a limited flow rate.

With the laser apparatus according to the present invention, it is possible to provide a long-lifetime, reliable laser device that includes a long-lifetime LD module assembly unit that has a plurality of LD modules and an LD module cooling device as main structural units, in which maintenance costs for replacing the LD module assembly unit are low.

DETAILED DESCRIPTION OF THE INVENTION

Figure 1:
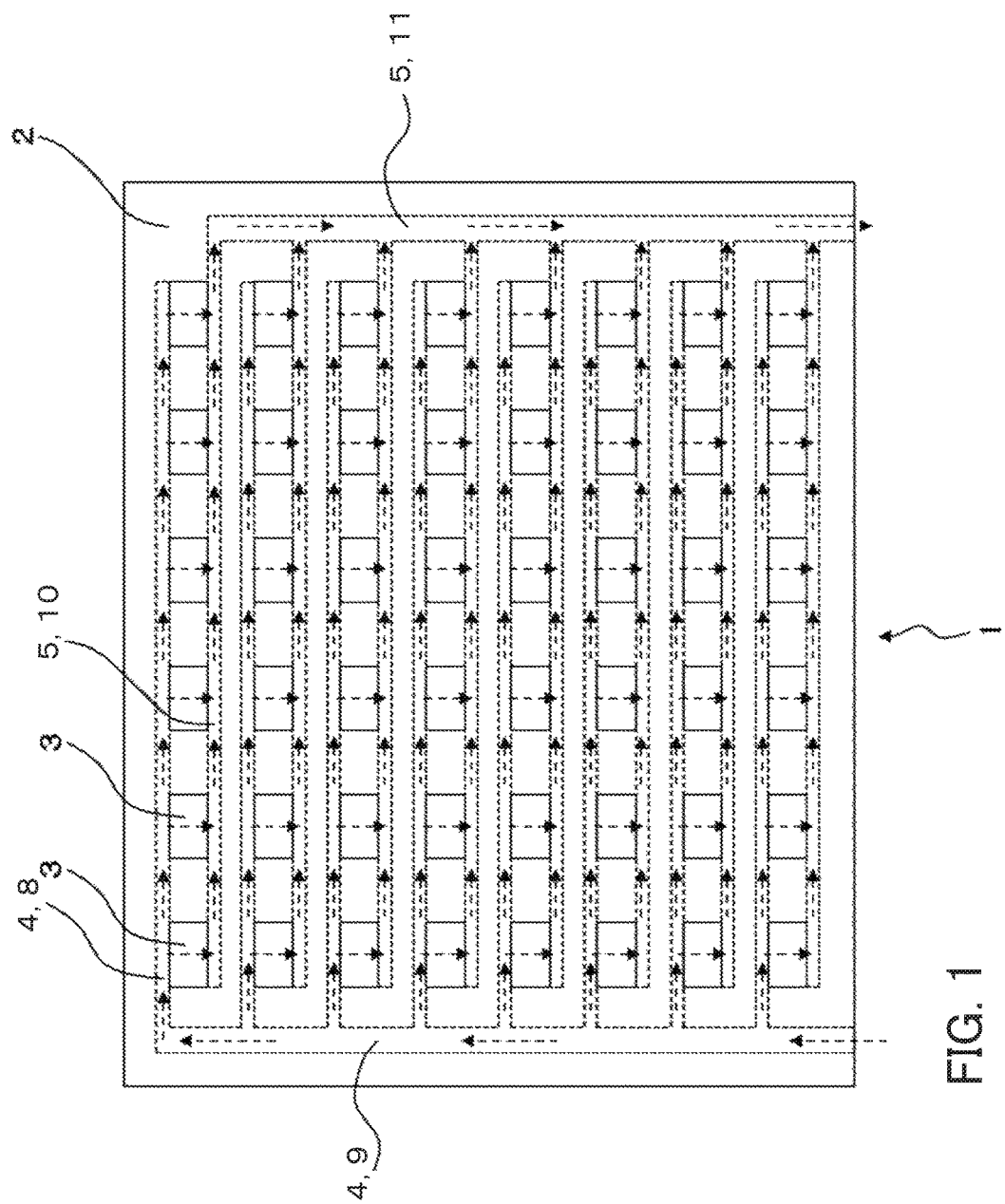
FIG. 1 is a plan view for schematically illustrating a structure of an LD module cooling device according to a first embodiment of the present invention, in which the LD module cooling device is provided with LD modules.

Embodiments of an LD module cooling device and a laser apparatus according to the present invention are described below with reference to the drawings. In each of the drawings, like components are denoted by like reference symbols. Components denoted by like reference symbols in different drawings are components that have the same function. Note that, scale in the drawings has been modified as appropriate in order to facilitate understanding. In addition, the embodiments illustrated in the drawings are merely examples for embodying the present invention and are not intended to limit the present invention.

First Embodiment of LD Module Cooling Device

Figure 2:
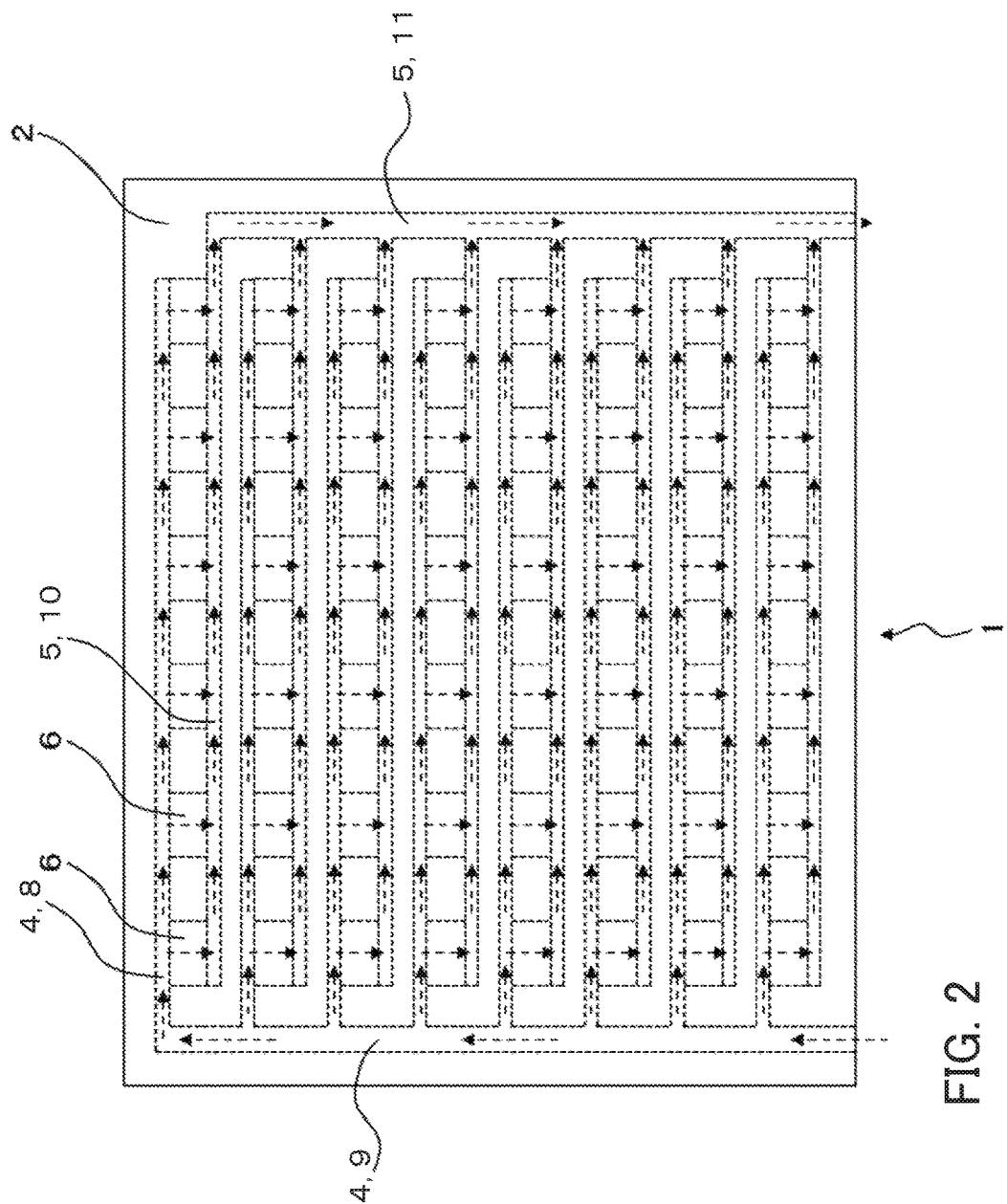
FIG. 2 is a plan view for schematically illustrating the structure of the LD module cooling device illustrated in FIG. 1 in a state in which the LD modules are hidden.

FIG. 1 is a plan view for schematically illustrating a flow path structure of an LD module cooling device according to a first embodiment of the present invention. FIG. 1 illustrates a state in which LD modules have been arranged in the LD module cooling device. In the following description of embodiments for implementing the present invention, the LD module cooling device in a state in which the LD modules have been arranged is sometimes simply referred to as "LD module cooling device" for brevity of description. FIG. 2 is a plan view for schematically illustrating the flow structure of the LD module cooling device illustrated in FIG. 1 in a state in which the LD modules are hidden. Herein, cooling water is used as a cooling medium and a water cooling plate is used as a cooling plate to exemplify the LD module cooling device in which a plurality of LD modules is cooled with water cooling. In FIGS. 1 and 2, a flow path for the cooling water is formed inside a water cooling plate 2, but cannot be seen from the outer side of the water cooling plate 2 and so is indicated by a dotted line. A dotted line arrow schematically represents a direction in which the cooling water flows.

As illustrated in FIGS. 1 and 2, an LD module cooling device 1 includes, as a main component, a rectangular water cooling plate 2 formed of a flat plate. A plurality of LD modules 3 are two-dimensionally arranged on a front surface of the water cooling plate 2. In this embodiment, one row of the LD modules 3 is formed of six LD modules 3 arranged in a straight line at constant intervals in a horizontal direction. Eight of these rows of six LD modules 3 are arranged at constant intervals in a vertical direction, to thereby arrange a total of 48 LD modules 3 on the front surface of one water cooling plate 2

A common supply flow path 4 and a common drainage flow path 5 are formed inside the water cooling plate 2. The common supply flow path 4 flows cooling water toward each of the LD modules 3. The common drainage flow path 5 drains the cooling water after the cooling water has cooled each of the LD modules 3. In the following description, the common supply flow path 4 and the common drainage flow path 5 are sometimes commonly referred to as "common flow path".

The common supply flow path 4 is formed of one main common supply flow path 9 and a plurality of (in this embodiment, eight) branched common supply flow paths 8. The main common supply flow path 9 extends on a left end of the water cooling plate 2 in FIGS. 1 and 2 in a direction that intersects the arrangement direction of each LD module 3. The plurality of branched common supply flow paths 8 branch and extend from the main common supply flow path 9 in parallel so as to correspond one-to-one with each row of LD modules 3.

The common drainage flow path 5 is formed of a plurality of (in this embodiment, eight) branched common drainage flow paths 10 and one main common drainage flow path 11. The plurality of branched common drainage flow paths 10 extends so as to correspond one-to-one with each row of LD modules 3. The main common drainage flow path 11 extends in a direction that intersects the arrangement direction of each LD module 3. The main common drainage flow path 11 groups the plurality of branched common drainage flow paths 10 into one flow passage at a right end of the water cooling plate 2 in FIGS. 1 and 2.

Each row of LD modules 3 is arranged so as to be sandwiched between one branched common supply flow path 8 and one branched common drainage flow path 10 that extend in parallel.

A pipe necessary for allowing the cooling water to flow into the common supply flow path 4 of the water cooling plate 2 and drain from the common drainage flow path of the water cooling plate 2 is not shown in the drawings to facilitate understanding. A structure for mounting the pipe needed for the cooling water to flow in and drain is described later. A structure used for fixing the LD modules 3 to the water cooling plate 2 is also described later.

As illustrated in FIG. 2, a plurality of cooling portion flow paths 6 are formed on the front surface of the water cooling plate 2 so as to correspond one-to-one with positions at which each of the LD modules 3 are arranged. In FIG. 1, the cooling portion flow paths 6 are hidden directly underneath the LD modules 3 and cannot be seen. Each cooling portion flow path 6 communicates with the branched common supply flow paths 8 and the branched common drainage flow paths 10 in order to connect branched common supply flow paths 8 and branched common drainage flow paths 10 that are adjacent to each other. Therefore, when the cooling water flows in parallel into each cooling portion flow path 6 from the branched common supply flow paths 8 of the common supply flow path 4, the cooling water drains in parallel to the branched common drainage flow path 11 of the common drainage flow path 5 from each cooling portion flow path 6 after flowing directly below each LD module 3.

Figure 3:
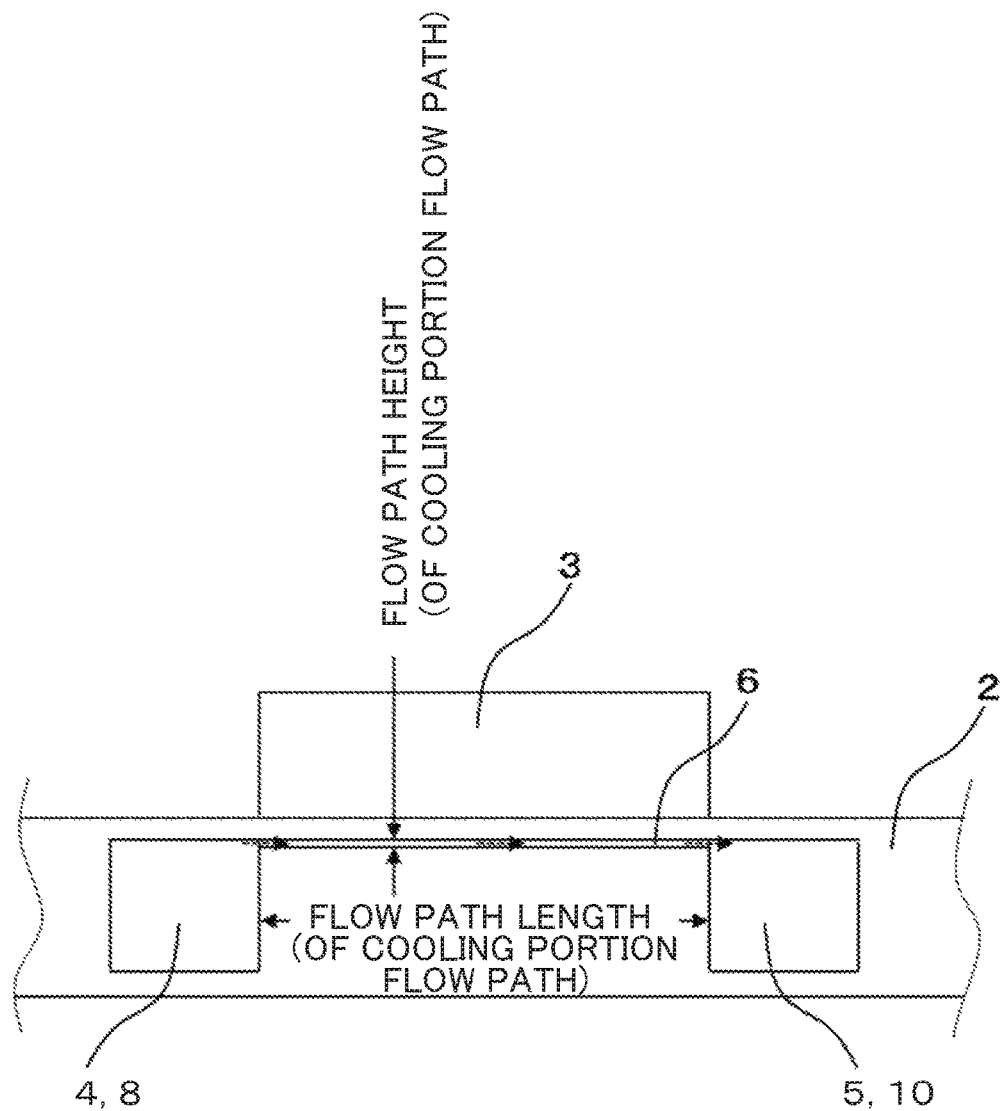
FIG. 3 is a diagram for schematically illustrating a configuration of one cooling portion flow path and the vicinity thereof in the LD module cooling device illustrated in FIGS. 1 and 2 in a section perpendicular to a front surface of a water cooling plate (cooling plate) and parallel to a direction of flow of cooling water (cooling medium) in the cooling portion flow path.
Figure 4:
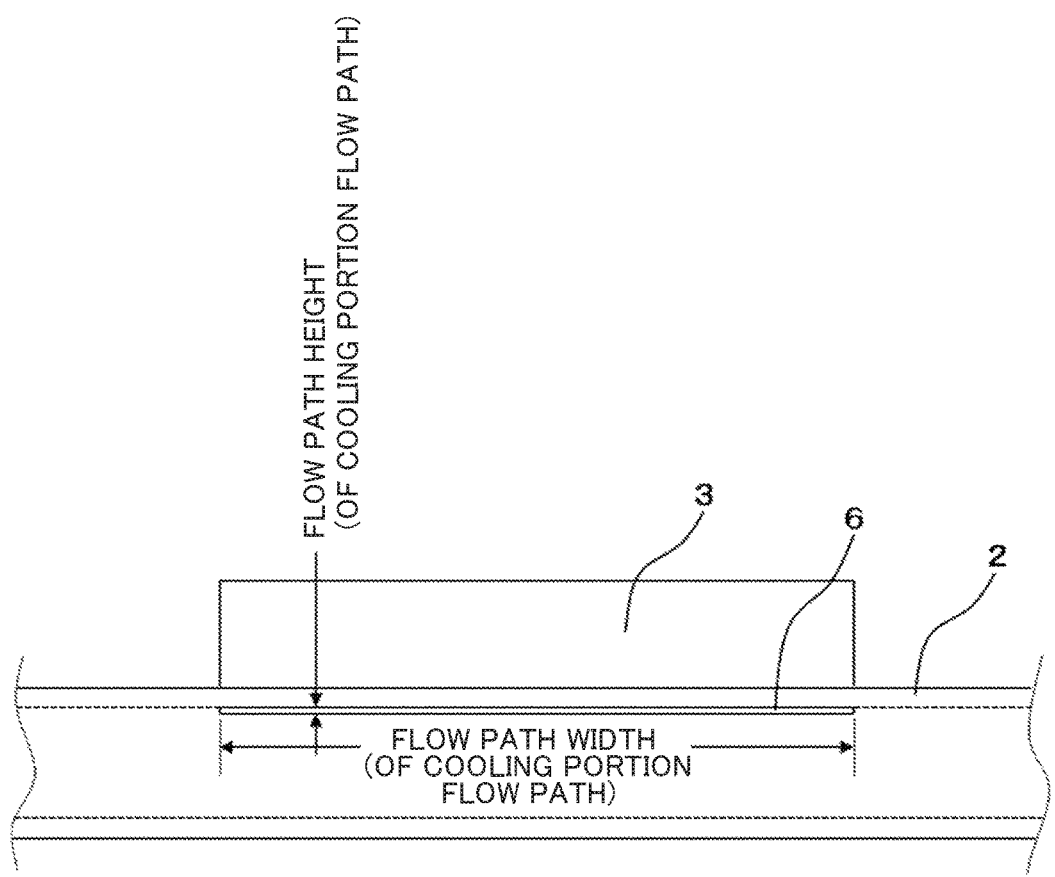
FIG. 4 is a diagram for schematically illustrating the configuration of the one cooling portion flow path and the vicinity thereof in the LD module cooling device illustrated in FIGS. 1 and 2 in a section perpendicular to a direction of flow of the cooling water (cooling medium) in the cooling portion flow path.

The configuration of the cooling portion flow path 6 is now described with reference to FIGS. 3 and 4. FIG. 3 is a diagram for schematically illustrating the configuration of one cooling portion flow path 6 and the vicinity thereof in the LD module cooling device 1 illustrated in FIGS. 1 and 2, in which a cross section of the cooling portion flow path 6 is perpendicular to the front surface of the water cooling plate 2 and parallel to a direction in which the cooling water flows in the cooling portion flow path 6. FIG. 4 is a diagram for schematically illustrating the configuration of one cooling portion flow path 6 and the vicinity thereof in the LD module cooling device 1 illustrated in FIGS. 1 and 2, in which a cross section of the cooling portion flow path 6 is perpendicular to a direction in which the cooling water flows in the cooling portion flow path 6. In FIG. 3, the dashed arrow schematically represents the direction of flow of the cooling water.

The cooling portion flow path 6 is a thin layer flow path parallel to the front surface of the water cooling plate 2, in which a flow path height and a flow path width are constant at least the majority of a flow path length. In other words, as illustrated in FIG. 3, the common supply flow path 4 and the common drainage flow path 5 are flow paths with large heights (depths) that account for a majority of the thickness of the water cooling plate 2. In contrast, the cooling portion flow path 6 has a substantially low height (depth). The cooling portion flow path 6 is arranged inside the water cooling plate 2 toward the front surface (on a side close to the LD modules 3) so that ceiling surfaces of the branched common supply flow paths 8 and the branched common drainage flow paths 10 and a ceiling surface of the cooling portion flow path 6 are the same height. Therefore, as illustrated in FIG. 3, the cooling portion flow path 6 horizontally communicates with the branched common supply flow paths 8 and the branched common drainage flow paths 10.

Here, the term "at least the majority of a flow path length" means more than half the flow path length, preferably two-thirds or more of the flow path length, and more preferably the entire flow path length.

The phrase the "flow path height and the flow path width are constant" is used to mean that the flow path height and the flow path width do not change in terms of design in the direction along the flow path length. Therefore, the "flow path height and the flow path width are constant" allows for slight variations in the flow path height and flow path width resulting from manufacturing tolerances or the like.

In addition, "parallel to the front surface of the water cooling plate 2" is used to mean that the cooling portion flow path 6 is formed parallel to the water cooling plate 2 in terms of design. Therefore, this allows for portions of the cooling portion flow path 6 formed as the thin layer flow path parallel to the front surface of the water cooling plate 2 that are slightly nonparallel to the front surface of the water cooling plate 2 as a result of manufacturing tolerances or the like.

In the present invention, unless otherwise stated, "flow path length" means the length of the flow path of the cooling portion flow path 6 along the direction of flow of the cooling water from the branched common supply flow path 8 to the branched common drainage flow path 10. Further, "flow path width" means the width of the flow path of the cooling portion flow path 6 in a direction orthogonal to the direction of flow of the cooling water. Lastly, "flow path height" means the height (depth) of the flow path of the cooling portion flow path 6 along a direction perpendicular to the front surface of the water cooling plate 2.

The cooling portion flow path 6 defined by the dimensions (flow path length×flow path width) is formed into a rectangular shape so that at least the majority of the cooling portion flow path 6 overlaps with a main contact surface between the water cooling plate 2 and each LD module 3 as viewed from the front surface of the water cooling plate 2. In this embodiment, the cooling portion flow path 6 is formed into a rectangular shape that has the same shape as the main contact surface between the water cooling plate 2 and each LD module 3.

Here, "at least the majority" means more than half the area of the rectangular shape of the cooling portion flow path 6, preferably more than two-thirds of the area of the rectangular shape of the cooling portion flow path 6, and more preferably the entire area of the rectangular shape of the cooling portion flow path 6. The phrase "same shape as" used to mean that the rectangular shape of the cooling portion flow path 6 defined by the dimensions (flow path length×flow path width) is not significantly different to the shape of the main contact surface between the water cooling plate 2 and each LD module 3. Therefore, there may be a slight difference that does not affect the cooling function of the LD module 3 with the cooling water that results from manufacturing tolerances or the like between the above-mentioned rectangular shape and the main contact surface. However, when the rectangular shape of the cooling portion flow path 6 defined by the dimensions (flow path length× flow path width) is significantly smaller than the shape of the main contact surface between the water cooling plate 2 and each LD module 3, the area of the inner wall of the cooling portion flow path 6, which mainly acts to take heat away from the inner wall of the flow path, because of the large flow speed of the cooling water that flows through the flow path decreases, and cooling characteristics suffer as a result. As a result, the rectangular shape of the cooling portion flow path 6 defined by the dimensions (flow path length×flow path width) is basically required to have the same shape as that of the main contact surface between the water cooling plate 2 and each LD module 3.

In addition, as viewed from the front surface of the water cooling plate 2 on which the LD modules 3 are arranged, the rectangular shape of the cooling portion flow path. 6 defined by the dimensions (flow path length×flow path width) is required to be equal to a relative position between the water cooling plate 2 and the main contact surface of each LD module 3. Here, "be equal to" is used to mean that the rectangular shape of the cooling portion flow path 6 defined by the dimensions (flow path length×flow path width) and the main contact surface between the water cooling plate 2 and each LD module 3 do not change in terms of design. Therefore, "be equal to" does not mean that these two components completely match and allows for slight deviation due to manufacturing tolerances or the like.

In order to realize desired cooling characteristics with a limited flow rate of cooling water flowing through each cooling portion flow path 6, the flow speed of the cooling water that flows through each cooling portion flow path 6 needs to be increased. In order to increase the flow speed, the cross-sectional area (=flow path width×flow path height) of the cooling portion flow path 6 needs to be substantially reduced. However, as described above, when the flow path width of the cooling portion flow path 6 reduces, cooling characteristics with regard to the LD modules 3 reduce. Therefore, in the present invention, the flow path height of the cooling portion flow path 6 is reduced to increase the flow speed of the cooling water that flows through each cooling portion flow path 6. When the flow rates of the cooling water flowing through each cooling portion flow path 6 are equal, cooling characteristics increase as the cross-sectional area of the cooling portion flow path 6 reduces, that is, as the flow path height reduces. However, as described above, the flow path length of the cooling portion flow path 6 cannot be reduced, and hence pressure loss of the cooling water in the cooling portion flow path 6 increases. As a result, the following problems occur: the cooling water does not flow as easily, load on a discharge pump in the chiller increases, a risk of water leaking increases because water pressure in the piping system increases, and others.

A method of chamfering corner portions at a boundary between the cooling portion flow path 6 and the branched common supply flow path 8 and branched common drainage flow path 10 to mitigate a sudden change in the flow path height is conceived for the purpose of reducing pressure loss of the cooling water in the cooling portion flow path 6. However, this method is not favorable due to high manufacturing costs. Further, there is a risk that fine impurities in the cooling water may block the cooling portion flow path 6 if the flow path height of the cooling portion flow path 6 is reduced. However, in order to flow substantially the same flow rate of cooling water through each cooling portion flow path 6, the cooling portion flow path 6 must be configured such that at least pressure loss of the cooling water caused by pipe friction in the cooling portion flow path 6 is greater than pressure loss of the cooling water caused by pipe friction in a common flow path formed of the common supply flow path 4 and the common drainage flow path 5. There is also conceived a method of increasing the width and height (depth) of this common flow path to reduce pressure loss in the common flow path, but this method is not favorable because increasing the size and thickness of the water cooling plate 2 results in increased weight and costs.

There is an optimal flow path height for the flow path height of the cooling portion flow path 6. While this optimal flow path height varies depending on conditions such as size of the LD module 3 and allowable flow rate of the cooling water. Under normally applied conditions, the optimal flow path height must satisfy at least one of the following two conditions: the flow path height of the cooling portion flow path 6 is 1/20 or less of the flow path width and flow path length; and the flow path height of the cooling portion flow path 6 is 0.5 mm or less.

If heat generation conditions and cooling conditions of the LD module 3 are limited to normal conditions, the optimum range becomes clearer. As described above, when the flow rate of the cooling water is approximately 10 L/min, the number of LD modules 3 is approximately 50, the heating value of each LD module 3 is approximately 50 W, and the shape of the main contact surface between the water cooling plate 2 and each LD module 3 is approximately 50 mm×25 mm, as described below, the flow path height thought to be substantially optimal is from 0.05 mm to 0.15 mm, and is 1/100 or less of the flow path width and flow path length. Drawing the flow path height at an actual dimension ratio causes the flow path height to reduce and makes the shape of the cooling portion flow path 6 difficult to understand. Therefore, the flow path height shown in FIGS. 3 and 4 is purposely drawn larger than the dimension ratio of the actual flow path height.

In order to described the reason for limiting the flow path height of the cooling portion flow path 6 and the effect of the present invention in detail, results of thermal fluid simulation are illustrated in FIGS. 5 to 11. Simulation conditions are as follows.

The structure of the LD module cooling device 1 is the structure illustrated in FIG. 1. In other words, the LD module cooling device 1 is configured such that six LD modules 3 are arranged in one row in the horizontal direction, and eight of those rows are arranged in the vertical direction, such that a total of 48 LD modules 3 are two-dimensionally arranged on the front surface of the water cooling plate 2.

Five LDs (laser diodes) (not shown) are mounted onto each LD module 3, and the heating value of each LD is 9 W.

The inflow temperature of the cooling water is 25° C., and the flow rate of the cooling water is 10 L/min.

The water cooling plate 2 is made of copper, and has a thickness of 11 mm.

The common supply flow path 4 and the common drainage flow path 5 have a height (depth) of 8 mm, a width at a wide portion (the main common supply flow path 9 and the main common drainage flow path 11) of 16 mm, and a width at a narrow portion (the branched common supply flow path 8 and the branched common drainage flow path 10) of 8 mm.

The cooling portion flow path 6 has a flow path width of 50 mm, and a flow path length of 30 mm. Simulations were carried out while varying the flow path height of the cooling portion flow path 6 within a range from 0.05 mm to 0.5 mm.

Figure 5:
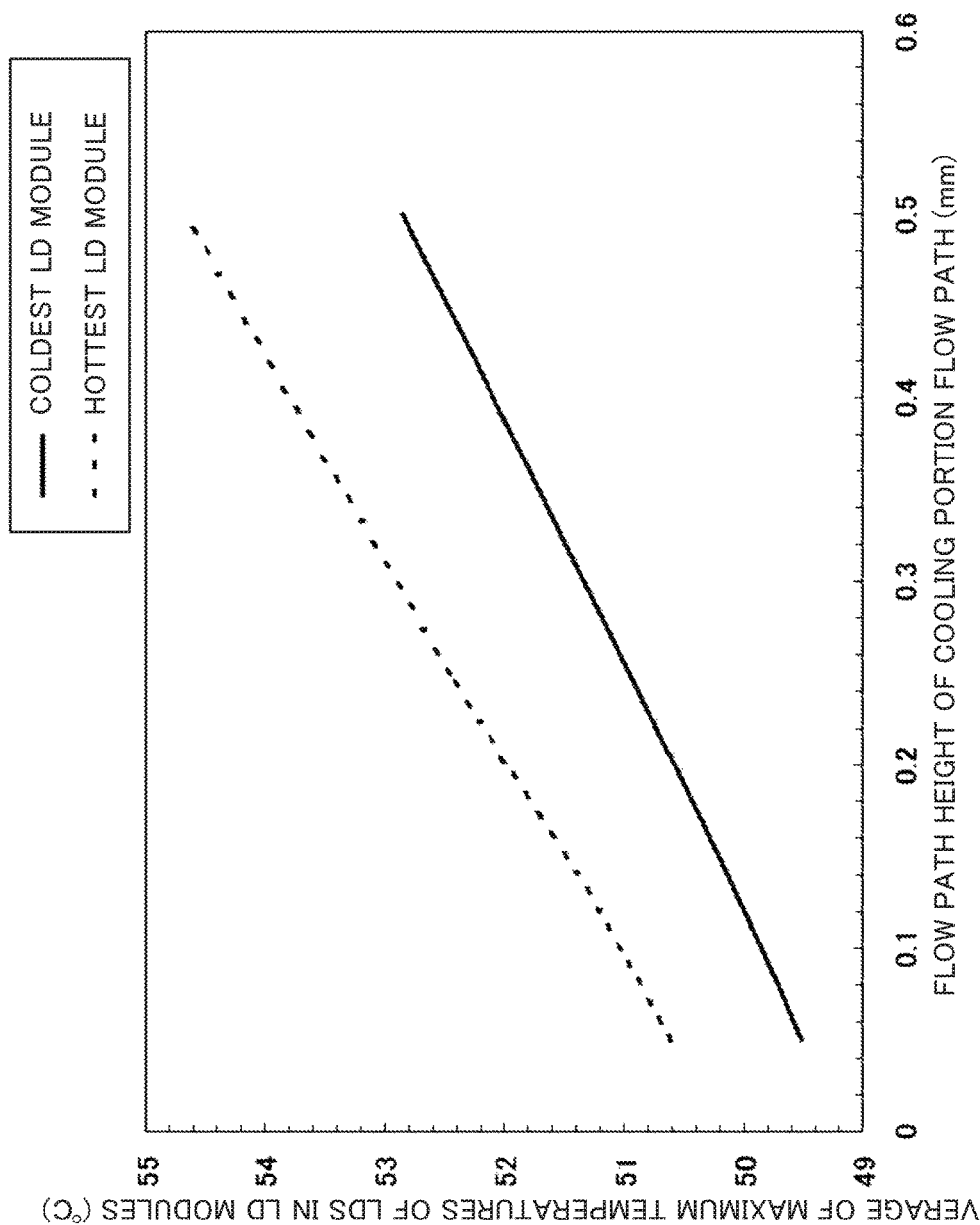
FIG. 5 is a graph showing thermal fluid simulation results for explaining the effects of the present invention.

FIG. 5 illustrates flow path height dependence of the cooling portion flow path 6 on an average of maximum temperatures of the LDs (=temperature at pn junction of LDs) mounted onto the LD modules 3 that have the lowest temperature among the 48 LD modules 3, and an average of maximum temperatures (=temperature at pn junction) of the LDs mounted to the LD modules 3 that have the highest temperature among the 48 LD modules 3. The highest temperature of the LD decreases as the flow path height decreases.

Figure 12:
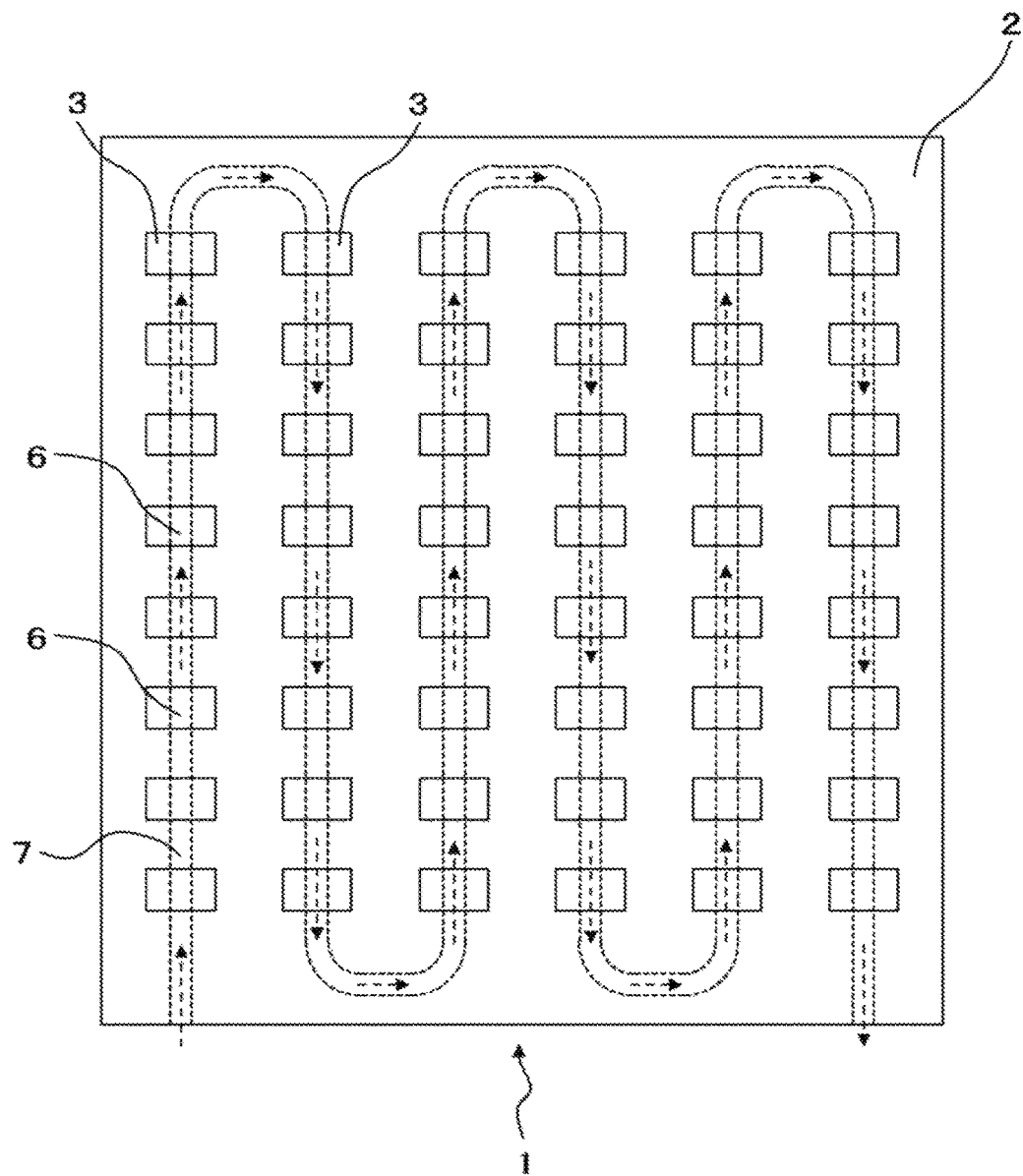
FIG. 12 is a plan view for schematically illustrating a conventional LD module cooling device in which cooling water (cooling medium) flows in a cooling portion flow path in series.

Here, for the purposes of comparison, an exemplary flow path structure in a conventional LD module cooling device in which cooling water flows in series is illustrated in FIG. 12. In the conventional flow path structure illustrated in FIG. 12 in which the cooling water flows in series in the cooling portion flow path 6 (flow path directly under each. LD module near each LD module 3, under the above-mentioned heating and cooling conditions, the temperature of the cooling water rises approximately 3.1° C. on a downstream side compared to an upstream side, causing a difference in temperature of approximately 3.1° C. between the LD modules 3. In contrast, with the LD module cooling device 1 according to the present invention in which the cooling water flows in series in each cooling portion flow path 6, it can be seen that the difference in temperature between the LD modules 3 decreases from 1/3 to 1/2 as intended.

As described above, the LD module cooling device has a problem in that the temperature rises by approximately 3° C. Because of this, the effect of the present invention cannot be obtained if the flow path height of the cooling portion flow path 6 increases and the temperature of the LD increases any further. Therefore, the flow path height of the cooling portion flow path 6 must be 0.5 mm or less in terms of cooling performance. In order to achieve an obvious effect, the flow path height of the cooling portion flow path 6 is preferably 0.15 mm or smaller.

When the flow path height of the cooling portion flow path 6 is made to be 0.05 mm, the difference in temperature between the LD modules 3 decreases to 1.1° C. The average of maximum temperatures of the LDs on the LD modules 3 that have the highest temperatures is lower than the average of maximum temperatures of the LDs on the LD modules 3 that have a lowest temperature in the conventional flow path structure illustrated in FIG. 12. Therefore, a superior cooling effect can be achieved by changing the flow path height of the cooling portion flow path 6 to 0.05 mm. This is thought to be because, as viewed from the LD modules 3, the area of the cooling portion flow path 6 near the LD modules 3 increases and thermal resistance between the LD module 3 and the cooling water decreases.

Figure 6:
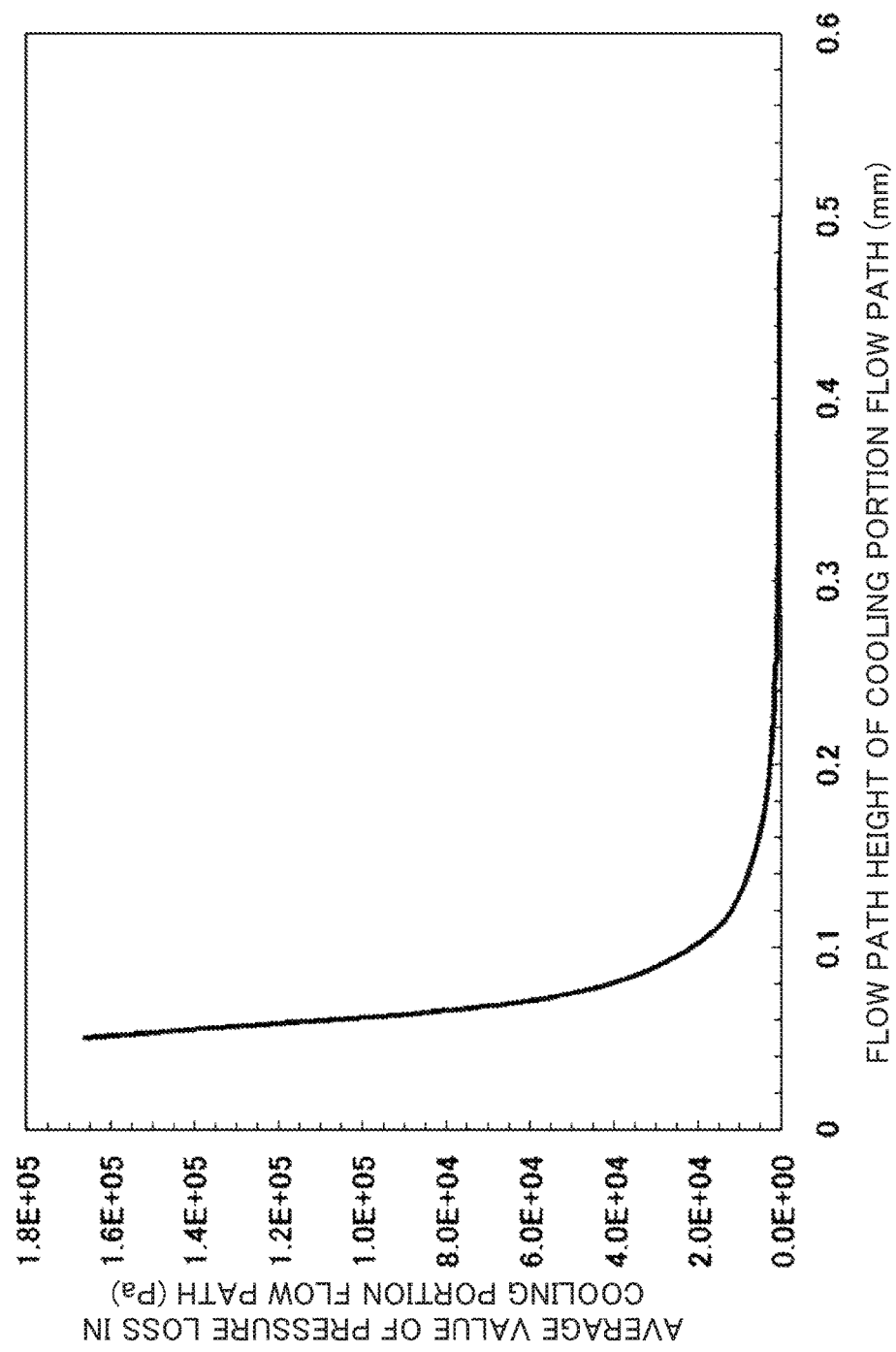
FIG. 6 is a graph showing thermal fluid simulation results for explaining the effects of the present invention.

In terms of cooling characteristics, the flow path height of the cooling portion flow path 6 should be as small as possible. However, making the flow path height too small causes other types of problems. FIG. 6 illustrates flow path height dependence of pressure loss of the cooling water in the cooling portion flow path 6. When the flow path height is smaller than 0.05 mm, pressure loss sharply increases and, for example, the following problems occur: more load is placed on the cooling water discharge pump of the chiller, pressure resistance specifications of the piping system become stricter, and water is more likely to leak from the piping system. In addition, clogging due to impurities, for example, is more likely to occur. However, while pressure loss in the cooling portion flow path 6 poses a problem if too large as described above, in order to flow the cooling water substantially evenly through the cooling portion flow path 6 of each LD module 3, pressure loss in the cooling portion flow path 6 must be dominant over the whole pressure loss (=pressure difference of cooling water between supply port and drainage port of water cooling plate 2). Therefore, at least a certain amount of pressure loss is required.

Figure 7:
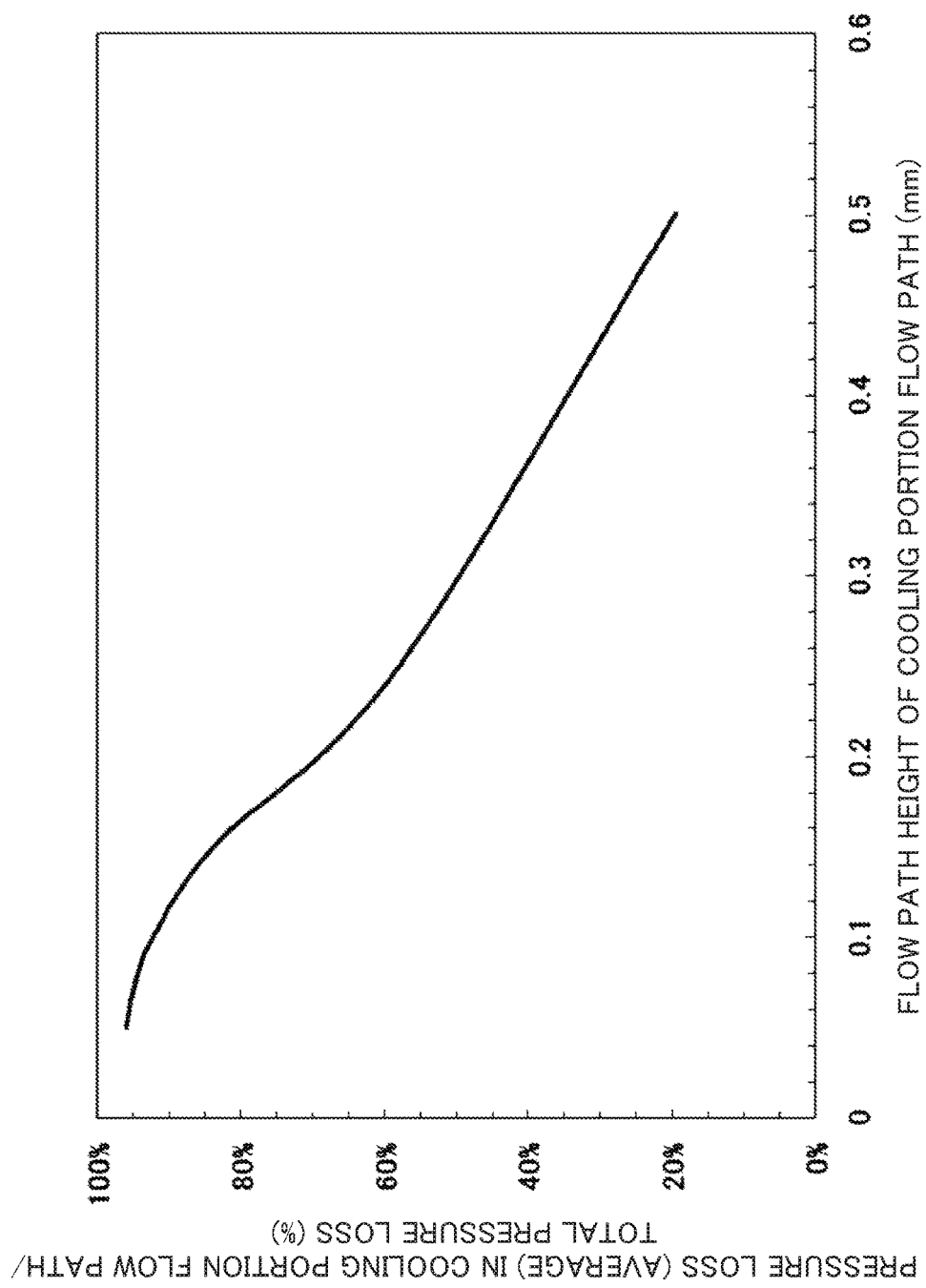
FIG. 7 is a graph showing thermal fluid simulation results for explaining the effects of the present invention.

FIG. 7 illustrates flow path height dependence at a ratio obtained by dividing the average of pressure loss in each cooling portion flow path 6 by the total pressure loss. If the flow path height exceeds 0.3 mm, the pressure loss in each cooling portion flow path 6 becomes less than 50% of the total pressure loss and is therefore no longer dominant over the total pressure loss. That is, it is difficult to establish the relationship "pressure loss in the cooling portion flow path 6 >pressure loss in a common flow path". Therefore, FIG. 7 shows that the flow path height must be 0.3 mm or less from the viewpoint of flowing cooling water substantially evenly in each cooling portion flow path 6.

Figure 8:
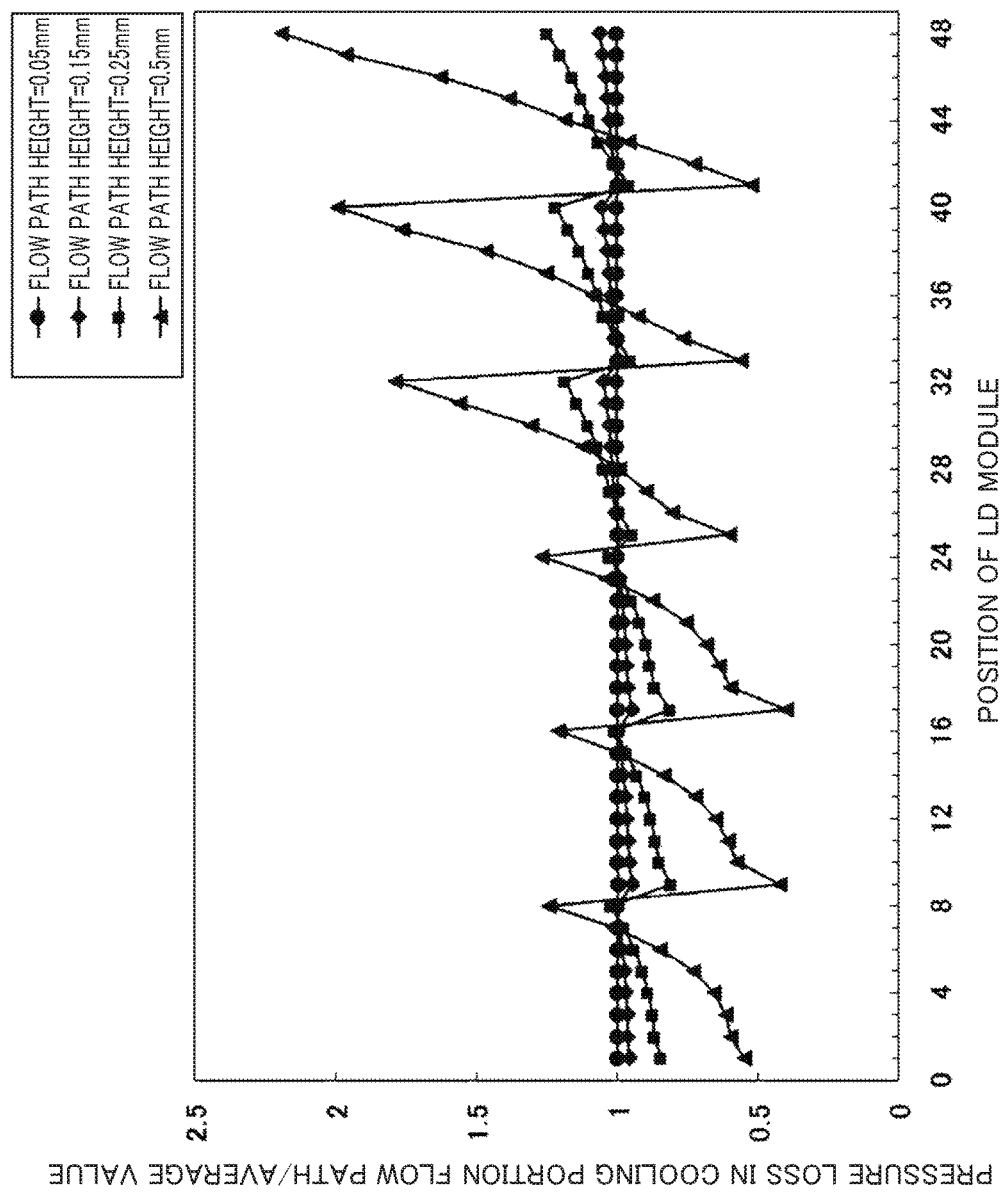
FIG. 8 is a graph showing thermal fluid simulation results for explaining the effects of the present invention.
Figure 9:
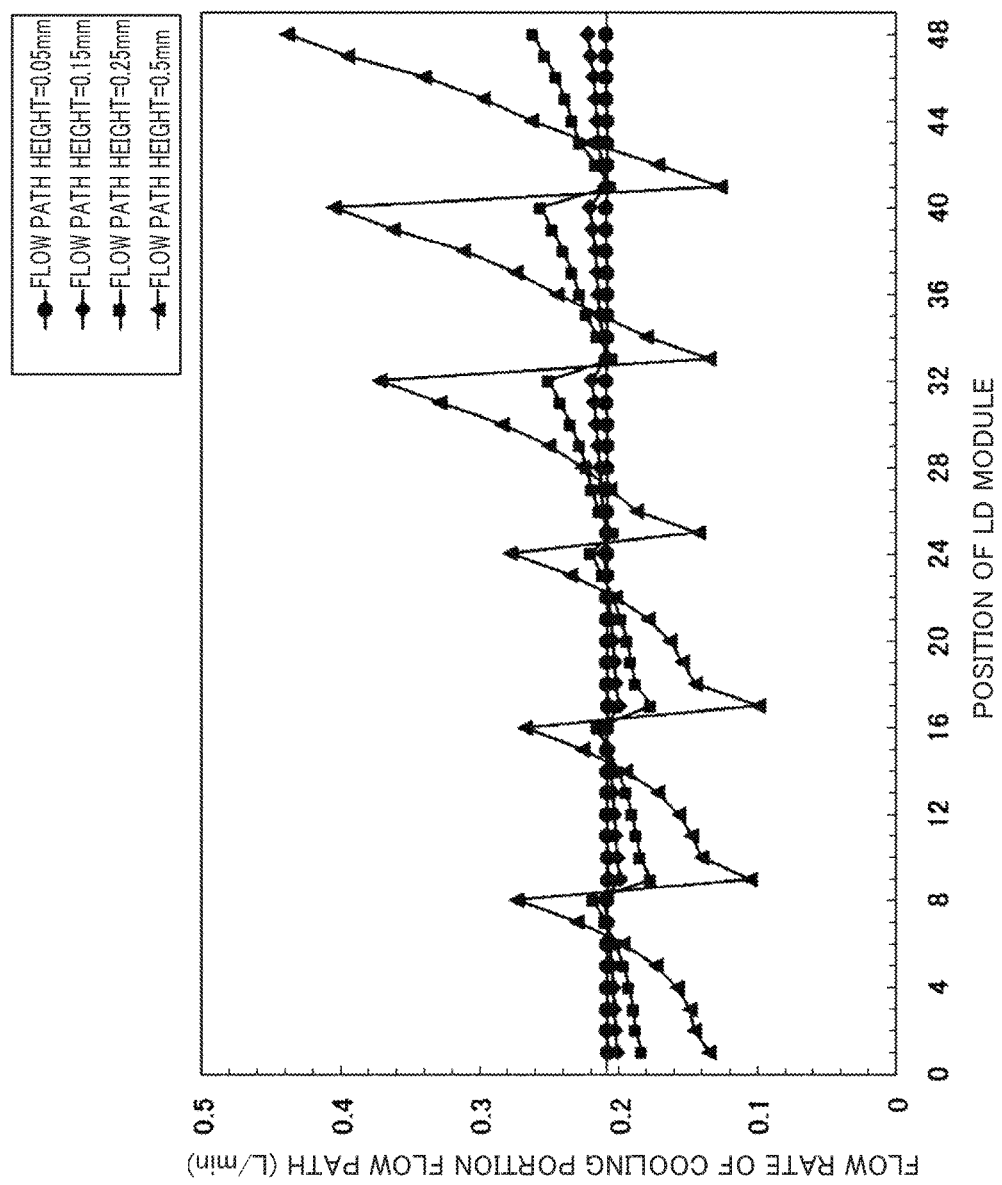
FIG. 9 is a graph showing thermal fluid simulation results for explaining the effects of the present invention.

FIGS. 8 to 11 show what kind of heterogeneity actually occurs between each cooling portion flow path 6 when the flow path height increases. FIG. 8 shows a distribution of pressure loss standardized using average values of the cooling portion flow paths 6. FIG. 9 shows a distribution of flow rate in each cooling portion flow path 6. The numbers indicating the position of the LD module on the horizontal axis in FIGS. 8 and 9 represent the positions of the LD module 3 in the LD module 3 arrangement illustrated in FIG. 1. In FIGS. 8 and 9, the positions in the LD module 3 arrangement from left to right in the top row in FIG. 1 are represented by the numbers 1, 2, 3, . . . , 6, and the positions in the LD module 3 arrangement from left to right in the second row from the top in FIG. 1 are represented by the numbers 7, 8, 9, . . . , 12.

According to FIGS. 8 and 9, variation in pressure loss starts to become apparent when the flow path height of the cooling portion flow path 6 is 0.25 mm, and is very apparent when the flow path height of the cooling portion flow path 6 is 0.5 mm. Accordingly, flow rate also varies.

Figure 10:
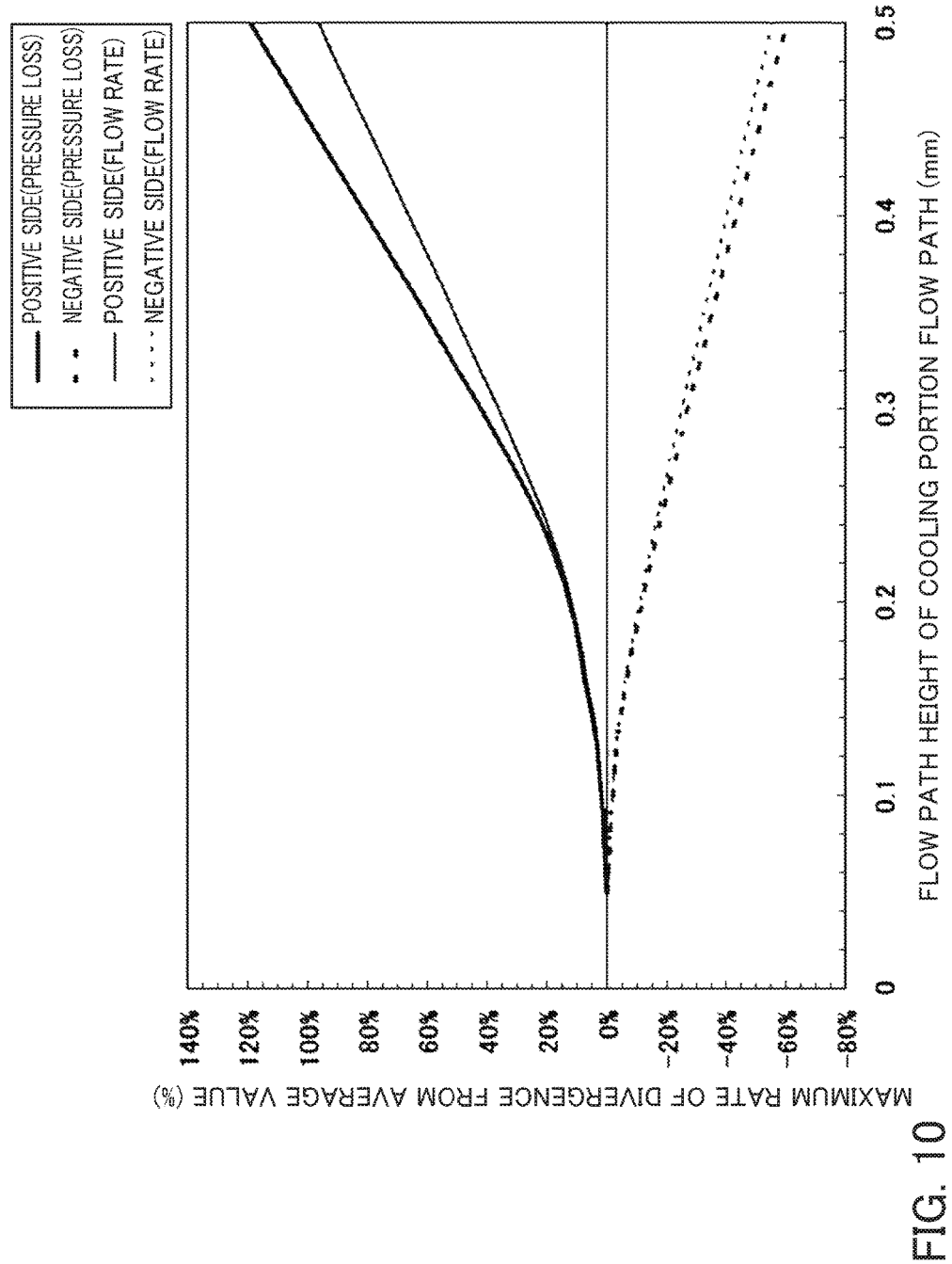
FIG. 10 is a graph showing thermal fluid simulation results for explaining the effects of the present invention.

FIG. 10 shows pressure loss and flow rate of the cooling portion flow path 6 as flow path height dependence of a maximum rate of divergence from the average values. In FIG. 10, the ratio of divergence between pressure loss and the flow rate is almost equal, which shows that variation in pressure loss in each cooling portion flow path 6 causes variation in the flow rate of each cooling portion flow path 6. Therefore, when the flow rate of the cooling water flowing through each cooling portion flow path 6 varies in this way, it is impossible to guarantee that the cooling characteristics in each cooling portion flow path 6 are made substantially equal. In the sense that there is little difference in pressure loss and flow rate between each cooling portion flow path 6, the flow path height of the cooling portion flow path 6 is preferably 0.15 mm or smaller.

Figure 11:
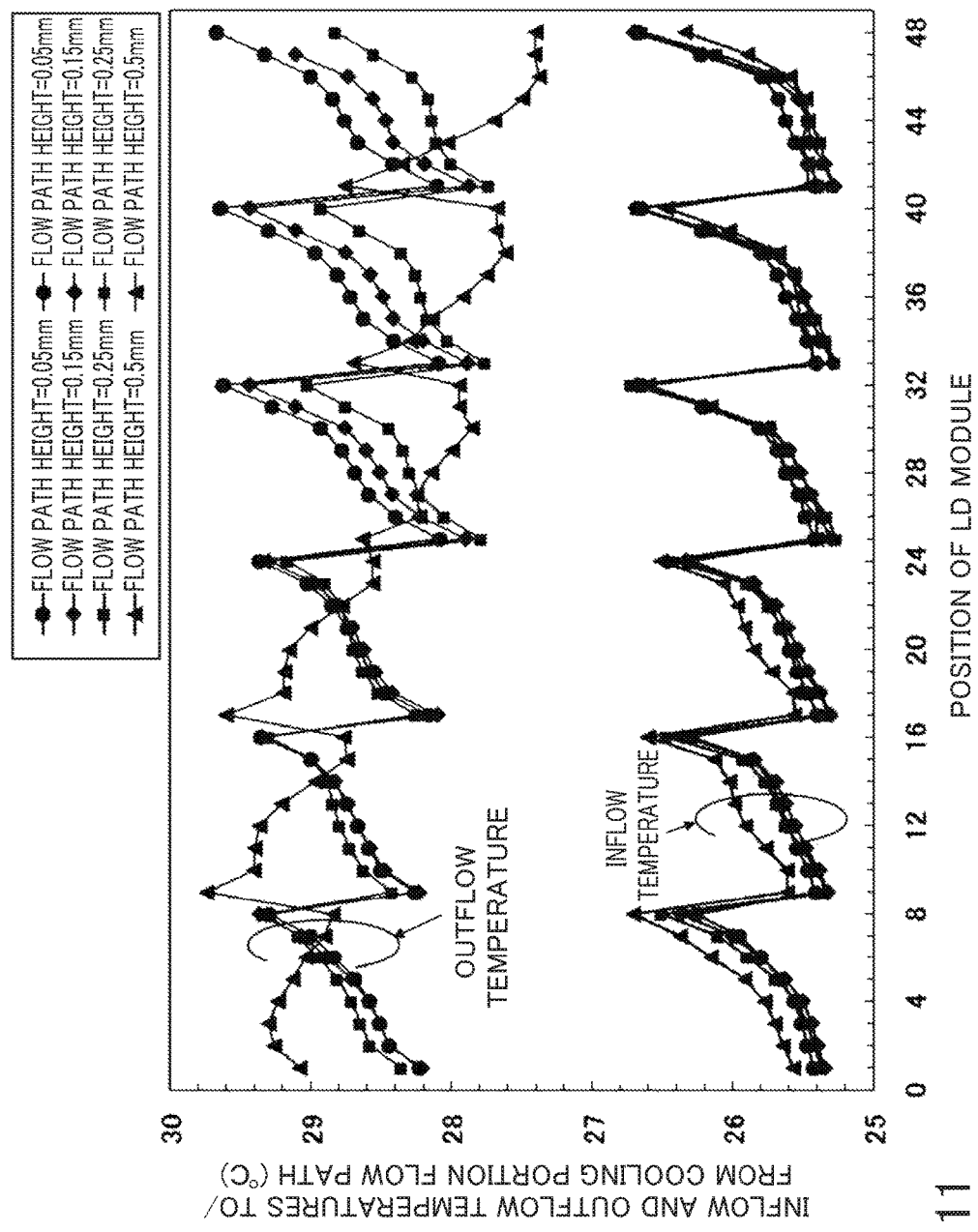
FIG. 11 is a graph showing thermal fluid simulation results for explaining the effects of the present invention.

FIG. 11 shows a distribution of inflow temperatures and outflow temperatures of the cooling water that flows into each cooling portion flow path 6. While there is not a lot of difference between inflow temperatures even if the flow path height of the cooling portion flow path 6 increases, the outflow temperature largely deviates from a case in which the flow path height is small when the flow path height is 0.5 mm. Therefore, it can be seen that cooling characteristics vary depending on the position of the cooling portion flow path 6.

Based on the above-described simulation results, the optimal flow path height of the cooling portion flow path 6 varies by some degree when heating generation conditions such as the heating value and size of the LD module 3 and cooling conditions such as flow rate of the cooling water, size of the water cooling plate 2 and cross section of the common flow path change. However, under conditions normally applied to the LD module cooling device, the flow path height of the cooling portion flow path 6 must be 0.5 mm or less, and is desirably from 0.05 mm to 0.15 mm. A flow path height of the cooling portion flow path 6 in this range of 0.05 mm to 0.15 mm corresponds to $\frac{1}{200}$ or less of the flow path length and flow path width of the cooling portion flow path 6. This value is often required to be approximately $\frac{1}{100}$ or less.

Second Embodiment of LD Module Cooling Device

Figure 13:
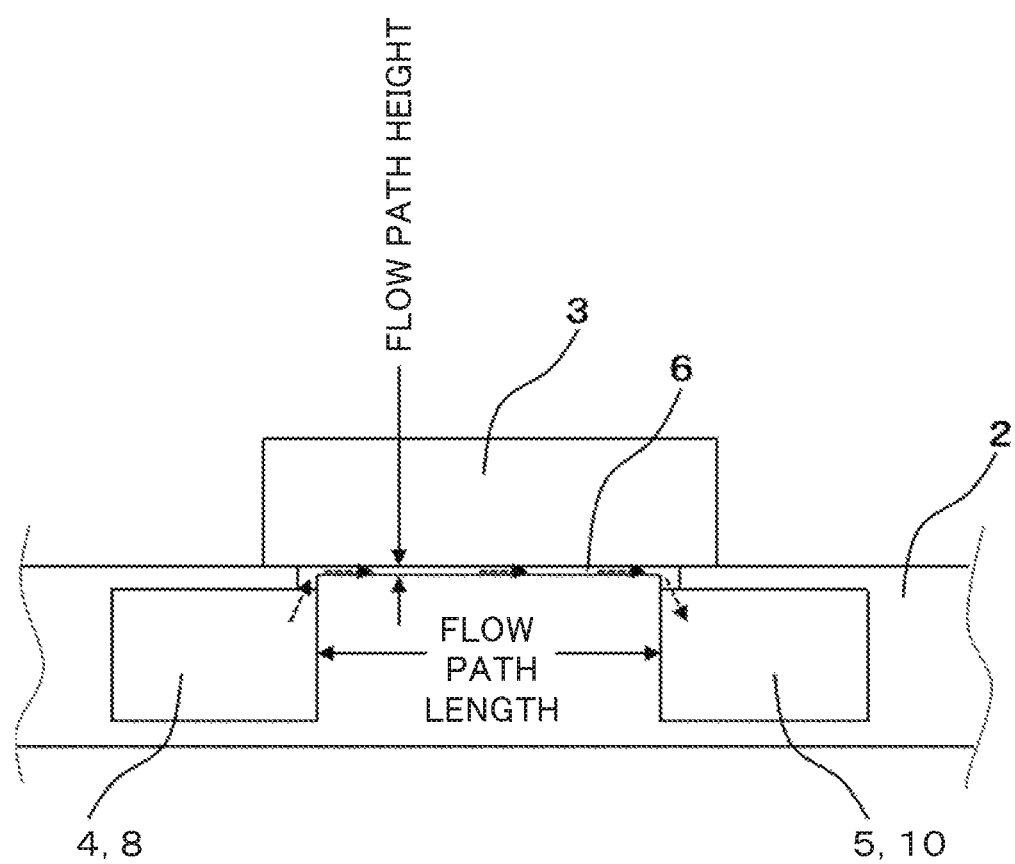
FIG. 13 is a diagram for schematically illustrating a configuration of one cooling portion flow path and the vicinity thereof in an LD module cooling device according to a second embodiment of the present invention in a section perpendicular to a front surface of a water cooling plate (cooling plate) and parallel to a direction of flow of cooling water (cooling medium) in the cooling portion flow path.
Figure 14:
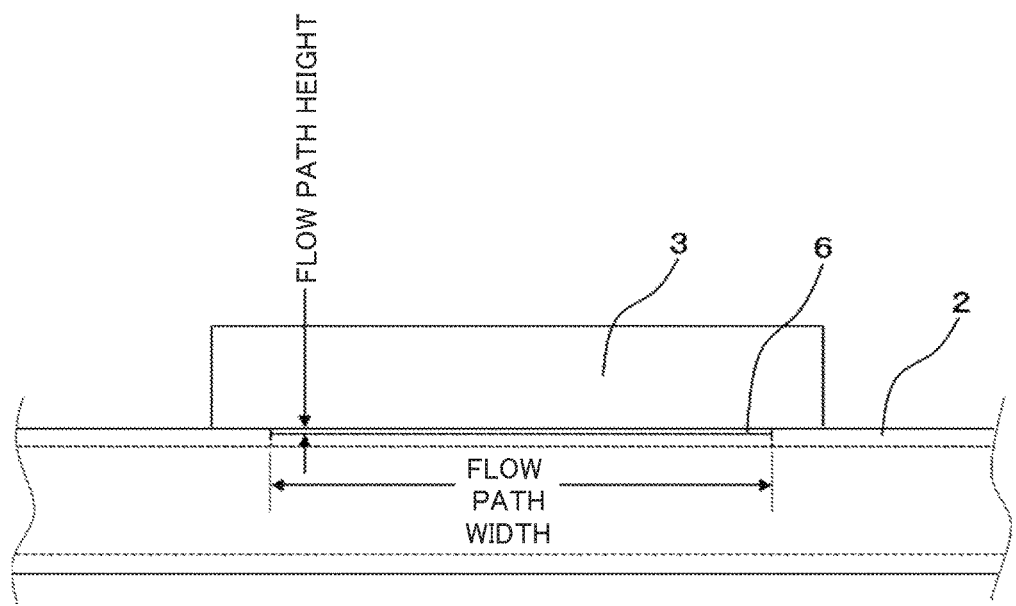
FIG. 14 is a diagram for schematically illustrating the configuration of the one cooling portion flow path and the vicinity thereof in the LD module cooling device according to the second embodiment of the present invention in a section perpendicular to a direction of flow of cooling water (cooling medium) in the cooling portion flow path.

FIGS. 13 and 14 are diagrams for schematically illustrating a configuration of the cooling portion flow path 6 and the vicinity thereof in the LD module cooling device 1 according to a second embodiment of the present invention. FIG. 13 is a diagram for schematically illustrating the configuration of one cooling portion flow path 6 and the vicinity thereof, in which a cross section thereof is perpendicular to the front surface of the water cooling plate 2 and parallel to a direction of flow of the cooling water in the cooling portion flow path 6. FIG. 14 is a diagram for schematically illustrating the configuration of one cooling portion flow path 6 and the vicinity thereof, in which a cross section thereof is perpendicular to a direction of flow of the cooling water in the cooling portion flow path 6.

The configuration of the cooling portion flow path 6 of the LD module cooling device 1 according to the second embodiment is different from that according to the first embodiment illustrated in FIGS. 1 to 4 in that the cooling portion flow path 6 is formed between the water cooling plate 2 and a package (external container) of the LD modules 3 due to cooperation between the water cooling plate 2 and the package of LD modules 3. In other words, a concave portion with a predetermined depth for forming the cooling portion flow path 6 is formed on the front surface of the water cooling plate 2. This concave portion is covered by the package of LD modules 3. The cooling portion flow path 6 is formed by the bottom surface of the package forming a ceiling surface inside the concave portion. Therefore, the rectangular shape of the cooling portion flow path 6 defined by the dimensions [flow path length×flow path width] exists on an inner side of the main contact surface between the water cooling plate 2 and the package of each LD module 3. The depth of the concave portion is the flow path height of the cooling portion flow path 6.

The common supply flow path 4 and the common drainage flow path 5 have the same configuration as that in the first embodiment. Therefore, the cooling portion flow path 6 in the thickness direction of the water cooling plate 2 is located further toward the front surface of the water cooling plate 2 (LD module 3) than the common supply flow path 4 and the common drainage flow path 5. Therefore, the cooling portion flow path 6 vertically communicates with the common supply flow path 4 and the common drainage flow path 5. Although not shown, a sealing member such as a gasket for preventing water leakage is provided on the main contact surface between the water cooling plate 2 and the package of LD modules 3 in order to surround the cooling portion flow path 6.

When the cooling portion flow path 6 is formed through cooperation between the water cooling plate 2 and the package of LD modules 3 as described above, the area of the rectangular shape of the cooling portion flow path 6 defined by the dimensions [flow path length×flow path width] must be smaller than the area of the main contact surface of each LD module 3. This is disadvantageous in terms of cooling characteristics. However, the cooling water can directly make contact with the bottom surface of the package of LD modules 3, and hence thermal contact resistance between the water cooling plate 2 and the LD module 3 does not exist, and the LDs inside each LD module 3 can be cooled more evenly and at a lower temperature.

When the cooling portion flow path 6 is formed through cooperation between the water cooling plate 2 and the package of the LD modules 3, the cooling water can directly make contact with the package of LD modules 3, and hence the material of the water cooling plate 2 no longer needs to be a material with high thermal conductivity. Therefore, the material of the water cooling plate 2 may be a material other than a metal, such as a resin. When the water cooling plate 2 is made of a resin, the water cooling plate 2 can be significantly reduced in weight and produced at lower cost.

Third Embodiment of LD Module Cooling Device

Figure 15:
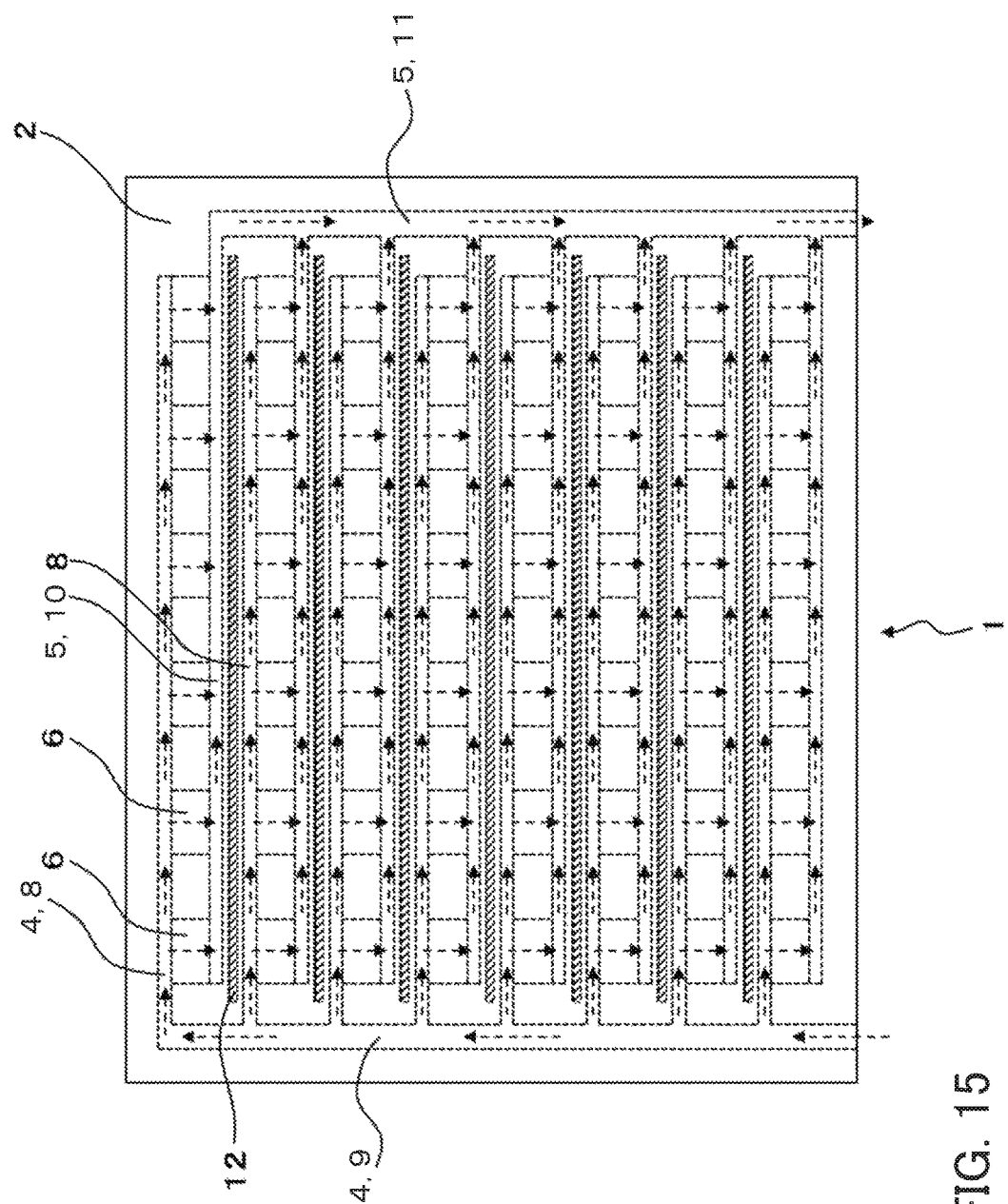
FIG. 15 is a plan view for schematically illustrating structure of a water cooling plate (cooling plate) of an LD module cooling device according to a third embodiment of the present invention.

FIG. 15 is a plan view for schematically illustrating the structure of the water cooling plate 2 in an LD module cooling device 1 according to a third embodiment of the present invention. In FIG. 15, the LD modules 3 arranged on each. cooling portion flow path 6 have the same arrangement configuration as the LD modules 3 illustrated in FIG. 1. However, the LD modules 3 are not shown in FIG. 15.

As in the common flow path illustrated in FIGS. 1 and 2, the common supply flow path 4 and the common drainage flow path 5 of the LD module cooling device 1 according to the third embodiment of the present invention is formed of a plurality of branched common supply flow paths 8 and branched common drainage flow paths 10, one main common supply flow path 9 and one main common drainage flow path 11. Each row of the cooling portion flow path 6 makes contact with one branched common supply flow path 8 and one branched common drainage flow path 10. In FIG.15, the branched common supply flow path 8 is arranged on an upper side of each row of the cooling portion flow path 6, and the branched common drainage flow path 10 is arranged on lower side of each row of the cooling portion flow path 6. Therefore, between adjacent rows of the cooling portion flow paths 6, one branched common supply flow path 8 and one branched common drainage flow path 10 are adjacent. Further, between the adjacent branched common supply flow path 8 and branched common drainage flow path 10 of the water cooling plate 2, a thermal insulation portion 12 that has a lower thermal conductivity than the water cooling plate 2 is arranged in parallel along the direction of rows of the cooling portion flow paths 6.

Figure 16:
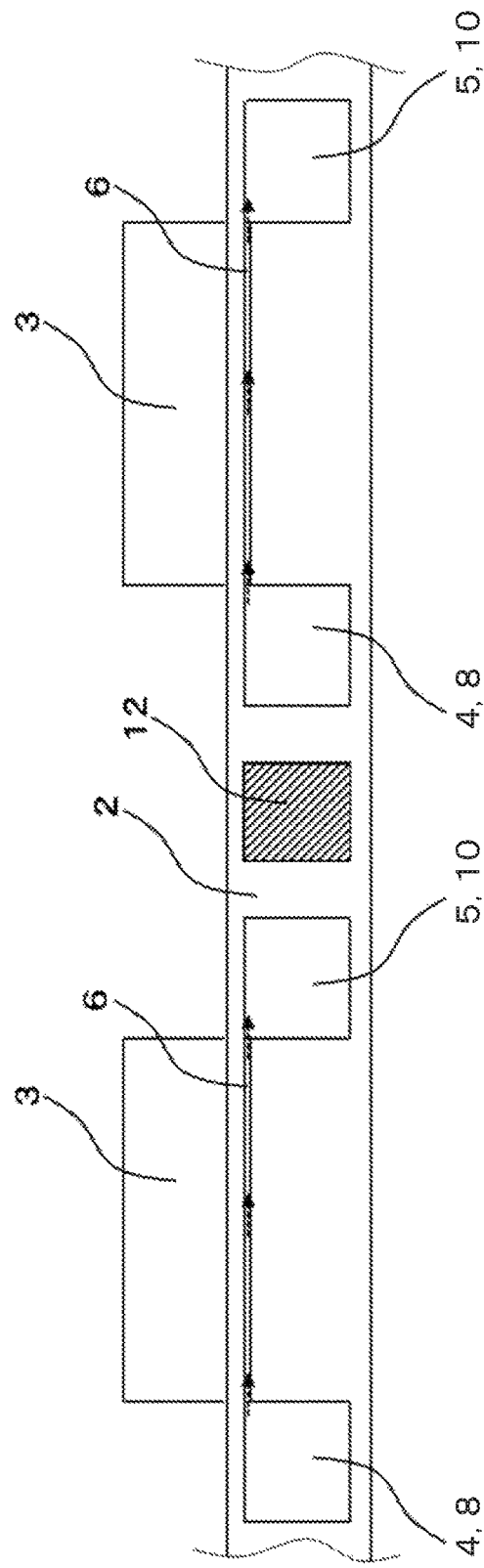
FIG. 16 is a diagram for illustrating a part of the cooling water plate (cooling plate) illustrated in FIG. 15 in a section perpendicular to a front surface of the water cooling plate (cooling plate) and parallel to a direction of flow of cooling water (cooling medium) in a cooling portion flow path.

The configuration of this thermal insulation portion 12 is further described with reference to FIG. 16. FIG. 16 is a diagram of a part of the water cooling plate 2 illustrated in FIG. 15, illustrating a cross section perpendicular to the front surface of the water cooling plate 2 and parallel to the direction of flow of the cooling water in the cooling portion flow path 6. As illustrated in FIG. 16, the thermal insulation portion 12 is provided inside the water cooling plate 2 between the adjacent branched common supply flow path 8 and branched common drainage flow path 10.

The material of the thermal insulation portion 12 is not particularly limited and may be a general material with a thermal insulation effect. The thermal insulation portion 12 need not always be provided inside the water cooling plate 2 as a different material to that of the water cooling plate 2. For example, the thermal insulation portion 12 may be a groove formed in the water cooling plate 2. Because a groove is filled with air, a groove can sufficiently function as a thermal insulation portion.

In this way, by arranging the thermal insulation portion 12 having lower thermal conductivity than the water cooling plate 2 between the adjacent branched common supply flow path 8 and branched common drainage flow path 10, heat is prevented from transferring from the branched common drainage flow path 10 to the branched common supply flow path 8 via the water cooling plate 2. As a result, the temperature of the cooling water flowing through the branched common supply flow path 8 can be prevented from rising and a difference in cooling characteristics between LD modules 3 can be further reduced. The simulation results illustrated in the above-described FIGS. 5 to 11 are also results obtained under simulation conditions in which an 11 mm-wide thermal insulation portion (air) has been provided.

The thermal insulation portion 12 is preferably arranged between all adjacent branched common supply flow paths 8 and branched common drainage flow paths 10, but the thermal insulation portion 12 may be arranged between at least one group of a plurality of groups of adjacent branched common supply flow paths 8 and branched common drainage flow paths 10.

In addition, the thermal insulation portion 12 can also be applied to the LD module cooling device 1 according to the second embodiment illustrated in FIGS. 13 and 14.

Figure 17:
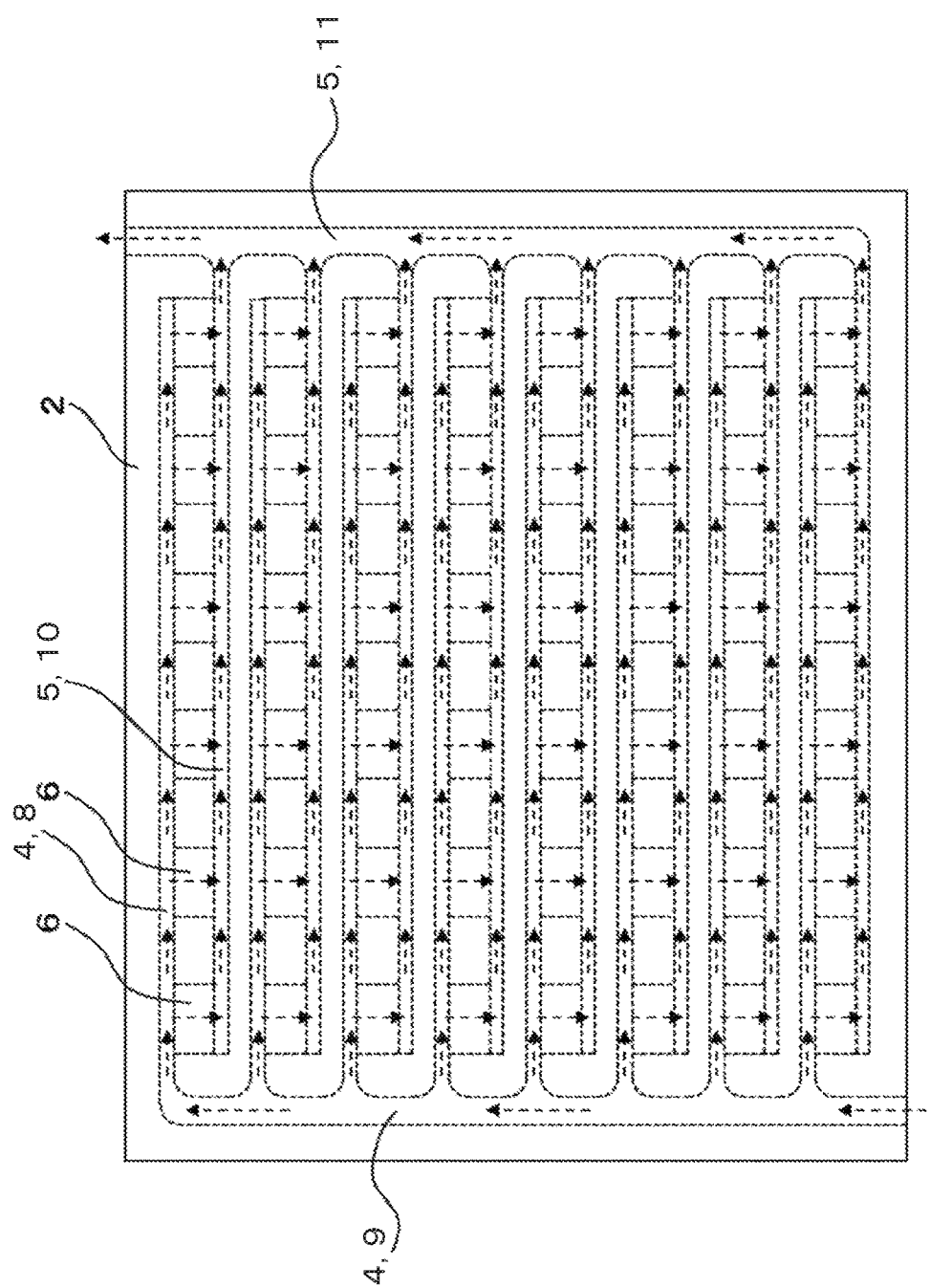
FIG. 17 is a schematic diagram for illustrating a modification example of the flow path structure of the LD module cooling device according to the first to third embodiments of the present invention.
Figure 18:
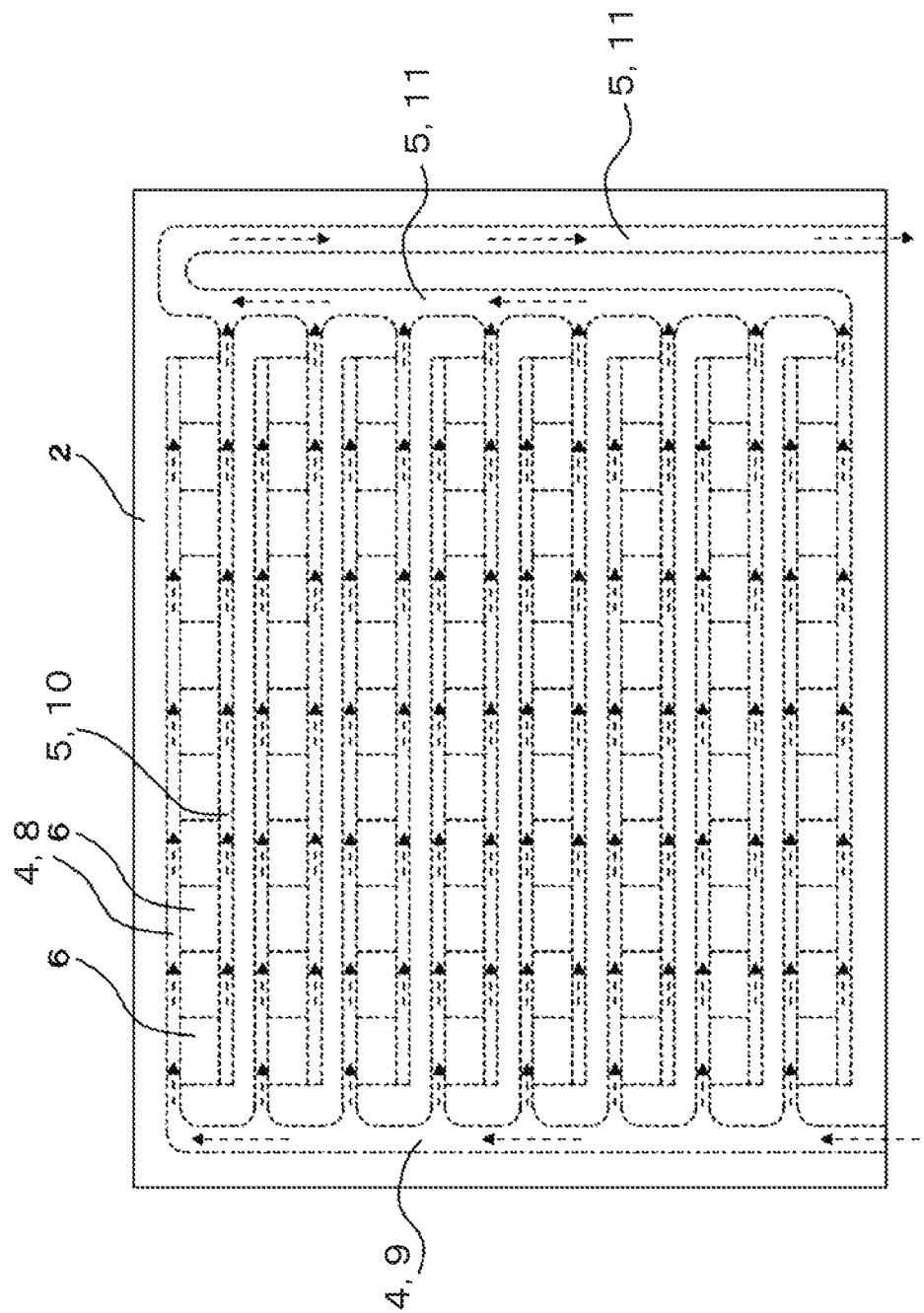
FIG. 18 is a schematic diagram for illustrating another modification example of the flow path structure of the LD module cooling device according to the first to third embodiments of the present invention.

The flow path structure of common flow paths illustrated in FIGS. 1, 2 and 15 is merely an example. In these common flow structures, pressure loss of the cooling water preferably small and the same for each cooling portion flow path 6. Therefore, according to a modification example illustrated in. FIGS. 17 and 18, the common flow structure can be modified as appropriate by, for example, rounding bent portions in each common flow path 8, 9, 10, or 11, or changing the orientation or length of the main common supply flow path 9 or the main common drainage flow path 11.

Fourth Embodiment of LD Module Cooling Device

FIGS. 19 to 22 are diagrams for schematically illustrating a structure of a water cooling plate of an LD module cooling device according to a fourth embodiment of the present invention. In FIGS. 19 to 22, a line such as a flow path structure which is not visible from the outer side or cross section of the water cooling plate 2 is drawn with a dotted line. The line drawn as a solid line represents a visible line viewed from the outer side or cross section of the water cooling plate 2.

Figure 19:
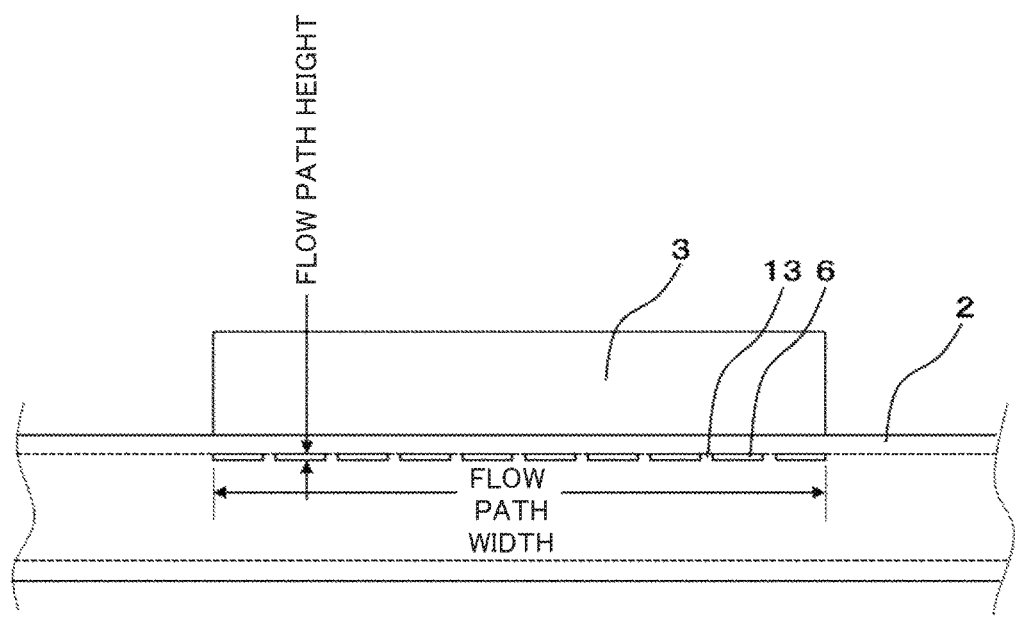
FIG. 19 is a schematic cross-sectional view for illustrating a cooling portion flow path and the vicinity thereof in an LD module cooling device according to a fourth embodiment of the present invention.
Figure 20:
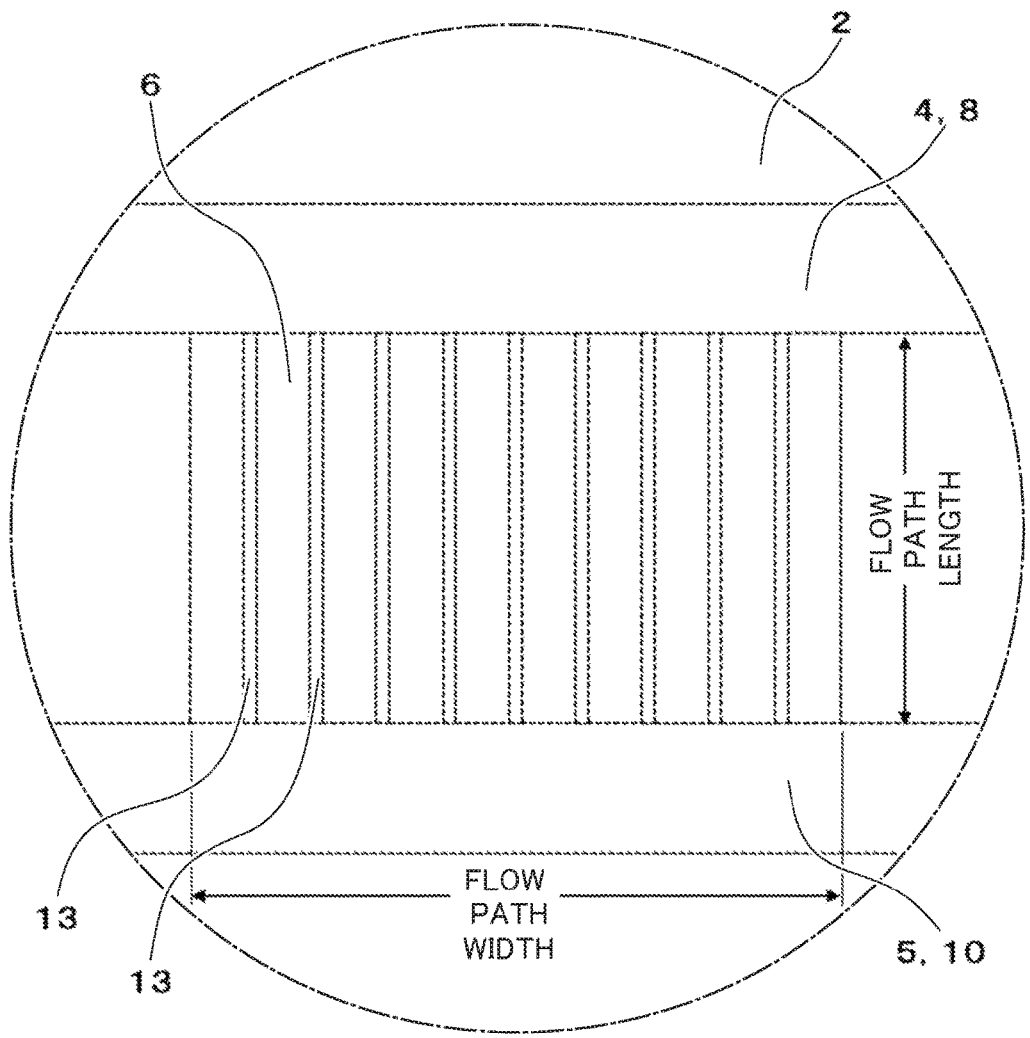
FIG. 20 is a schematic plan view for illustrating the cooling portion flow path and the vicinity thereof in the LD module cooling device according to the fourth embodiment of the present invention.

The cooling portion flow path 6 in the LD module cooling device 1 according to the fourth embodiment includes ridges 13. FIGS. 19 and 20 schematically illustrate an example in which the cooling portion flow path 6 in the LD module cooling device 1 according to the first embodiment of the present invention has been provided with the ridges 13. FIG. 19 is a schematic diagram for illustrating a configuration of the cooling portion flow path 6 and the vicinity thereof in a section perpendicular to the direction of flow of the cooling water flowing through the cooling portion flow path 6. FIG. 20 is a schematic plan view for illustrating the configuration of the cooling portion flow path 6 and the vicinity thereof as seen from a front surface of the water cooling plate 2 provided with the LD modules. The LD modules are not shown in FIG. 20.

Figure 21:
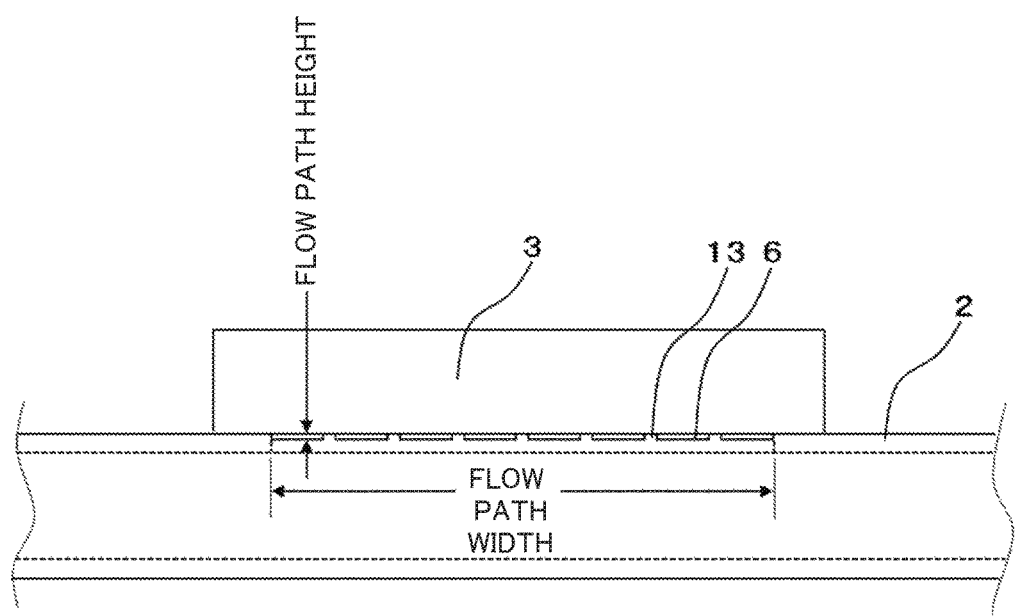
FIG. 21 is a schematic cross-sectional view for illustrating the cooling portion flow path and the vicinity thereof in the LD module cooling device according to the fourth embodiment of the present invention.
Figure 22:
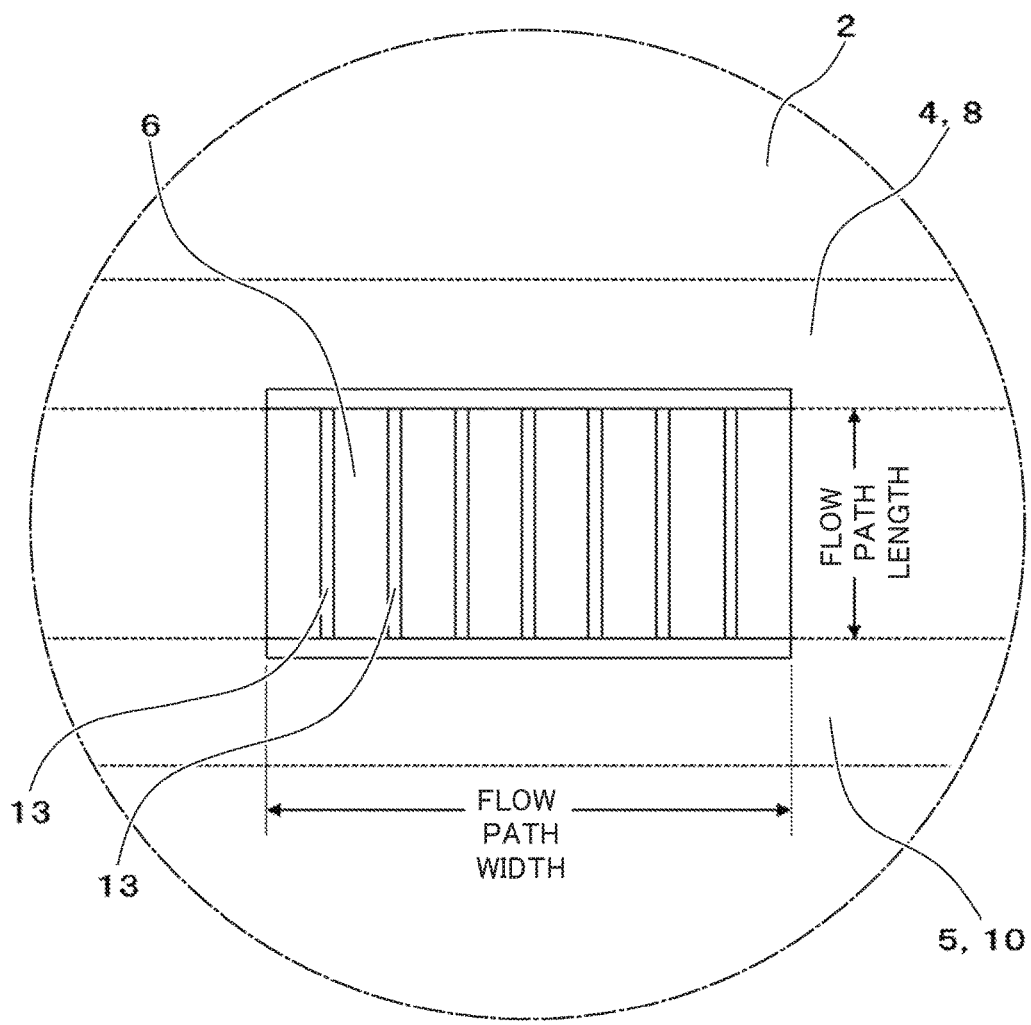
FIG. 22 is a schematic plan view for illustrating the cooling portion flow path and the vicinity thereof in the LD module cooling device according to the fourth embodiment of the present invention.

FIGS. 21 and 22 schematically illustrate an example in which the cooling portion flow path 6 in the LD module cooling device 1 according to the second embodiment of the present invention has been provided with the ridges 13. FIG. 21 is a schematic diagram for illustrating the configuration of the cooling portion flow path 6 and the vicinity thereof in a section perpendicular to the direction of flow of the cooling water flowing through the cooling portion flow path 6. FIG. 22 is a schematic plan view for illustrating the configuration of the cooling portion flow path 6 and the vicinity thereof as seen from the front surface of the water cooling plate 2 provided with the LD modules. The LD modules are not shown in FIG. 22.

As illustrated in FIGS. 19 and 21, the ridges 13 protrude toward the LD module 3 in a flow path height direction from the bottom surface of the cooling portion flow path 6 and are formed by protrusions extending in the flow path length direction. These ridges 13 divide the cooling portion flow path 6 along the flow path width direction. The protruding height of the ridge 13 is the same as the flow path height of the cooling portion flow path 6.

As described above, the cooling portion flow path 6 is a thin layer flow path that has an extremely small flow path height. Therefore, even a slight change causes a large rate of change in the flow path sectional area. When the flow path sectional area varies, the flow rate of the cooling water that flows through the cooling portion flow path 6 fluctuates greatly from the original flow rate, and this may cause cooling characteristics to deteriorate. However, providing the ridges 13 in the cooling portion flow path 6 as described above reduces the risk of the cooling portion flow path 6 being crushed. In addition, because the flow speed increases even at the same flow path height, this configuration also achieves an effect of improving the cooling characteristics. The ridges 13 do not hinder flow of the cooling water because the ridges 13 extend in the flow path length direction of the cooling portion flow path 6.

In FIGS. 19 and 20, 9 ridges 13 are illustrated, and in FIGS. 21 and 22, 7 ridges 13 are illustrated. However, the number of ridges 13 provided in one cooling portion flow path 6 is not limited in any way, and it is satisfactory that at least one ridge 13 is provided in the cooling portion flow path 6. The ridges 13 illustrated in FIGS. 19 to 22 are formed so as to extend over the entire flow path length of the cooling portion flow path 6, but the ridges 13 may be at least partially present in the flow path length direction.

The width of the ridge 13 and the pitch of the ridge 13 to the flow path width illustrated in FIGS. 19 to 22 are examples. Needless to say, the width and pitch of the ridge 13 may be narrowed or widened. In addition, the ridge 13 is not limited to being formed integral with the water cooling plate 2. For example, the ridge 13 may be formed separately from the water cooling plate 2 and mounted in the cooling portion flow path 6.

In addition, the ridge 13 is not limited to the configuration of protruding from the bottom surface of the cooling portion flow path 6. The ridge illustrated in FIGS. 19 and 20 may protrude from the ceiling surface on the LD module 3 side of the cooling portion flow path 6 toward the bottom surface. The ridge 13 illustrated in FIGS. 21 and 22 may protrude from the bottom surface of the LD module 3 toward the bottom surface of the cooling portion flow path 6.

Fifth Embodiment of LD Module Cooling Device

Figure 23:
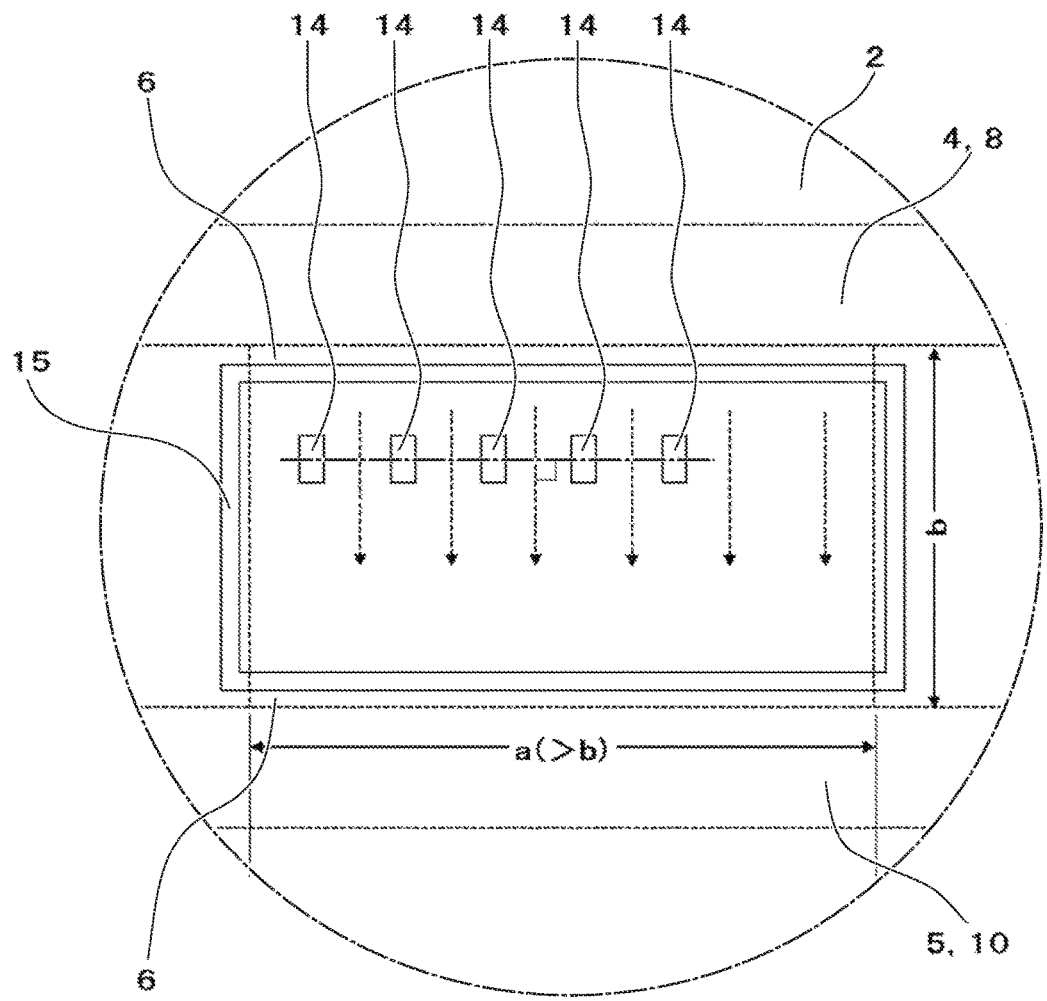
FIG. 23 is a plan view for schematically illustrating a partial structure of an LD module cooling device according to a fifth embodiment of the present invention.

FIG. 23 is a plan view for schematically illustrating a structure of a part of an LD module cooling device according to a fifth embodiment of the present invention. An LD module in the LD module cooling device according to the fifth embodiment includes a plurality of LD chips 14 arranged in one row. In FIG. 23, a cover of a package 15 of the LD modules is not shown so that the LD chip 14 in the LD module can be seen. A tab, for example, of the package 15 used for fixing the LD modules to the water cooling plate 2 is also not shown.

A direction of flow (indicated by the dashed arrow in FIG. 23) of the cooling water that flows through the cooling portion flow path 6 corresponding to the LD module intersects with a direction of the row of LD chips 14 as seen from the front surface of the water cooling plate 2. Therefore, even between the plurality of LD chips 14 in the package 15 of LD modules, differences in the cooling water on the upstream side and downstream side can be reduced and each LD chip 14 can be cooled evenly. In order to obtain this effect more noticeably, as illustrated in FIG. 23, the direction of flow of the cooling water in the cooling portion flow path 6 and the direction of the row of LD chips 14 preferably orthogonal as seen from the front surface of the water cooling plate 2.

In a similar manner, in order to achieve the above-described effect in a more noticeable manner, as illustrated in FIG. 23, the package 15 of LD modules may be arranged on the water cooling plate 2 such that the row of LD chips 14 the package 15 of LD modules is positioned at a position offset to the upstream side (side of the branched common supply flow path 8) in the cooling portion flow path 6.

Separate from the arrangement of the LD chips 14 in the package 15, the flow path width ("a" in FIG. 23) of the cooling portion flow path 6 may be greater than the flow path length ("b" in FIG. 23) of the cooling portion flow path 6. This is due to the following reason. The heat transfer coefficient (W/(m$^{2\circ}$ C.) with the cooling water is proportional to approximately ½ power of [flow speed/flow path length]. Therefore, when the flow rate and the flow path height are the same, cooling capacity does not change even when the flow path width a and the flow path length b of the cooling portion flow path 6 satisfy either a>b or a<b. However, in the case of a>b and a<b, pressure loss due to pipe friction in the cooling portion flow path 6 is different. In other words, the flow path height of the cooling portion flow path 6 is considerably smaller than the flow path length and the flow path width, and hence the hydraulic radius of the cooling portion flow path 6 becomes flow path height/2 in either case. Therefore, pressure loss caused by pipe friction in the cooling portion flow path 6 is only proportional to (flow speed)$^2$×flow path length, and pressure loss in the latter case increases to (b/a)$^3$ of the pressure loss in the former case. Therefore, when the cooling portion flow path 6 is configured such that similar pressure loss occurs at the same flow rate, configuring the cooling portion flow path 6 such that the flow path width becomes wider than the flow path length results in good cooling characteristics.

Sixth Embodiment of LD Module Cooling Device

Figure 24:
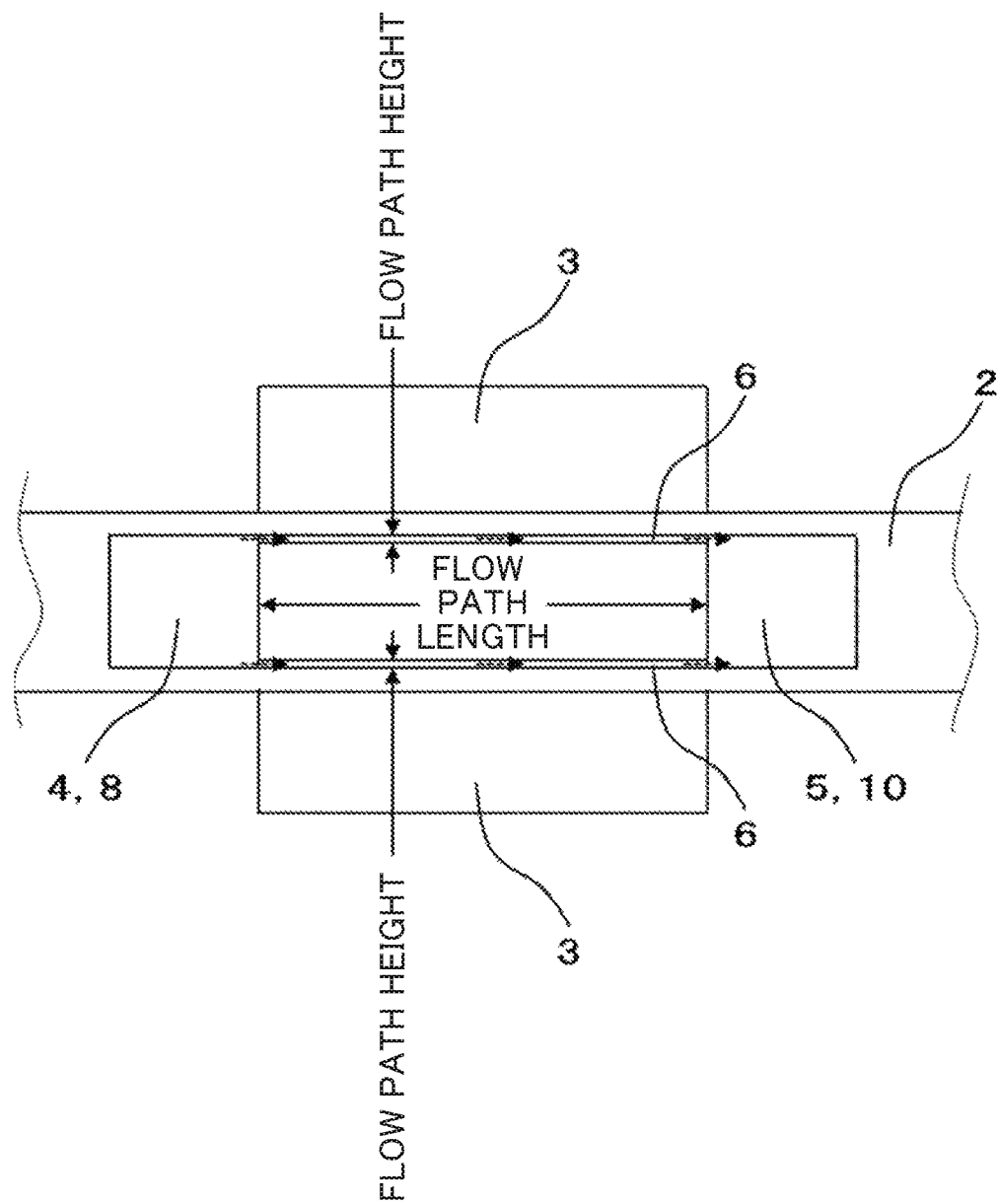
FIG. 24 is a cross-sectional view for schematically illustrating a cooling portion flow path and the vicinity thereof in an LD module cooling device according to a sixth embodiment of the present invention.

FIG. 24 is a cross-sectional view for illustrating the structure of the cooling portion flow path 6 and the vicinity thereof in an LD module cooling device according to a sixth embodiment of the present invention. In this LD module cooling device according to the sixth embodiment, at least one LD module 3 is arranged on both the rear surface (surface on a lower side in FIG. 24) and the front surface of the water cooling plate 2. The cooling portion flow path 6 for cooling the LD module 3 arranged on the rear surface of the water cooling plate 2 is provided at a position offset to the rear surface of the water cooling plate 2. The cooling portion flow path 6 on the front surface of the water cooling plate 2 and the cooling portion flow path 6 on the rear surface of the water cooling plate 2 communicate with the same branched common supply flow path 8 and branched common drainage flow path 10. By arranging LD modules 3 on both the front and rear surfaces of the water cooling plate 2 in this way, the water cooling plate 2 can be made smaller and lighter, and manufactured at a lower cost.

The flow path heights of the cooling portion flow path 6 on the front surface of the water cooling plate 2 and the cooling portion flow path 6 on the rear surface of the water cooling plate 2 are preferably substantially the same such that cooling water having the same flow rate can flow there through.

Specific configurations of the LD module 3 and the cooling portion flow path 6 on the rear surface of the water cooling plate 2 may be the same as the configurations of the LD module 3 and the cooling portion flow path 6 on the front surface of the water cooling plate 2 according to the above-described first, second, fourth, and fifth embodiments.

Seventh Embodiment of LD Module Cooling Device

Figure 25:
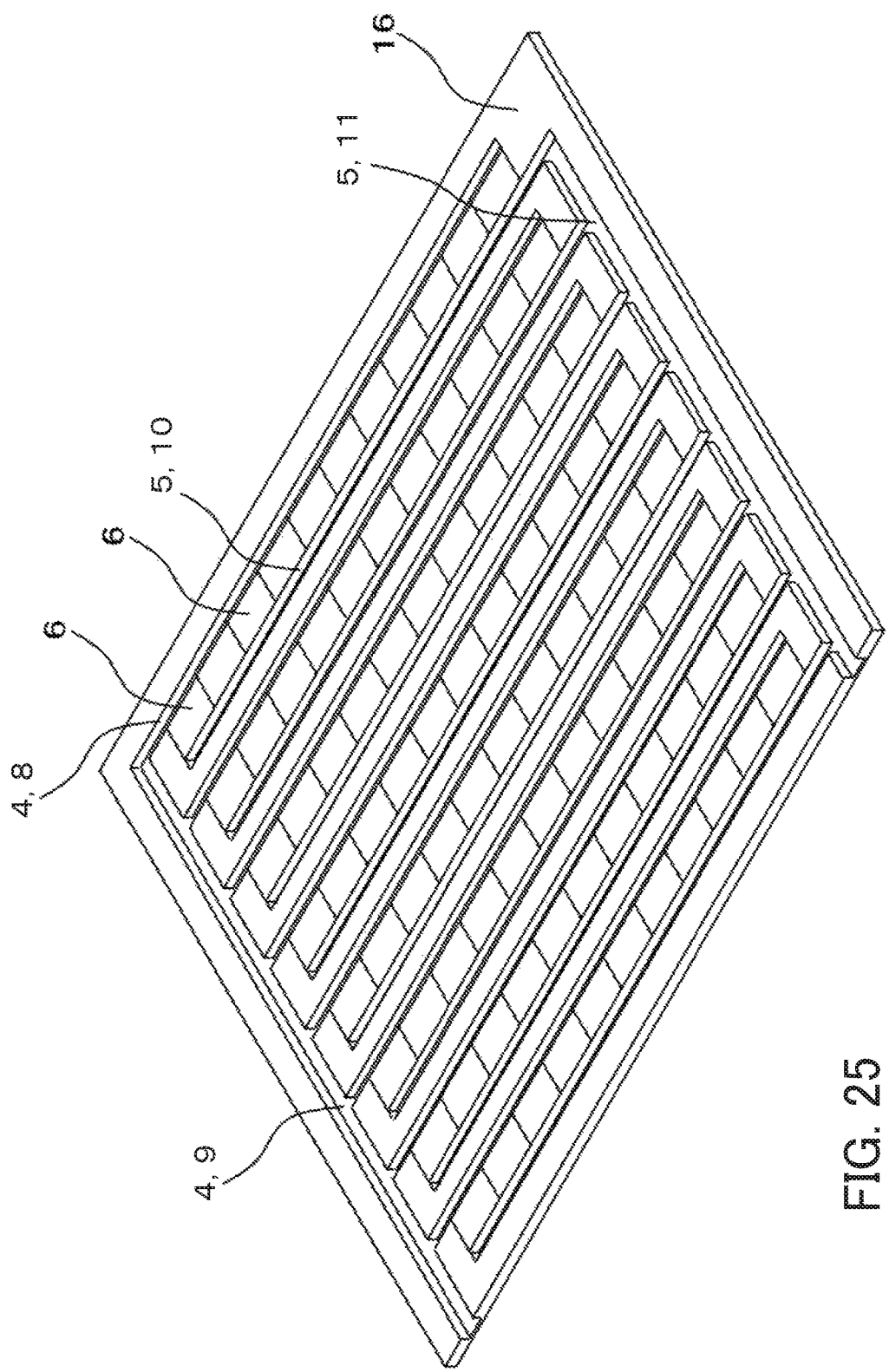
FIG. 25 is a schematic perspective view for illustrating a substrate of a water cooling plate (cooling plate) in an LD module cooling device according to a seventh embodiment of the present invention.
Figure 26:
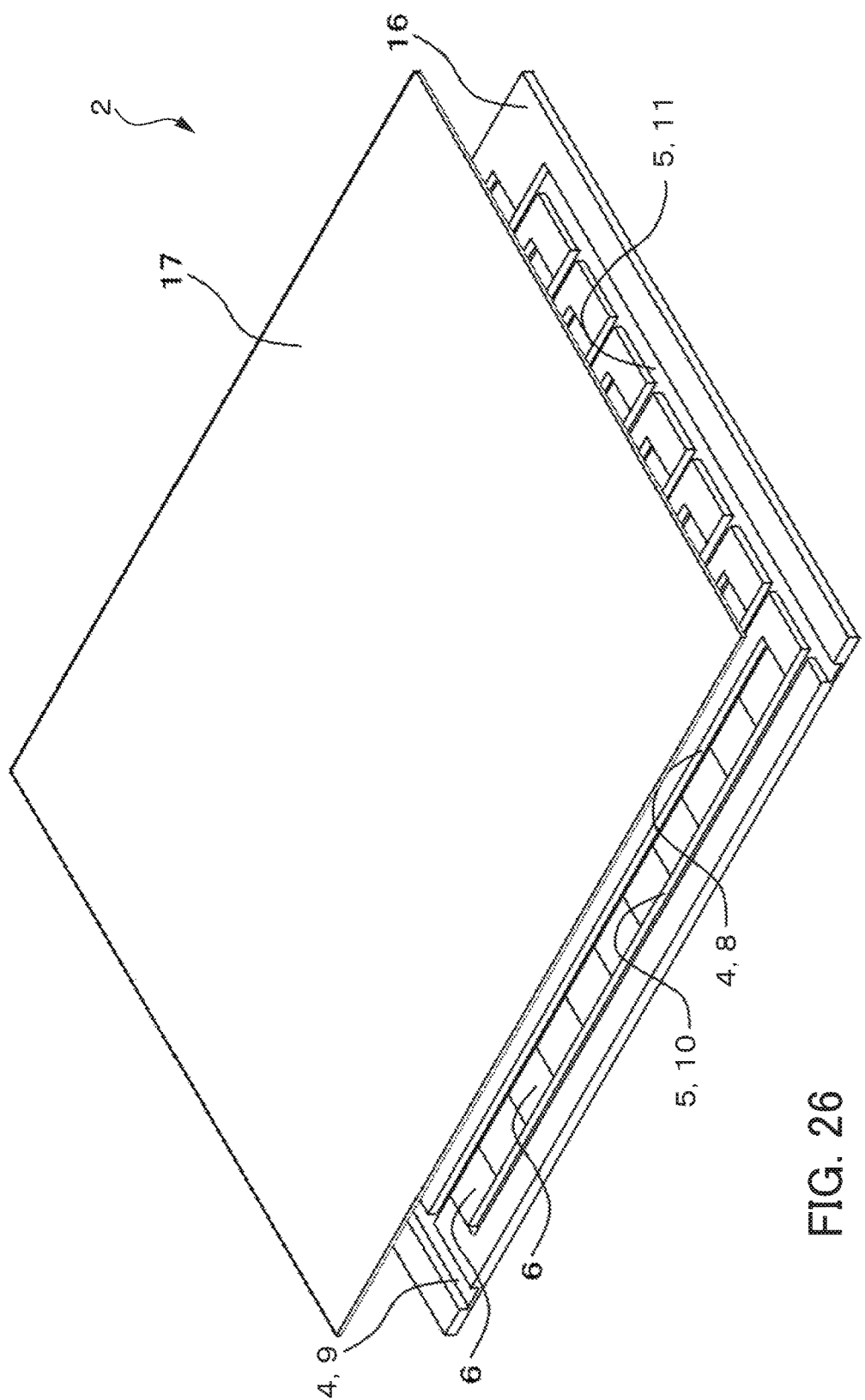
FIG. 26 is a schematic perspective view for illustrating a structure of the water cooling plate (cooling plate) made of a substrate and a metal plate in the LD module cooling device according to the seventh embodiment of the present invention.
Figure 27:
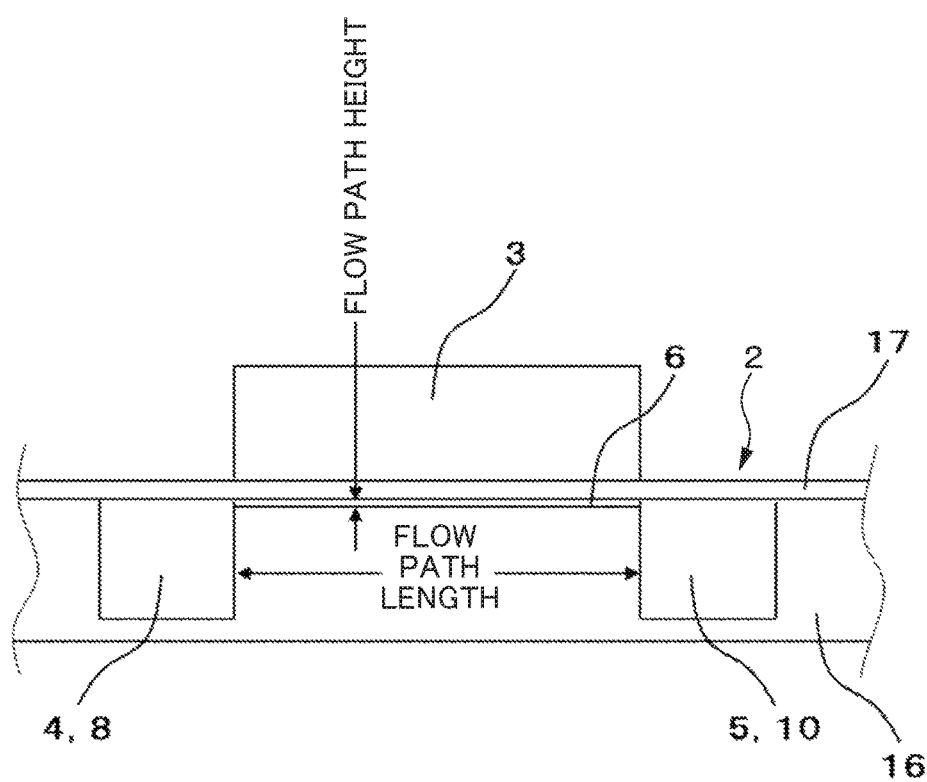
FIG. 27 is a schematic cross-sectional view for illustrating a structure of the cooling portion flow path and the vicinity thereof in the LD module cooling device according to the seventh embodiment of the present invention.
Figure 28:
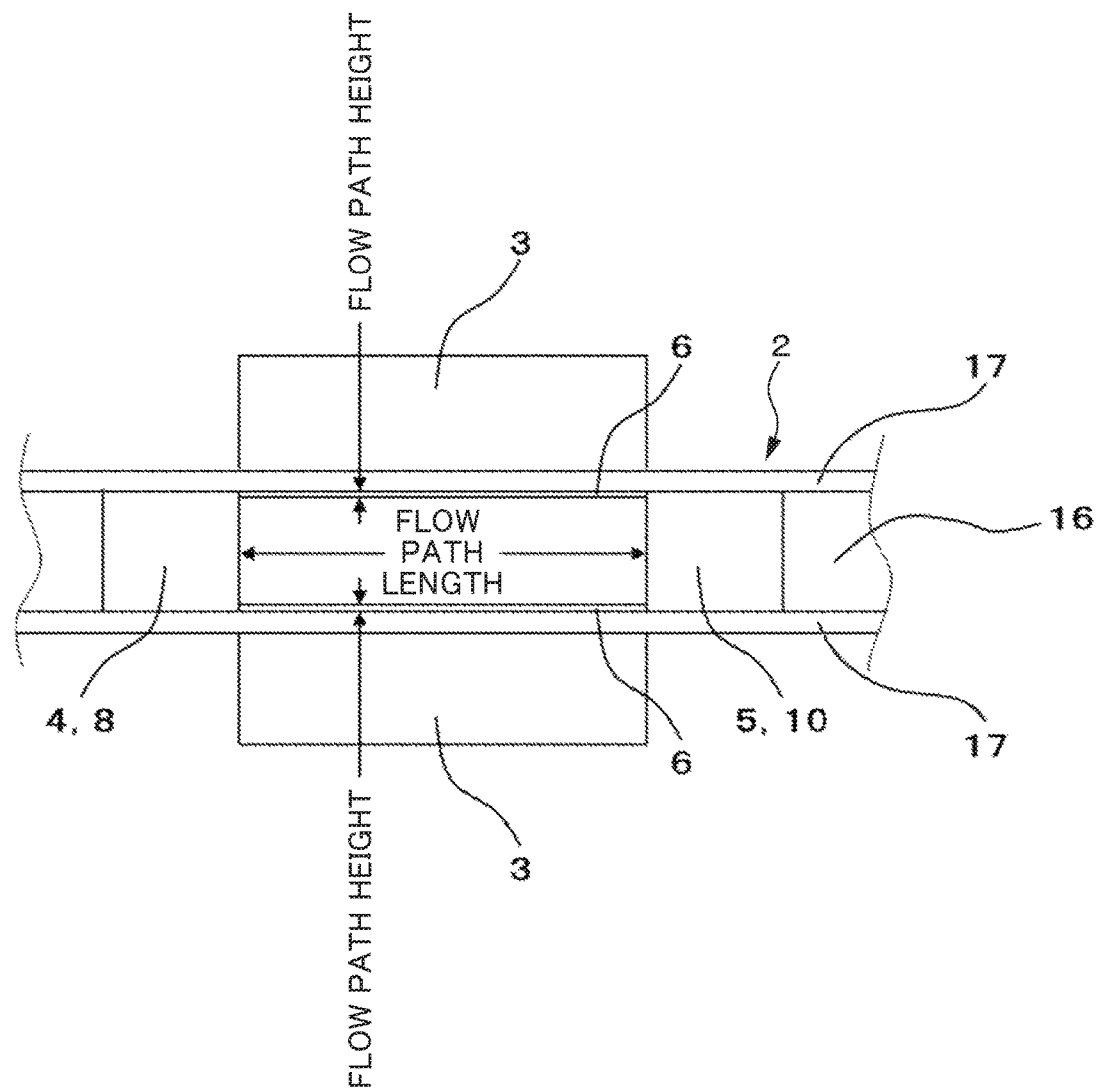
FIG. 28 is a schematic cross-sectional view for illustrating another structure of the cooling portion flow path and the vicinity thereof in the LD module cooling device according to the seventh embodiment of the present invention.

FIGS. 25 and 26 are schematic perspective views for illustrating a structure of a water cooling plate in an LD module cooling device according to a seventh embodiment of the present invention. FIGS. 27 and 28 are schematic cross-sectional views for illustrating a structure of a cooling portion flow path and the vicinity thereof in the LD module cooling device according to the seventh embodiment of the present invention. An example of a structure and a manufacturing method of the water cooling plate is described with reference to FIGS. 25 to 28. The water cooling plate 2 in the LD module cooling device according to the seventh embodiment is formed of a substrate 16 and at least one metal plate 17. In FIG. 26, the metal plate 17 is added to the illustration in FIG. 25.

The substrate 16 is thicker than the metal plate 17. At least one surface of the substrate 16 is formed with a groove-shaped recess that forms the main common supply flow path 9 and the branched common supply flow path 8 of the common supply flow path 4, and a groove-shaped recess that forms the main common drainage flow path 11 and the branched common drainage flow path 10 of the common drainage flow path 5.

The water cooling plate 2 is formed by joining the metal plate 17 to the at least one surface of the substrate 16 on which the recesses are formed. Therefore, after the substrate 16 and the metal plate 17 have been joined together, a gap remains at the portion that forms the main common supply flow path 9 and the branched common supply flow path 8, and the portion that forms the main common drainage flow path 11 and the branched common drainage flow path 10 between the substrate 16 and the metal plate 17. This gap becomes the main common supply flow path 9, the branched common supply flow path 8, the main common drainage flow path 11, and the branched common drainage flow path 10. Among these components, FIG. 27 shows the branched common supply flow path 8 and the branched common drainage flow path 10.

Apart from the common flow path, recesses forming the cooling portion flow paths 6 are formed on the substrate 16 illustrated in FIG. 25. A flat plane sandwiched between the cooling portion flow paths 6 is part of a main front surface of the substrate 16 to which the metal plate 17 is joined. The portion of the cooling portion flow path 6 is recessed by the flow path height of the cooling portion flow path 6 from the main front surface to which the metal plate 17 is joined. Therefore, after the substrate 16 and the metal plate 17 have been joined together, a gap also remains at portions of the cooling portion flow paths 6 between the substrate 16 and the metal plate 17. This gap forms the cooling portion flow path 6 illustrated in FIG. 27. With this configuration, the common flow path and the cooling portion flow path 6 in the water cooling plate 2 can be easily formed. Therefore, manufacturing costs of the water cooling plate 2 and the LD module cooling device 1 can be reduced. The ridge 13 (see FIGS. 19 to 22) may be formed at the portion of the cooling portion flow paths 6 recessed by the flow path height of the cooling portion flow path 6 from the main front surface of to which the metal plate 17 is joined.

The metal plate 17 is preferably as thin as possible while still being able to guarantee mechanical strength because this can reduce thermal resistance between the cooling water and the LD module 3. More specifically, the thickness of the metal plate 17 is preferably from approximately 1 mm to 2 mm. However, the thickness of the metal plate 17 is not limited in any way within this range.

The material of the metal plate 17 is preferably copper or a copper alloy. Copper is a favorable material for the metal plate 17 because copper has high thermal conductivity. Copper is a relatively easy metal to join to other components, and so manufacturing costs of the water cooling plate 2 can also be reduced.

The material of the substrate 16 is not particularly limited. The material of the substrate 16 can also be copper or a copper alloy and may be a stainless steel that can be joined with copper. By forming the substrate 16 of stainless steel, mechanical strength of the water cooling plate 2 can be increased, or the water cooling plate 2 can be made lighter. In addition, the material of the substrate 16 does not need to be a metal as long as the material can be joined to the metal plate 17. Therefore, the material of the substrate 16 may be an insulating material such as a resin.

As a method of joining the substrate 16 and the metal plate 17, there may be employed a method of forming, in advance, thin sheets of soldering or a brazing material on at least one joining surface, and then applying heat to melt and weld those thin sheets, or a method of joining the substrate 16 and the metal plate 17 by diffusion bonding without employing such an inclusion.

The flow path structure of the water cooling plate 2 according to the sixth embodiment illustrated in FIG. 24 can also be easily achieved by adopting the structure of Joining the metal plates 17 to both surfaces of the substrate 16 as illustrated in FIG. 28.

In the seventh embodiment, because the metal plate 17 interposes between the cooling portion flow path 6 and the LD module 3, as in the second embodiment of the present invention, application of the structure in which the cooling portion flow path 6 is formed by the cooperation between the water cooling plate 2 and the package of the LD modules 3, and the cooling water makes direct contact with the package of the LD modules 3 to the water cooling plate 2 is excluded.

Eighth Embodiment of LD Module Cooling Device

Figure 29:
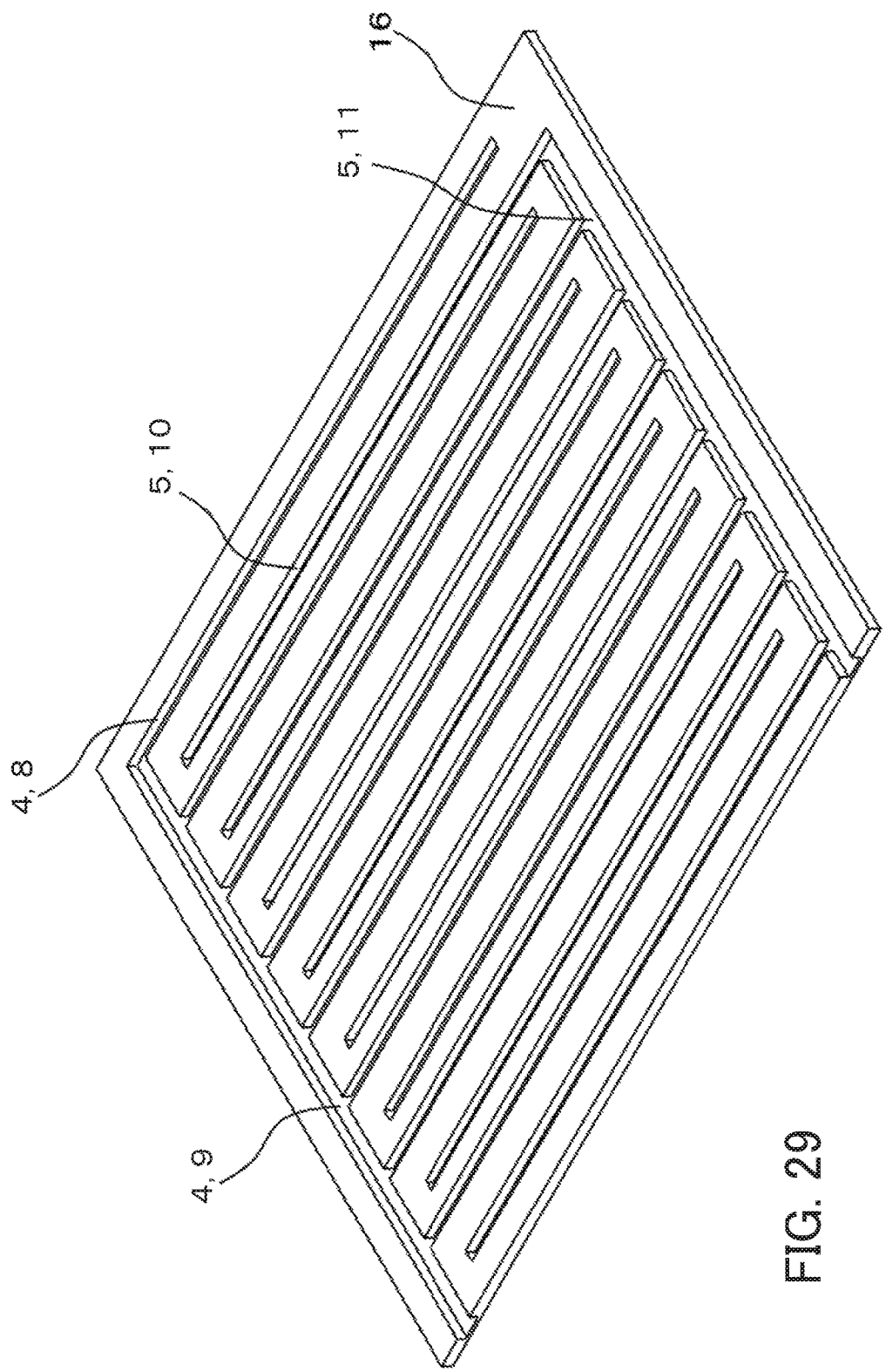
FIG. 29 is a schematic perspective view for illustrating a structure of a substrate of a water cooling plate (cooling plate) in an LD module cooling device according to an eighth embodiment of the present invention.
Figure 30:
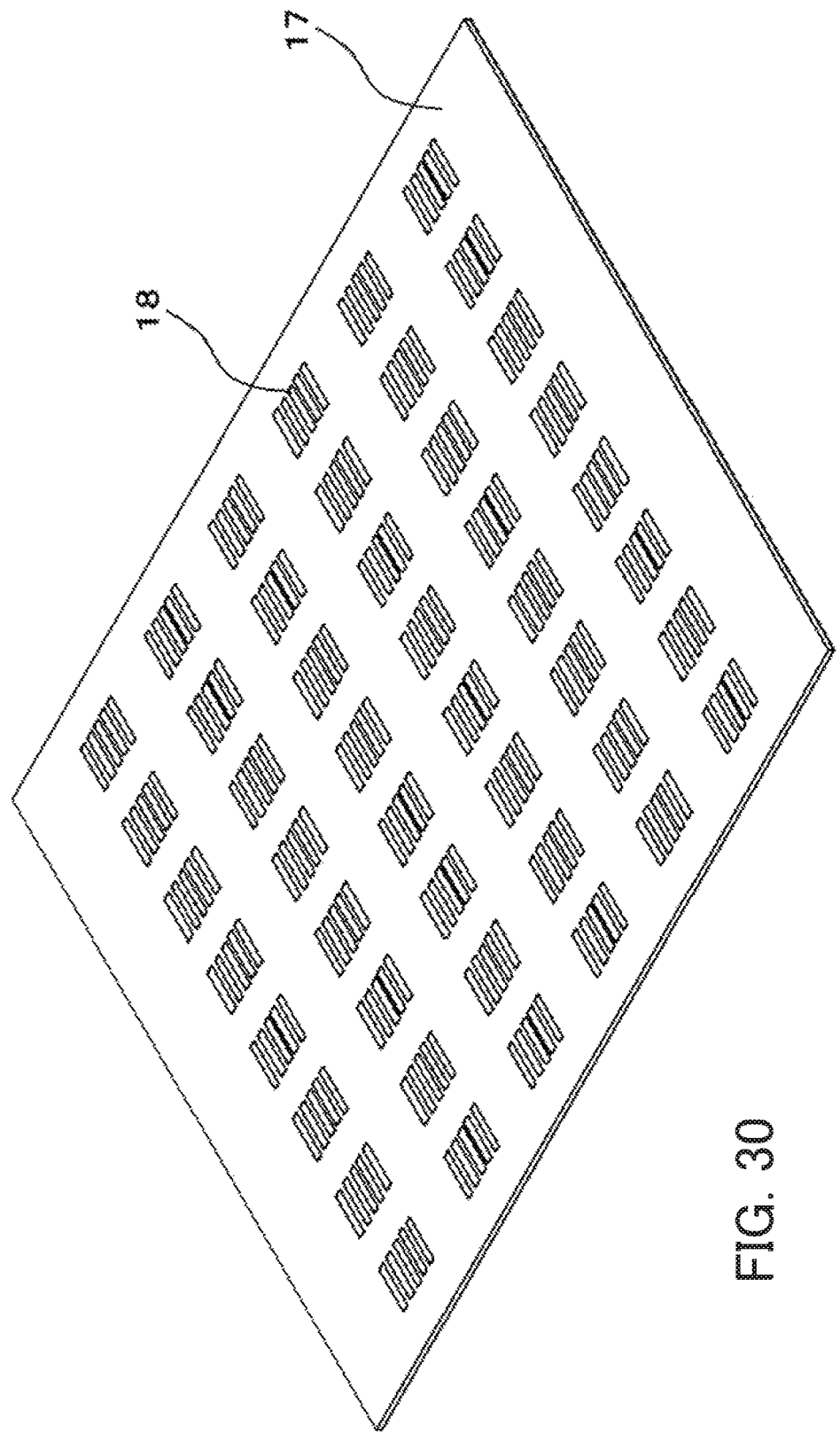
FIG. 30 is a schematic perspective view for illustrating a structure f a metal plate of the water cooling plate (cooling plate) in the LD module cooling device according to the eighth embodiment of the present invention.
Figure 31:
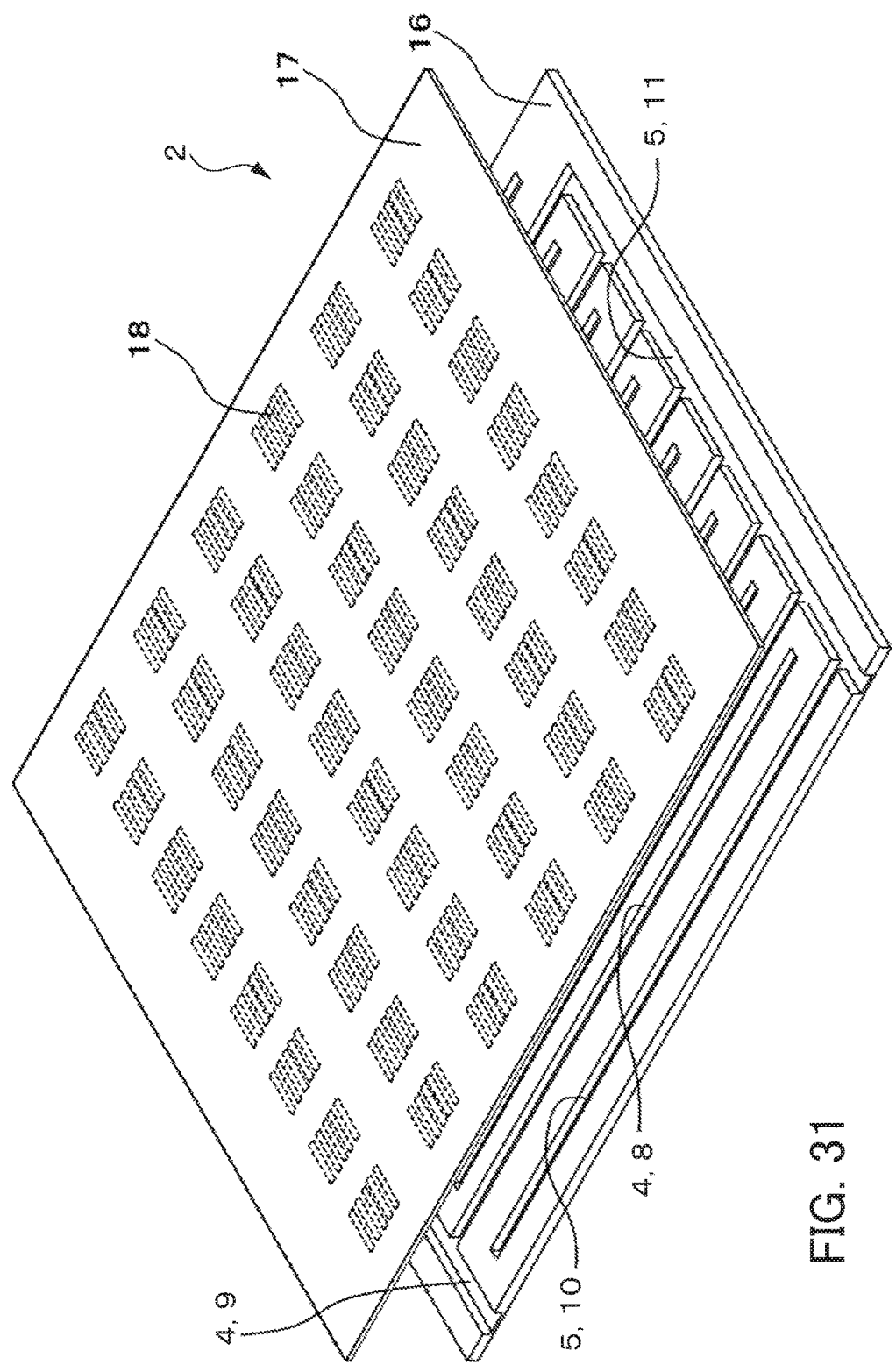
FIG. 31 is a schematic perspective view for illustrating a structure of the water cooling plate (cooling plate) made from a substrate and a metal plate in the LD module cooling device according to the eight embodiment the present invention.
Figure 32:
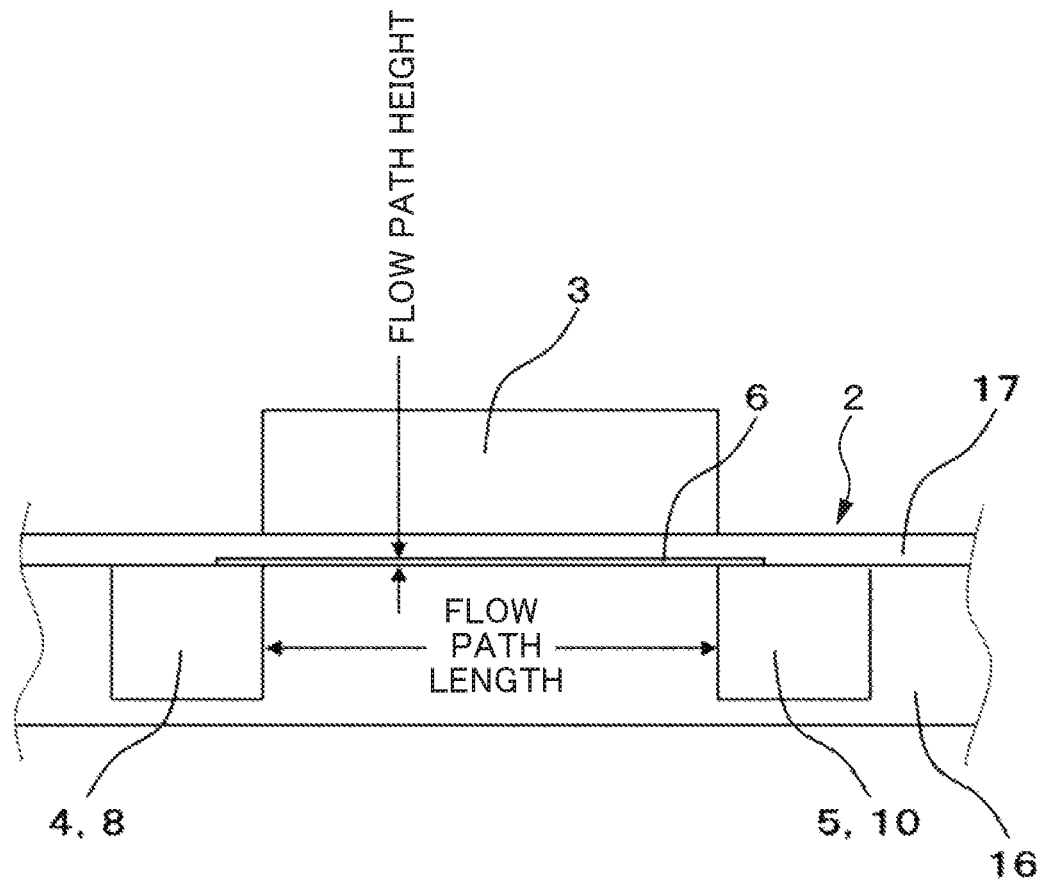
FIG. 32 is a schematic cross-sectional view for illustrating a structure of a cooling portion flow path and the vicinity thereof in the LD module cooling device according to the eighth embodiment of the present invention.

FIGS. 29 to 31 are schematic perspective views for illustrating a structure of a water cooling plate in an LD module cooling device according to an eighth embodiment of the present invention. FIG. 32 is a schematic cross-sectional diagram for illustrating a structure of a cooling portion flow path and the vicinity thereof in the LD module cooling device according to the eighth embodiment of the present invention. Another example of the structure and manufacturing method of the water cooling plate is described with reference to FIGS. 29 to 32. The eighth embodiment is the same as the seventh embodiment of the present invention except that the groove formed in the front surface of the metal plate 17 on the substrate 16 side forms the cooling portion flow path 6. In other words, the substrate 16 illustrated in FIG. 29 has no recess that forms the cooling portion flow path 6 illustrated in FIG. 25, and only the main common supply flow path 9, the branched common supply flow path 8, the main common drainage flow path 11 and the branched common drainage flow path 10 are formed as the groove-shaped recess.

As illustrated in FIG. 30, the metal plate 17 includes a plurality of grooves 18 on the surface to be joined to the substrate 16. The grooves 18 are formed at a position that corresponds to the portion that forms the cooling portion flow path when the metal plate 17 is joined to the substrate 16. A plurality of parallel grooves 18 are formed in a region of the metal plate 17 that corresponds to one cooling portion flow path. The depth of the groove 18 is equal to the flow path height of the cooling portion flow path. In FIG. 30, the width and pitch of the grooves 18 are exaggerated in order to facilitate understanding of the configuration of the groove 18. The width and pitch of the groove 18 are normally formed more finely.

As illustrated in FIG. 31, the substrate 16 illustrated in FIG. 29 and the metal plate 17 illustrated in FIG. 30 are joined together such that the front surface of the metal plate 17 that has the grooves 18 is joined toward the main front surface of the substrate 16. With this, as illustrated in FIG. 32, the grooves 18 on the front surface of the metal plate 17 function as the cooling portion flow path 6. At this time, spaces between the grooves 18 function as the ridges 13 (see FIGS. 19 to 22) that divide the cooling portion flow path 6 in the flow path width direction.

The grooves 18 on the front surface of the metal plate 17 that function as the cooling portion flow path 6, including shapes leaving portions of the ridges 13, can be easily molded by etching or the like. On the other hand, the substrate 16 can be manufactured by simply forming the common flow paths, which eliminates the need to form detailed machined portions that particularly require dimension accuracy. As a result, manufacturing costs of the water cooling plate 2 can be reduced and the LD module cooling device can be manufactured at low cost.

One recess that corresponds to the cooling portion flow path may be formed in the metal plate 17 in place of the groove 18. In this case, the ridges 13 are not formed in the cooling portion flow path 6, and a cooling portion flow path 6 formed of only one flow path is formed.

Ninth Embodiment of LD Module Cooling Device

Figure 33:
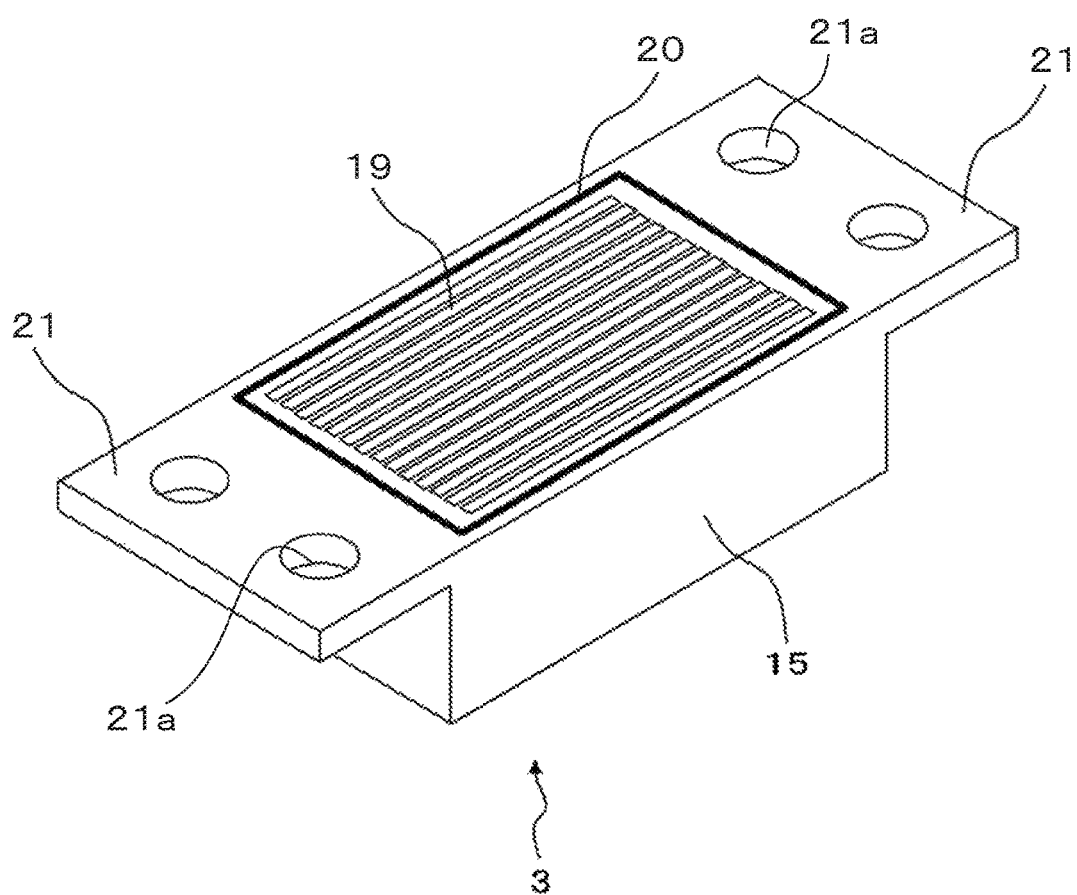
FIG. 33 is a schematic perspective view for illustrating a structure of an LD module used in an LD module cooling device according to a ninth embodiment of the present invention as viewed from a bottom side.
Figure 34:
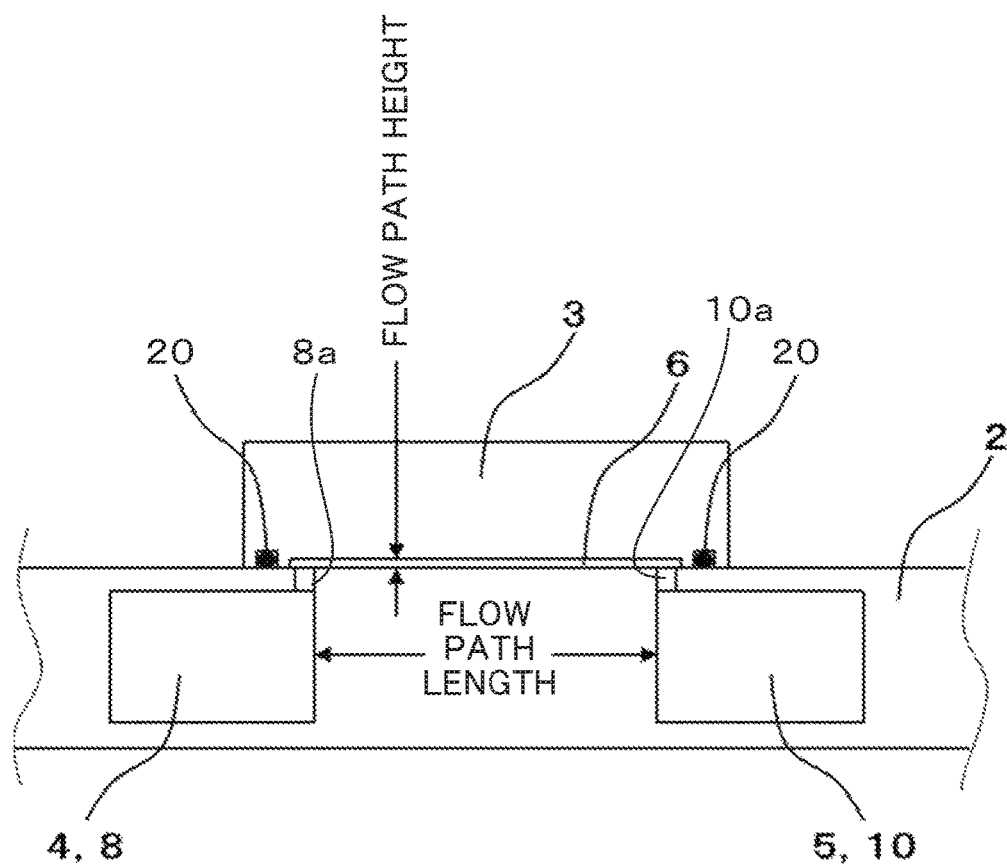
FIG. 34 is a schematic cross-sectional view for illustrating a structure of a cooling portion flow path and the vicinity thereof in the LD module cooling device according to the ninth embodiment of the present invention.

FIG. 33 is a schematic perspective view for illustrating the structure of the LD module 3 to be used in an LD module cooling device according to a ninth embodiment of the present invention, as viewed from the bottom surface. FIG. 34 is a schematic cross-sectional view for illustrating the cooling portion flow path 6 and the vicinity thereof in the LD module cooling device according to the ninth embodiment of the present invention. Similar to the second embodiment, the cooling portion flow path 6 according to the ninth embodiment is formed through cooperation between the water cooling plate 2 and the package of LD modules 3. As illustrated in FIG. 33, grooves 19 that constitute at least a part of the cooling portion flow path 6 are formed on the bottom surface (surface that makes contact with the cooling water when the cooling portion flow path 6 is formed through cooperation with the water cooling plate 2) of the package of LD modules 3. As illustrated in FIG. 34, when this package 15 of LD modules 3 is joined to the front surface of the water cooling plate 2, the plurality of grooves 19 function as the cooling portion flow path 6 and the space between the grooves 19 functions as the ridge 13 (see FIGS. 19 to 22).

With this configuration, the groove 19 and the ridge 13 can be easily formed simultaneously by, for example, etching on the bottom surface of the package 15. In addition, ridges 13 can reduce the risk of the cooling portion flow path 6 being crushed, and the area of the inner wall of the cooling portion flow path 6 that makes contact with the cooling water increases, to thereby increase the cooling characteristics of the LD module cooling device.

One recess that corresponds to the cooling portion flow path 6 may be formed on the bottom surface of the package 15 of LD modules 3 in place of the grooves 19. In this case, the ridges 13 are not formed in the cooling portion flow path 6, and the cooling portion flow path 6 is formed of only one flow path.

In addition, because the cooling portion flow path 6 is formed in the bottom surface of the package 15 of LD modules 3, as illustrated in FIG. 34, the cooling portion flow path 6 and the branched common supply flow path 8 and branched common drainage flow path 10 communicate due to hole-shaped flow paths 8$a$ and 10$a$ formed across the branched common supply flow path 8 and branched common drainage flow path 10 from the front surface of the water cooling plate 2.

A sealing member such as a gasket for preventing water from leaking from the cooling portion flow path 6 formed through cooperation between the water cooling plate 2 and the package 15 of the LD modules 3 is represented by the symbol 20 in FIGS. 33 and 34. This sealing member 20 is formed on the bottom surface of the package 15 of LD modules 3, but may be formed on the front surface of the water cooling plate 2 so as to surround the cooling portion flow path 6.

A tab for fixing the package 15 of the LD modules 3 to the water cooling plate 2 is represented by the symbol 21 in FIG. 33. The tabs 21 are provided so as to protrude from either side of the package 15. Each tab 21 includes a hole 21$a$ for screw fixing.

Similar to the second embodiment of the present invention, the ninth embodiment also employs a flow path structure in which the bottom surface of the package 15 is cooled by directly making contact with the cooling water. Therefore, the water cooling plate 2 does not need to be made of a material that has high thermal conductivity. As a result, the water cooling plate 2 may be made of a material other than metal, such as a resin. When the water cooling plate 2 is made of a resin, the water cooling plate 2 can be made significantly lighter and manufactured at lower cost.

Tenth Embodiment of LD Module Cooling Device

Figure 35:
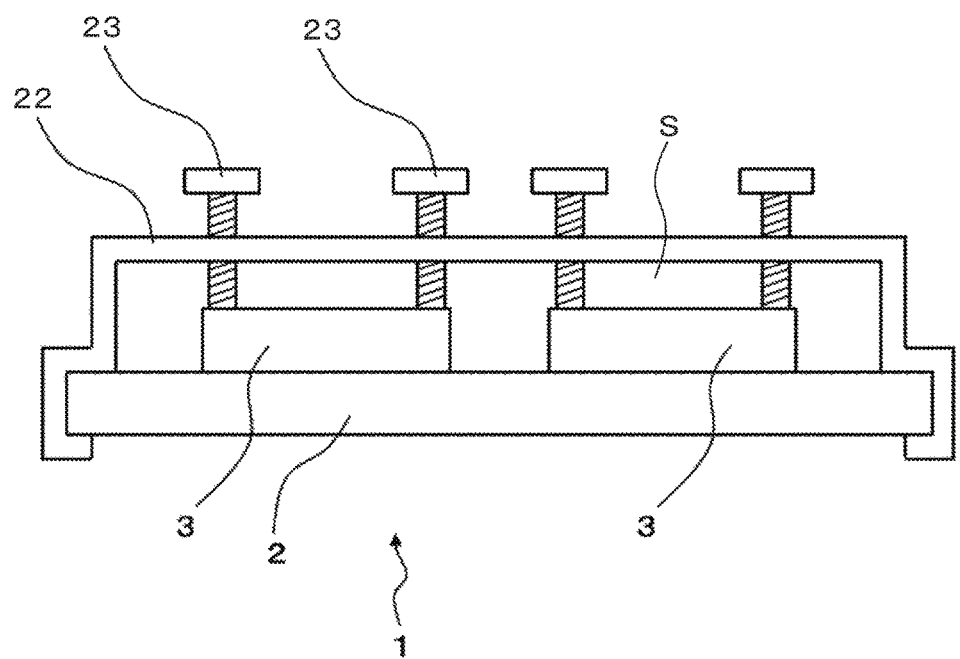
FIG. 35 is a schematic side view for illustrating an LD module cooling device according to a tenth embodiment of the present invention.
Figure 36:
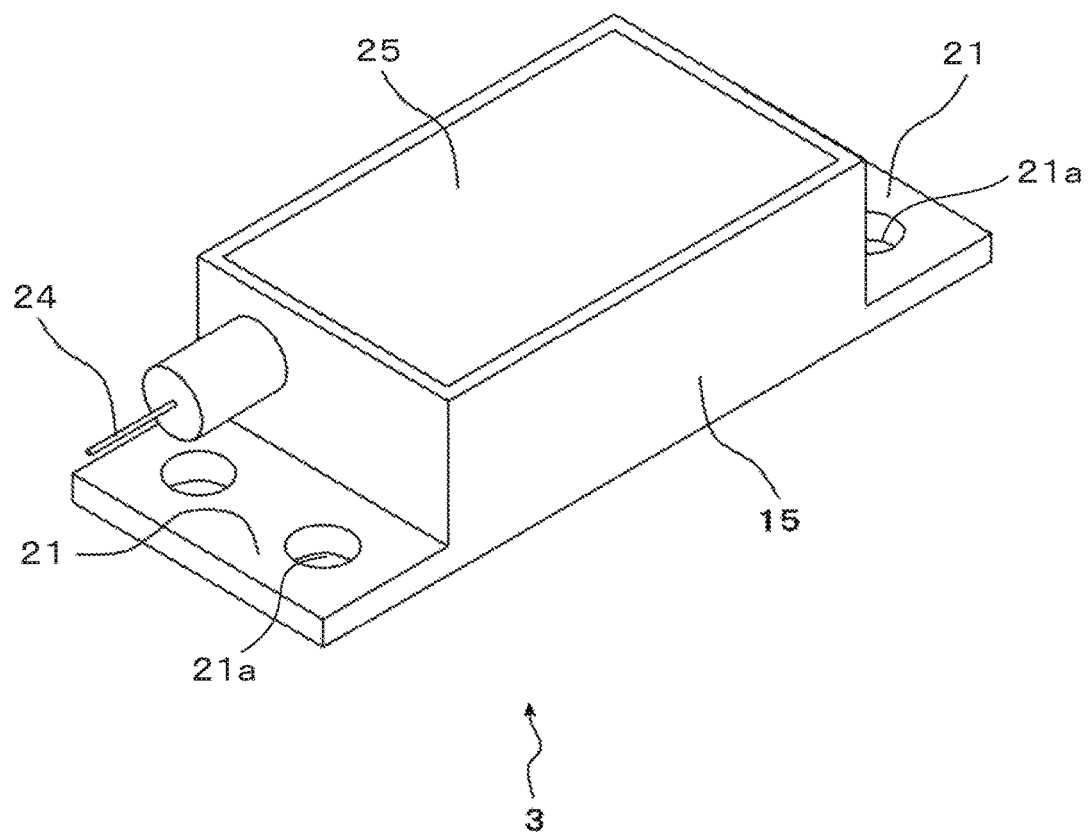
FIG. 36 is a schematic perspective view for illustrating an exemplary shape of the LD module.

FIG. 35 is a schematic view for illustrating the LD module cooling device according to a tenth embodiment of the present invention as viewed from the side. The LD module 3 is generally formed as illustrated in FIG. 36. In other words, the mounting tabs 21 are provided so as to protrude from each side of the package 15 of LD modules 3. The tabs 21 include the holes 21*a* for screw fixing. The package 15 of LD modules 3 is screw-fixed to the water cooling plate 2 using the holes 21*a* in the tabs 21. However, if the water cooling plate 2 is formed of the substrate 16 and the metal plate 17, water may leak from the screw holes when the screw holes are formed at a position close to the common flow path in the water cooling plate 2. In FIG. 36, an optical fiber for optical output is represented by the symbol 24, and a lid (cover) of the package 15 is represented by the symbol 25.

As a result, as illustrated in FIG. 35, the LD module cooling device 1 according to the tenth embodiment employs a structure of using the frame member 22 to fix the LD modules 3 to the water cooling plate 2. The frame member 22 covers at least a part of either the front surface or the rear surface of the water cooling plate 2 with a structure including a gap between the frame member 22 and the water cooling plate 2. The LD modules 3 are housed in this gap S. The frame member 22 is provided with a pressing member 23 formed of screws for pressing the LD module 3 against the water cooling plate 2. The pressing member 23 screws in the LD modules 3 in the gap S toward the water cooling plate 2, to thereby push and fix the LD modules 3 to the water cooling plate 2.

With this configuration, even if a screw hole is not provided near at least a center of the water cooling plate 2, the LD modules 3 can be fixed to the water cooling plate 2. Therefore, the risk of water leaking from the screw hole can be reduced.

Eleventh Embodiment of LD Module Cooling Device

Figure 37:
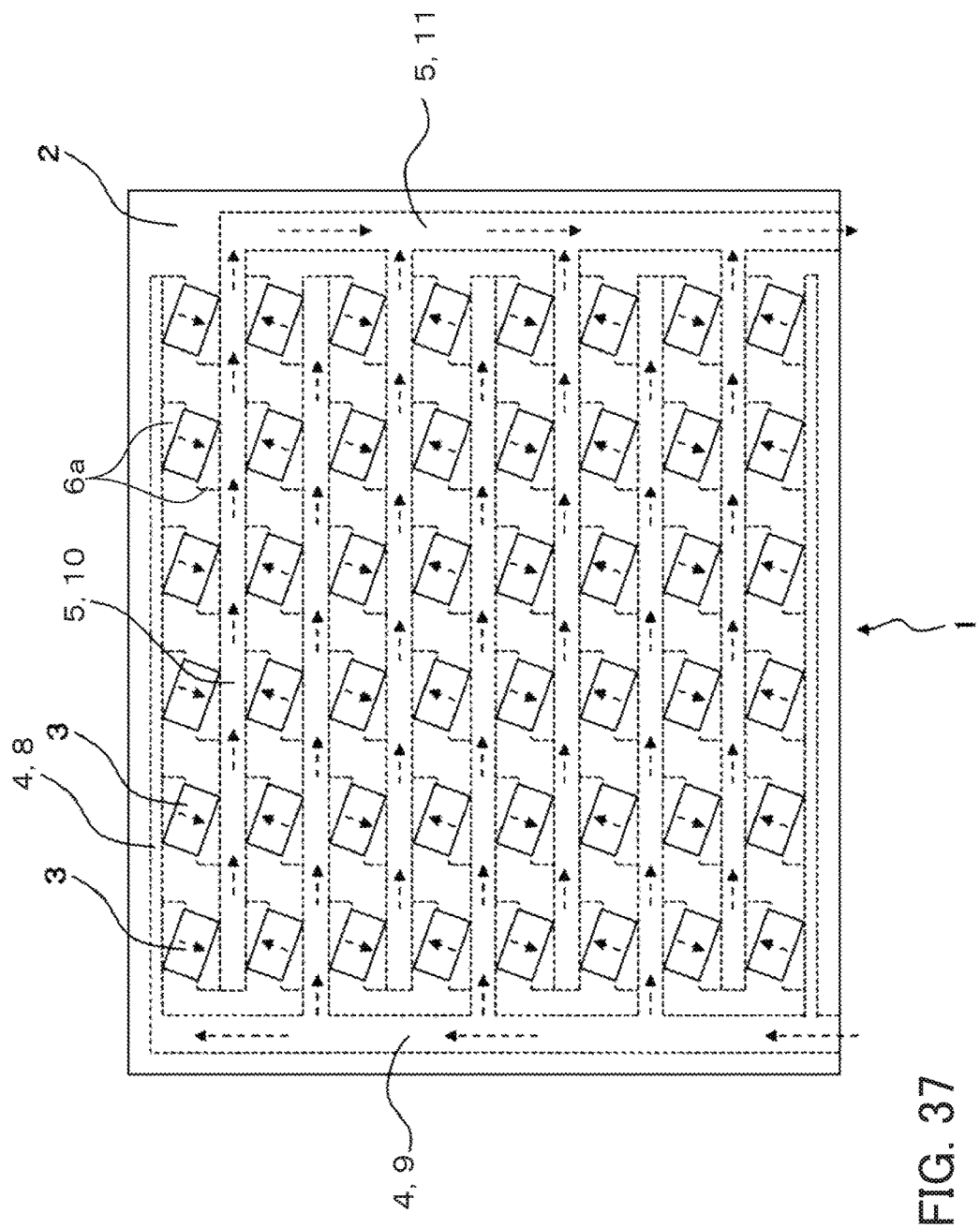
FIG. 37 is a schematic plan view for illustrating arrangement of the LD modules in an LD module cooling device according to an eleventh embodiment of the present invention.

FIG. 37 is a schematic plan view for illustrating arrangement of the LD modules 3 in the LD module cooling device 1 according to an eleventh embodiment of the present invention. In all of the embodiments described above, the LD module 3 face the same direction as the arrangement direction of the LD modules 3. In other words, each LD module 3 is arranged parallel to the arrangement direction. However, when the LD modules 3 output light due to the optical fiber 24 illustrated in FIG. 36, the LD modules 3 may be arranged so that their orientation is tilted from the arrangement direction of the LD modules 3. This is to avoid bending the optical fiber 24 at a sharp angle in order to prevent interference with adjacent LD modules 3. In this case, only the LD modules 3 may be tilted without changing the orientation of the cooling portion flow path 6. However, the area of the cooling portion flow path 6 may be made to match the main contact area of the LD module 3 to the water cooling plate 2 as closely as possible to obtain higher cooling characteristics. In order to achieve this, the LD module cooling device 1 may adopt the configuration illustrated in FIG. 37.

In the example illustrated in FIG. 37, each LD module 3 is arranged at an angle of approximately 20° in the same direction as the arrangement direction of the LD modules 3. The area of each cooling portion flow path (in FIG. 37, hidden from view underneath the LD modules 3) is the same as the main contact area (the outline of the LD module 3 in FIG. 37) of the LD modules 3 to the water cooling plate 2.

An area 6*a* that appears as a triangle shape above and below each. LD module 3 in FIG. 37 has a greater flow path height than the cooling portion flow path and has a smaller flow path height (flow path depth) than the common flow paths 8, 9, 10, and 11. This area 6*a* is formed shallower than the common flow paths 8, 9, 10, and 11, and is a flow path region with significantly smaller cooling water pressure loss than the cooling portion flow path. Therefore, in the cooling portion flow path, as represented by the arrow, the cooling water can pass through the area 6*a* to flow in an inclined direction toward the branched common drainage flow path 10 from the branched common supply flow path 8.

Figure 38:
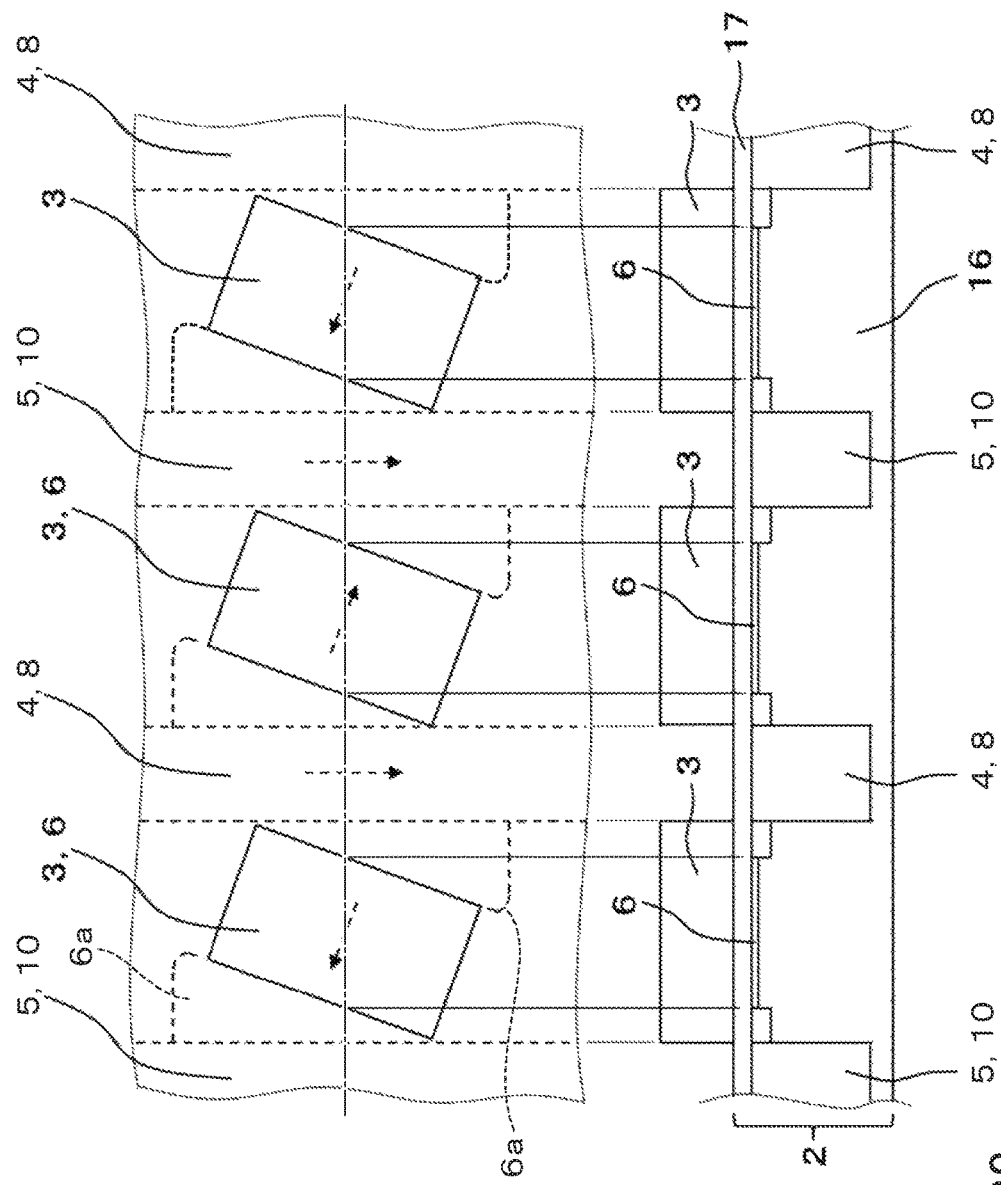
FIG. 38 is a schematic view for illustrating a part of the LD module cooling device illustrated in FIG. 37 and the cross section thereof.

FIG. 38 schematically illustrates a part of the LD module cooling device illustrated in FIG. 37 and the cross section thereof. In order to facilitate understanding, magnification is appropriately changed in the vertical direction and the horizontal direction in FIG. 38 also. In addition, in the example illustrated in FIG. 38, the cooling portion flow path 6 is formed on the substrate 16 side, but it goes without saying that the cooling portion flow path 6 may also be formed on the metal plate 17 side.

In FIG. 37, other than the branched common flow paths 8 and 10 on each side, one branched common supply flow path and one branched common drainage flow path 10 are shared as the branched common supply flow path and the branched common drainage flow path of two rows of LD modules 3. This is because both paths become too close to each other when the branched common supply flow path 8 and the branched common drainage flow path 10 are arranged as illustrated in FIGS. 2 and 15. Therefore, the direction of flow of the cooling water in the cooling portion flow path changes to the opposite direction in each row. In this case, when the row of LD chips in the LD module 3 is biased toward, for example, either the top or bottom in FIG. 37 in the LD module 3, the position of the LD chip changes to the upstream side and the downstream side when the direction of flow of the cooling water becomes the opposite direction. If this becomes a problem in that, for example, a difference occurs in cooling characteristics, the LD module cooling device 1 may employ the structure illustrated in FIG. 39.

Figure 39:
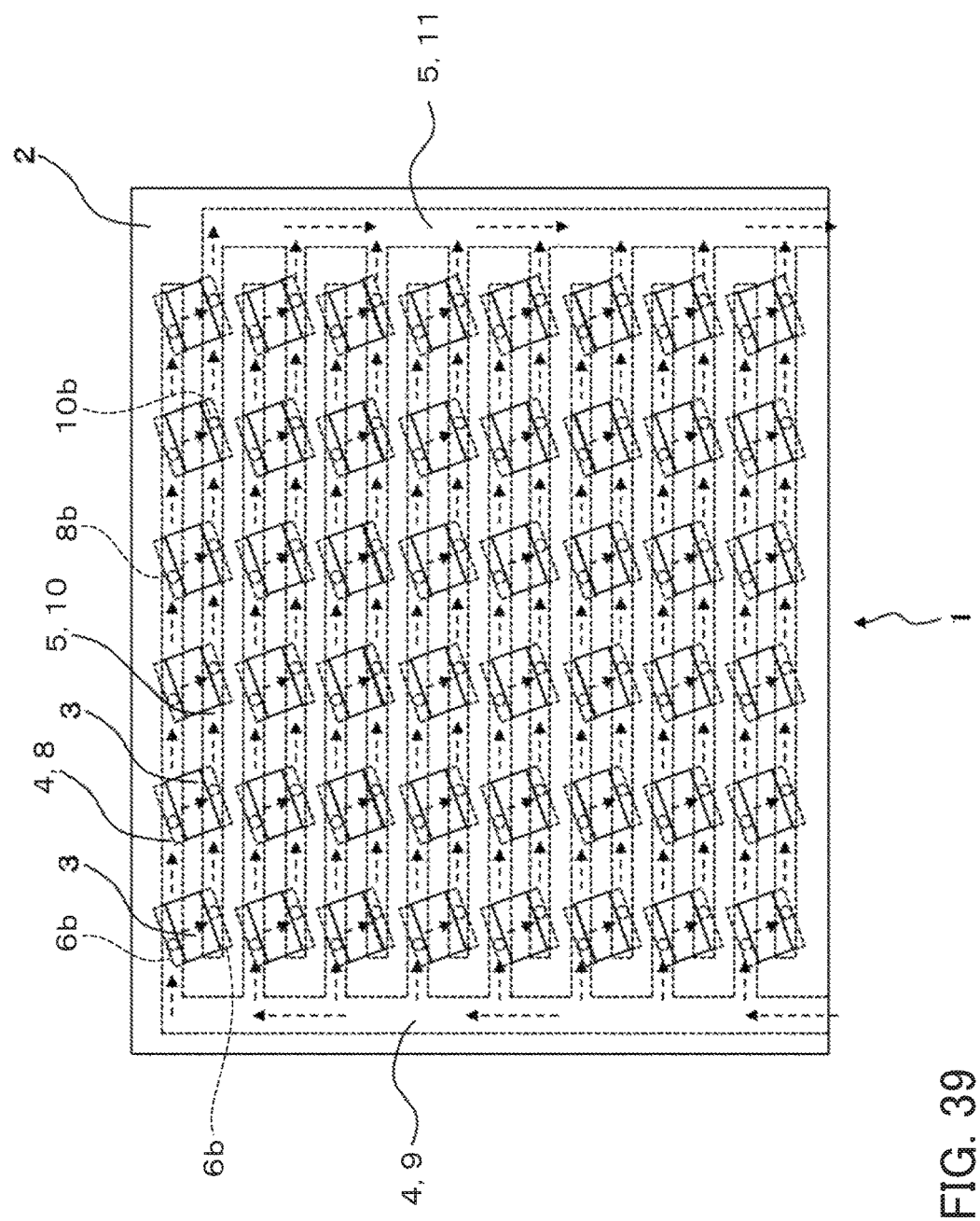
FIG. 39 is a plan view for schematically illustrating another structure of the LD module cooling device according to the eleventh embodiment of the present invention.

FIG. 39 is a plan view for schematically illustrating another structure of the LD module cooling device 1 according to the eleventh embodiment of the present invention. Also in the example illustrated in FIG. 39, each LD module 3 is arranged at an angle of approximately 20° relative to the arrangement direction of the LD modules 3. The area of each cooling portion flow path (in FIG. 39, hidden from view underneath the LD modules 3) is the same as the main contact area (the outline of the LD module 3 in FIG. 39) of the LD modules 3 to the water cooling plate 2. In FIG. 39, rectangular areas 6*b* on either end of the cooling portion flow path inclined at the same angle as the cooling portion flow path have a shorter height (depth) than the common flow paths 8, 9, 10, and 11, but are taller than the cooling portion flow path, and are flow path regions with significantly smaller cooling water pressure loss than the cooling portion flow path 6. Therefore, in the cooling portion flow path 6, the cooling water flows in the direction indicated by the arrow.

The common flow paths 8, 9, 10, and 11 are formed at positions close to a surface opposing a surface of the water cooling plate 2 on which the LD modules 3 are arranged. In FIG. 39, the round areas 8*b*, 10*b* arranged so as to sandwich each LD module 3 are hole shaped flow paths open in a direction perpendicular to the main front surface of the water cooling plate 2 in order to connect the inclined rectangular areas to the common flow paths 8, 9, 10, and 11.

Figure 40:
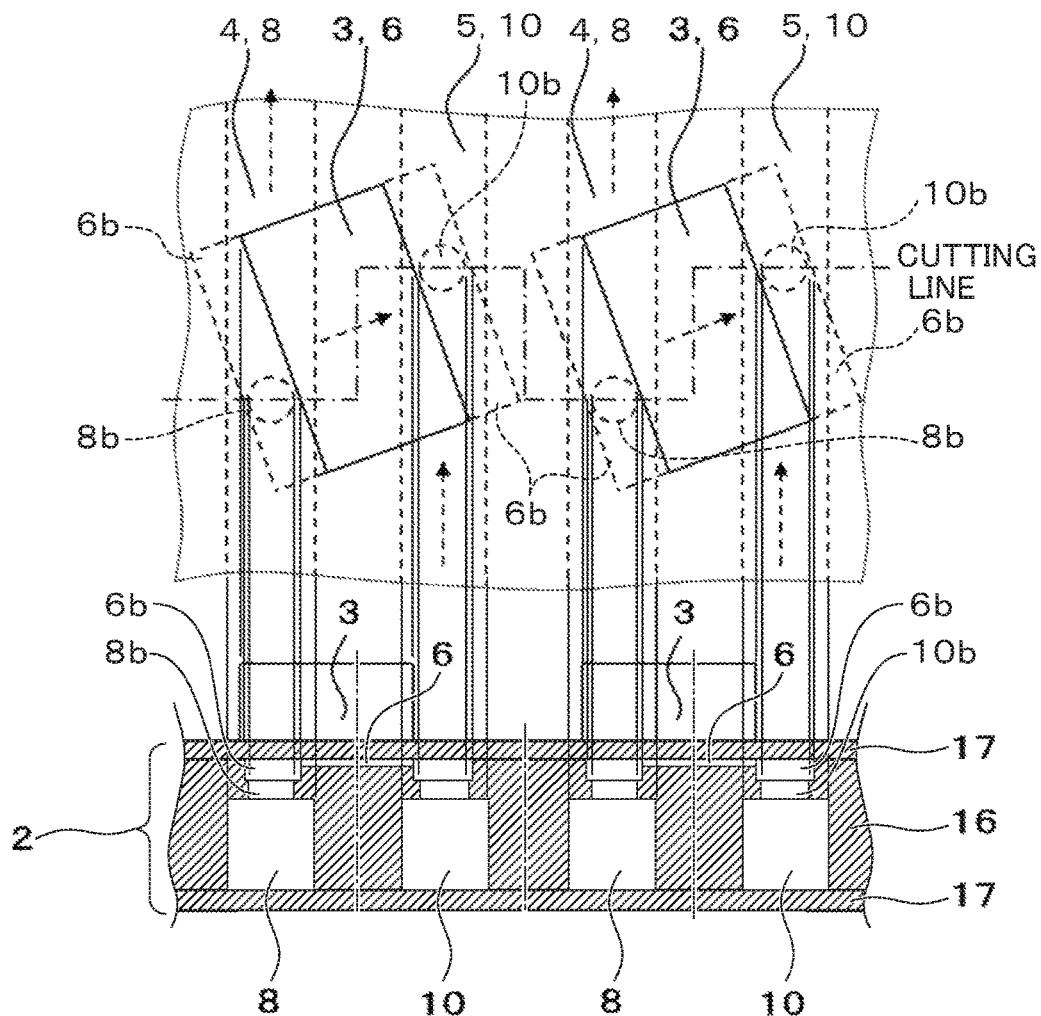
FIG. 40 is a schematic view for illustrating a part of the LD module cooling device illustrated in FIG. 39 and a cross section cut along a cutting line thereof.

FIG. 40 schematically illustrates a part of the LD module cooling device 1 illustrated in FIG. 39 and the cross section thereof. In order to facilitate understanding, magnification is also appropriately changed in the vertical direction and the horizontal direction in FIG. 40. Even the LD module cooling device 1 having the complicated flow path structure illustrated in FIG. 39 can be relatively easily manufactured by adopting the structure illustrated in FIG. 40 as the structure of the water cooling plate 2. In other words, as illustrated in FIG. 40, the rectangular area 6b inclined at the same angle as the cooling portion flow path 6 on either side of the cooling portion flow path 6 and a portion of the cooling portion flow path 6 are, for example, cut from one surface of the substrate 16. On the other hand, the common flow paths 8, 9, 10, and 11 are cut from the other surface of the substrate 16. Then, holes that become the flow paths 8b and 10b for connecting both cut portions are formed by drilling or the like. Lastly, the metal plates 17 are joined to both surfaces of the substrate 16. Also in FIG. 40, the cooling portion flow path 6 is formed on the substrate 16 side, but the cooling portion flow path 6 may be formed as a recess on the metal plate 17 side.

[Pipe Mounting Structure]

Now, a structure for mounting the pipe necessary for making the cooling water flow into the water cooling plate 2 of the LD module cooling device 1 according to each embodiment and draining the cooling water from the water cooling plate 2 is described.

Figure 41:
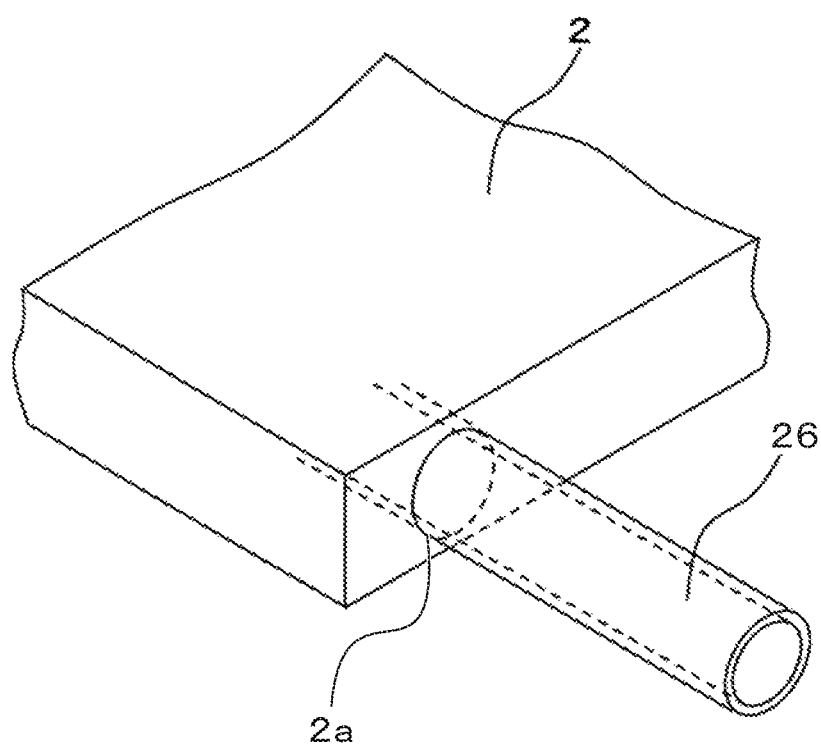
FIG. 41 is a diagram for illustrating an example of a structure for mounting a pipe to the water cooling plate (cooling plate) of the LD module cooling device according to the present invention.

As illustrated in FIG. 41, the pipe mounting structure in a case in which the water cooling plate 2 is sufficiently thick may be a structure in which a hole 2a that communicates with the common flow paths is formed on a side surface of the water cooling plate 2 and a pipe 26 is inserted and welded to the hole 2a. However, in terms of reducing weight and lowering costs of the water cooling plate 2, the water cooling plate 2 is usually required to be as thin as possible while still performing the necessary functions. Therefore, the pipe mounting structure illustrated in FIG. 41 may not be able to be used in some cases.

Figure 42:
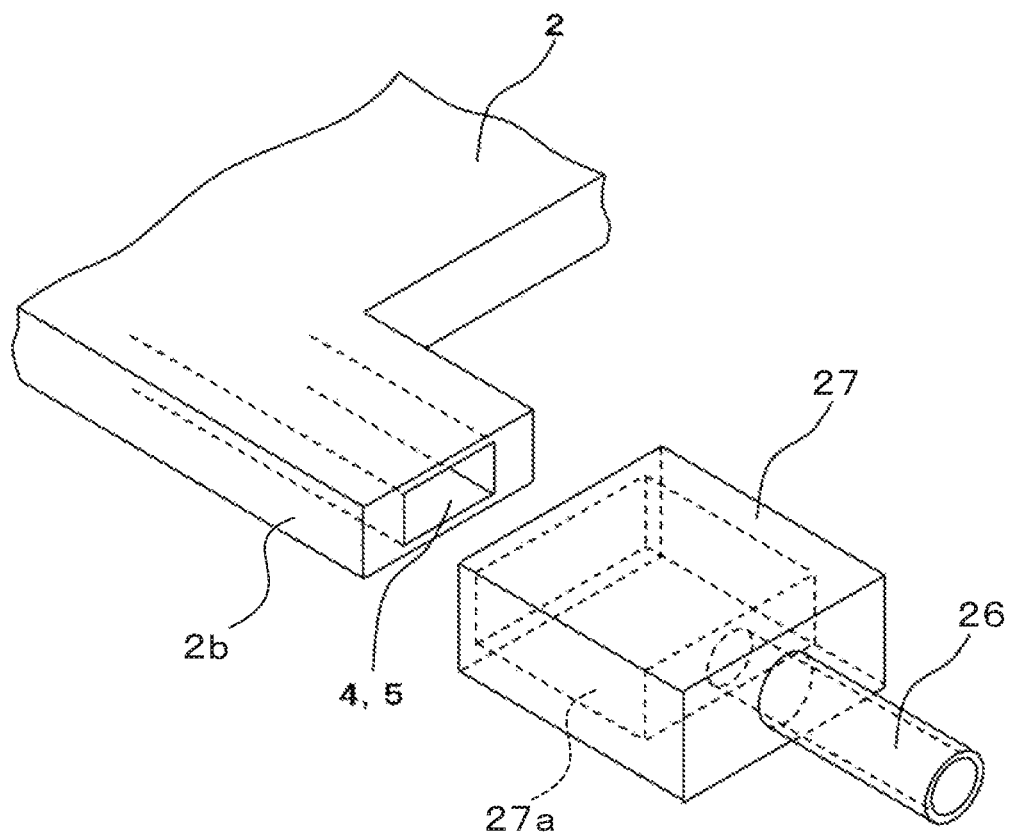
FIG. 42 is a diagram for illustrating another example of the structure for mounting a pipe to the water cooling plate (cooling plate) of the LD module cooling device according to the present invention.

FIG. 42 illustrates an example of a preferable pipe mounting structure in such a case. The water cooling plate 2 illustrated in FIG. 42 includes a protruding portion 2b that protrudes to the side. The end portions of the common supply flow path 4 and the common drainage flow path 5 formed in the water cooling plate 2 are open in this protruding portion 2b. The pipe mounting structures of the common supply flow path 4 and the common drainage flow path 5 are the same. Therefore, in FIG. 42, the reference symbols of the common supply flow path 4 and the common drainage flow path 5 are both used for brevity of description.

A pipe connecting component 27 is provided separately to the water cooling plate 2. The pipe 26 used for supplying or draining the cooling water is connected to this pipe connecting component 27. The pipe connecting component 27 includes a recess 27a that can house the protruding portion 2b of the water cooling plate 2. The pipe 26 communicates with the inside of this recess 27a. After the protruding portion 2b of the water cooling plate 2 has been inserted into the recess 27a of the pipe connecting component 27 to which the pipe 26 is connected, the protruding portion 2b and the pipe connecting component 27 are fixed to each other by welding or another method. As a result, the pipe 26 used for supplying/draining the cooling water to/from the water cooling plate 2 can be easily mounted.

Figure 43:
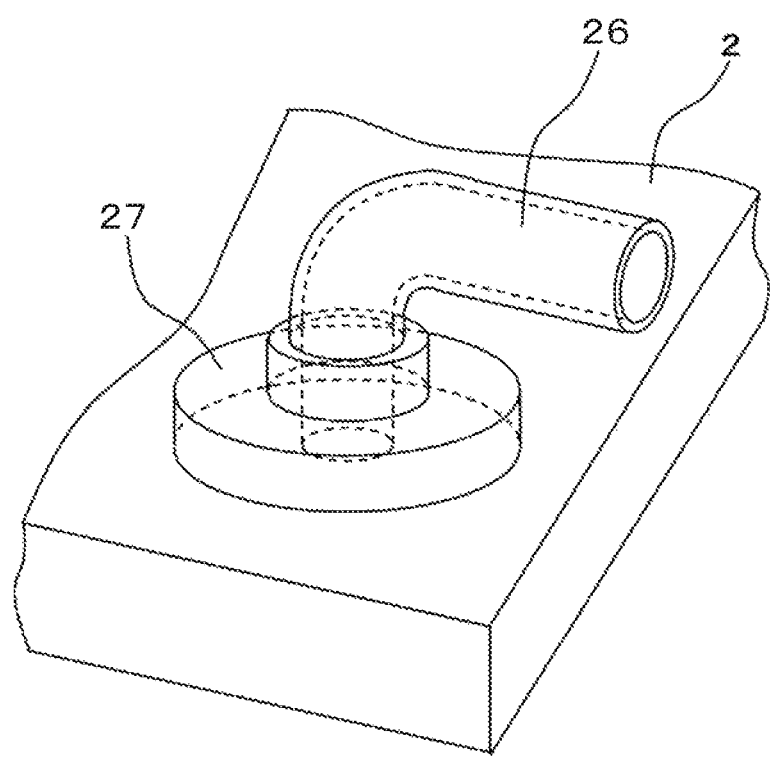
FIG. 43 is a diagram for illustrating yet another example of the structure for mounting a pipe to the water cooling plate (cooling plate) of the LD module cooling device according to the present invention.

FIG. 43 illustrates another example of the pipe mounting structure. In FIG. 43, end portions of the common flow paths of the water cooling plate 2, are open on either or both of the front surface and the rear surface of the water cooling plate 2. In this case, the pipe connecting component 27 to which the pipe 26 is connected is fixed by welding or the like to the front surface and/or the rear surface of the water cooling plate 2 in which the end portion of the common flow path is open. This pipe mounting structure can be applied to a case in which there is sufficient space in a direction perpendicular to the front and/or rear surface of the water cooling plate 2.

Embodiment of Laser Apparatus

Figure 44:
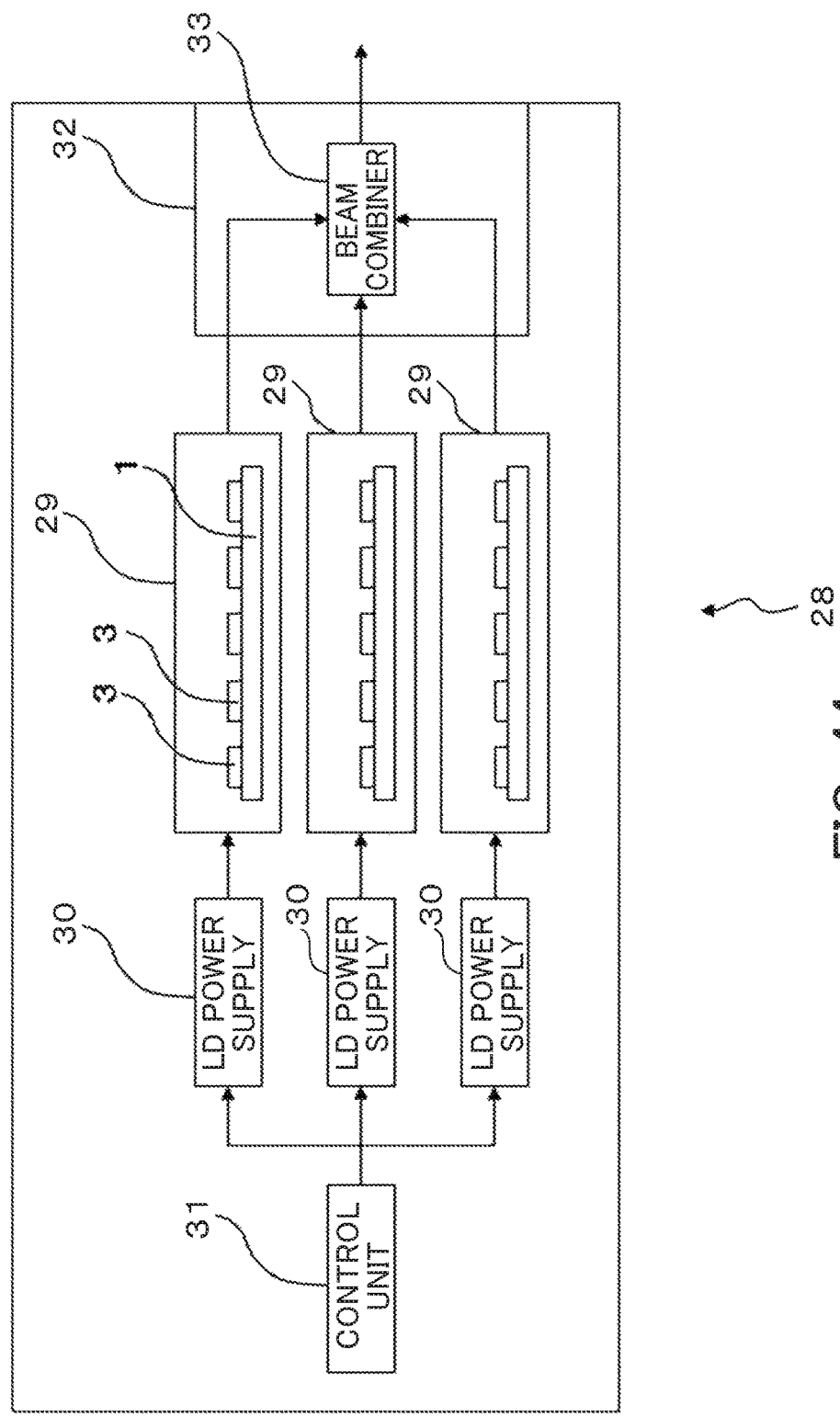
FIG. 44 is a block diagram for illustrating a conceptual configuration of a laser apparatus according to the present invention.

FIG. 44 is a block diagram for illustrating a conceptual configuration of a laser apparatus according to the present invention. As illustrated in FIG. 44, a laser apparatus 28 includes at least one LD module assembly unit 29. The LD module cooling device 1 according to the above-described first to eleventh embodiments of the present invention, and a plurality of the LD modules 3 used as laser light sources or excitation light sources are mounted to the LD module assembly unit 29. In addition, the laser apparatus 28 includes at least one LD power supply unit 30, a control unit 31, and a laser optical system 32. The LD power supply unit 30 supplies driving power to the LD module 3. The control unit 31 controls at least the LD power supply unit 30 to output an optical output instruction to the LD power supply unit 30. The laser apparatus 28 emits a laser beam from the laser optical system 32. The laser apparatus 28 includes three LD power supply units 30 that correspond one-to-one with three LD module assembly units 29, and one control unit 31 is configured to output an optical output instruction to these three LD power supply units 30. The laser optical system 32 includes a beam combiner 33. The beam combiner 33 combines and outputs laser beams output from each LD module assembly unit 29.

The LD module assembly unit 29 includes the LD module cooling device 1 according to any of the above-described embodiments. Therefore, there is little difference in cooling characteristics between the LD modules 3 in the LD module assembly unit 29, and the temperatures of the LD modules 3 and LDs while the LD modules 3 drive are substantially equal. Therefore, when the control unit 31 performs control such that the control unit 31 outputs the optical output instruction so that the LD module 3 to be driven is not biased toward a specific LD module 3, the phenomenon that the lifetime of some of the LD modules 3 quickly comes to an end can be suppressed. With this configuration, the LD module assembly unit 29 that includes the plurality of LD modules 3 and the LD module cooling device 1, which is a main structural unit, has a longer lifetime. As a result, maintenance costs such as replacement of the LD module assembly unit 29 are low and a long-lifetime and reliable laser apparatus 28 can be implemented.

An optical system in which laser beams from each LD module 3 are combined and output from the LD module assembly unit 29, or an optical system in which, when the LD module 3 is used as an excitation light source, a laser beam from a laser medium is output from the LD module assembly unit 29 are not shown in FIG. 44 for the sake of brevity.

There are 3 LD module assembly units 29 illustrated in FIG. 44, but 4 or more, or 1 or 2 LD module assembly units 29 may be provided. When there is one LD module assembly unit 29, the illustrated beam combiner 33 is not needed.

The LD module cooling device 1 according to the present invention described above has as its main purpose cooling the LD module 3, but the LD module cooling device 1 may simultaneously cool a heat generating member other than the LD module 3. Therefore, a heat generating member other than the LD module 3, such as an LD power supply component, may be arranged on at least either the front surface or the rear surface of the water cooling plate 2. In this case, a cooling portion flow path which separate to the cooling portion flow path 6 that cools the LD module 3 but has the same flow path structure as the cooling portion flow path 6 may be formed in the water cooling plate 2 in order to cool this heat generating member. Cooling water flows in parallel in this separate cooling portion flow path in the same manner as in the cooling portion flow path 6 used for cooling the LD module 3. As a result, the LD modules 3 can be cooled without hardly being affected by the heat generation of other heat generation components.

In each of the above-described embodiments, the cooling water is used as the cooling medium, but a fluid other than water (for example, coolant or a gas) can also be used as the cooling medium in the LD module cooling device according to the present invention.

EXPLANATION OF REFERENCE NUMERALS

1 LD module cooling device
2 water cooling plate (cooling plate)
3 LD module
4 common supply flow path
5 common drainage flow path
6 cooling portion flow path
8 branched common supply flow path
9 main common supply flow path
10 branched common drainage flow path
11 main common drainage flow path
12 thermal insulation portion
13 ridge
14 LD chip
15 package
16 substrate
17 metal plate
18 groove (formed in cooling plate)
19 groove (formed in bottom surface of package)
22 frame member
28 laser apparatus
29 LD module assembly unit
30 LD power supply unit
31 control unit
32 laser optical system
S gap

What is claimed is:

1. An LD module cooling device, comprising:
a cooling plate;
a plurality of cooling portion flow paths formed in the cooling plate, through which a cooling medium for cooling a plurality of LD modules arranged on a front surface of the cooling plate flows, corresponding to positions of the plurality of LD modules;
a common supply flow path formed in the cooling plate, that supplies the cooling medium in parallel to the plurality of cooling portion flow paths; and
a common drainage flow path formed in the cooling plate, that drains the cooling medium in parallel from the plurality of cooling portion flow paths,
wherein:
the cooling portion flow path has a flow path height and a flow path width that are constant in at least a majority of the flow path length, and is formed as a thin layer flow path parallel to a front surface of the cooling plate,
a rectangular shape of the cooling portion flow path defined by the dimensions flow path length×flow path width overlaps with at least a majority of a main contact surface between the cooling plate and the plurality of LD modules as viewed from the front surface of the cooling plate,
the flow path height of the cooling portion flow path satisfies at least either one of a condition that flow path height is 1/20 or less of the flow path length and the flow path width, and a condition that the flow path height is 0.5 mm or less, and
pressure loss of the cooling medium that flows through the cooling portion flow path caused by pipe friction is greater than pressure loss of the cooling medium that flows through the common supply flow path and the common drainage flow path caused by pipe friction.

2. The LD module cooling device according to claim 1, wherein:
a plurality of rows of a plurality of the cooling portion flow paths are arranged in parallel on the front surface of the cooling plate,
the common supply flow path includes a branched common supply flow path that extends along the plurality of rows of the plurality of cooling portion flow paths and supplies the cooling medium in parallel to the plurality of cooling portion flow paths in the plurality of rows,
the common drainage flow path includes a branched common drainage flow path that extends along the plurality of rows of the plurality of cooling portion flow paths and drains the cooling medium that is discharged in parallel from the plurality of cooling portion flow paths in the plurality of rows, and
a thermal insulation portion that has lower thermal conductivity than the cooling plate is arranged between at least one group of the adjacent branched common supply flow paths and the branched common drainage flow paths.

3. The LD module cooling device according to claim 1, wherein at least one ridge that divides the cooling portion flow path in a flow path width direction is provided in at least one portion in the cooling portion flow path.

4. The LD module cooling device according to claim 1, wherein the LD module includes a plurality of LD chips arranged in one row, and
wherein, in the plurality of LD modules arranged on the front surface of the cooling plate, the direction of flow of the cooling medium flowing through the cooling portion flow path and the direction of the row of the LD chips intersect each other as viewed from the front surface of the cooling plate.

5. The LD module cooling device according to claim 1, wherein the flow path width of the cooling portion flow path is greater than the flow path length of the cooling portion flow path.

6. The LD module cooling device according to claim 1, wherein at least one LD module is arranged on a rear surface of the cooling plate, and
wherein the cooling plate has a cooling portion flow path used for cooling the at least one LD module arranged on the rear surface of the cooling plate.

7. The LD module cooling device according to claim 1, wherein the cooling plate is formed of a substrate on at least one surface of which a recess forming the common supply flow path and the common drainage flow path is formed and at least one metal plate, and
wherein the common supply flow path and the common drainage flow path are formed between the recess and the metal plate through joining the metal plate to at least one surface of the substrate.

8. The LD module cooling device according to claim 7, wherein the material of the metal plate is copper or a copper alloy.

9. The LD module cooling device according to claim 7, wherein the substrate and the metal plate are made from different materials.

10. The LD module cooling device according to claim 7, wherein the cooling portion flow path is formed of grooves formed on a front surface of the metal plate on the substrate side.

11. The LD, module cooling device according to claim 1, wherein the cooling portion flow path is formed between the cooling plate and a package of the LD modules through cooperation between the cooling plate and the package of the LD modules.

12. The LD module cooling device according to claim 11, wherein the package of the LD modules includes grooves that constitute at least a part of the cooling portion flow path on a surface that makes contact with the cooling medium.

13. The LD module cooling device according to claim 11, wherein the material of the cooling plate is a material other than a metal.

14. The LD module cooling device according to claim 1, further comprising:

a frame member used for pushing the plurality of LD modules against the cooling plate, wherein the frame member has a structure in which the frame member covers at least a part of either the front surface or the rear surface of the cooling plate by including a gap between the frame member and the cooling plate.

15. A laser apparatus, comprising:

at least one LD module assembly unit formed by mounting a plurality of LD modules used as a laser light source or an excitation light source on the LD module cooling device of claim 1;

at least one LD power supply unit that supplies driving power for optical output to the LD module;

a control unit that outputs an optical output instruction to the LD power supply unit; and a laser optical system that emits a laser beam.

* * * * *